United States Patent
Nakamura

(10) Patent No.: US 8,779,279 B2
(45) Date of Patent: Jul. 15, 2014

(54) INTEGRATED WIRING MEMBER FOR SOLAR CELL MODULE, SOLAR CELL MODULE USING THE SAME, AND MANUFACTURING METHODS THEREOF

(75) Inventor: Moritaka Nakamura, Memphis, TN (US)

(73) Assignee: Sharp Kabushiki Kaisha, Osaka (JP)

( * ) Notice: Subject to any disclaimer, the term of this patent is extended or adjusted under 35 U.S.C. 154(b) by 1992 days.

(21) Appl. No.: 11/587,955

(22) PCT Filed: Apr. 22, 2005

(86) PCT No.: PCT/JP2005/007674
§ 371 (c)(1),
(2), (4) Date: Oct. 30, 2006

(87) PCT Pub. No.: WO2005/106970
PCT Pub. Date: Nov. 10, 2005

(65) Prior Publication Data
US 2008/0053511 A1      Mar. 6, 2008

(30) Foreign Application Priority Data

Apr. 28, 2004  (JP) ................................ 2004-133472
Nov. 29, 2004  (JP) ................................ 2004-344537

(51) Int. Cl.
*H02N 6/00*       (2006.01)
*H01L 31/00*      (2006.01)
*H01L 31/042*     (2014.01)

(52) U.S. Cl.
USPC ........................... 136/256; 136/244; 136/252

(58) Field of Classification Search
USPC ......................................... 136/244, 252, 256
See application file for complete search history.

(56) References Cited

U.S. PATENT DOCUMENTS

| | | | |
|---|---|---|---|
| 4,759,725 A * | 7/1988 | Finch | 439/439 |
| 6,380,478 B1 * | 4/2002 | Yamamoto et al. | 136/244 |
| 2003/0006730 A1 | 1/2003 | Tachibana | |

FOREIGN PATENT DOCUMENTS

| | | |
|---|---|---|
| JP | 9-260707 A | 10/1997 |
| JP | 2002-246628 | 8/2002 |
| JP | 2002-324596 | 11/2002 |
| JP | 2003-86820 | 3/2003 |
| JP | 2005-005308 | 1/2005 |

OTHER PUBLICATIONS

Hallahan, Ed. Polyphenylene sulfide (PPS) in review. 2004. IAPD magazine.*
International Search Report for PCT/JP2005/007674 mailed Aug. 23, 2005.

* cited by examiner

*Primary Examiner* — Jonathan Johnson
*Assistant Examiner* — Lindsey Bernier
(74) *Attorney, Agent, or Firm* — Nixon & Vanderhye, P.C.

(57) ABSTRACT

The present invention provides an integrated wiring member (46, 47, 48) for a solar cell module, including a first wiring member, a second wiring member, and an insulating and protecting film for insulating the first wiring member and the second wiring member from each other. Herein, the first wiring member and the second wiring member are integrated with each other through the insulating and protecting film.

23 Claims, 57 Drawing Sheets

D-D

D—D

C—C

D—D

C—C

D—D

C—C

D—D

INTEGRATED WIRING MEMBER FOR SOLAR CELL MODULE, SOLAR CELL MODULE USING THE SAME, AND MANUFACTURING METHODS THEREOF

This application is the US national phase of international application PCT/JP2005/007674 filed 22 Apr. 2005, which designated the U.S. and claimed priority of JP 2004-133472 filed 28 Apr. 2004 and JP 2004-344537 filed 29 Nov. 2004, the entire contents of each of which are hereby incorporated by reference.

TECHNICAL FIELD

The present invention relates to an integrated wiring member for a solar cell module, a solar cell module using the same, and manufacturing methods thereof.

BACKGROUND ART

A typical solar cell module has the following structure. That is, a plurality of solar cells are arranged in line and are electrically connected to each other to thereby form a cell unit. Then, a plurality of cell units formed as described above are arranged side by side, and the adjoining solar cells located at respective both ends of the cell units are electrically connected to each other through solder-plated wiring members; thus, the solar cells arranged in a form of a matrix are entirely connected to each other in series. Herein, the solar cells and the wiring members are insulated from and protected from the outside by filling resin (EVA (Ethylene Vinyl Acetate) resin), an end-face sealing member (silicone resin) and the like. In this case, the EVA resin has a thermoplastic property and is in a liquid state. Therefore, when the EVA resin is filled into a mold for a solar cell module and, then, is solidified and molded by application of heat at about 150° C., there arises the following problem. That is, air bubbles are generated in the EVA resin and the EVA resin is partly separated from a wiring member and the like, resulting in insulation failure.

Conventionally, a solar cell module is mainly used in an industrial facility. On the other hand, in recent years, a solar cell module tends to be used in a common residence. Therefore, an aesthetic sense of a solar cell module for use in a common residence becomes important. Herein, there arises a problem that a solder-plated wiring material having a silver-color surface is externally conspicuous on a solar cell module formed by a solar cell which is entirely dark in color.

In order to solve these problems, Japanese Patent Laying-Open No. 2003-86820 proposes a structure that a wiring member is partly coated with an insulative coating member in order to achieve a solar cell module with improved insulation performance and improved aesthetic sense.

Hereinafter, brief description will be given of a structure of a solar cell module disclosed in Japanese Patent Laying-Open No. 2003-86820. A solar cell module 1 illustrated in FIG. 58 has the following structure. That is, as illustrated in FIG. 56, a plurality of solar cells 11 (nine in this example) are arranged in line and are electrically connected to each other through wiring members 12 to thereby form a cell unit 13. Then, a plurality of cell units 13 (six in this example) formed as described above are arranged side by side, and the adjoining solar cells (e.g., 11a1 and 11a2, 11b1 and 11b2, 11c1 and 11c2, 11d1 and 11d2, 11e1 and 11e2) located at respective both ends of the cell units are electrically connected to each other through wiring members 41, 42, 43, 44 and 45; thus, a group of solar cells arranged in a form of a matrix (hereinafter, simply referred to as "matrix") 15 are entirely connected to each other in series.

Then, as illustrated in FIG. 58, sheet-shaped filling resin (such as EVA) 16 and a back cover (back film) 17 are laminated on a bottom face of matrix 15 in which electrical connection is achieved. Further, sheet-shaped filling resin (such as EVA) 18 and a front cover (glass) 19 are laminated on a top face (light receiving face) of matrix 15. A frame member 20 (not illustrated) made of aluminum surrounds outer peripheral edges of these components. Back cover 17, front cover 19, filling resin 16 and 18, and frame member 20 ensure strength performance, moisture-resistant performance and insulation performance.

In FIG. 57, (a) is a sectional view taken along a line A-A in (b) of FIG. 56, and partly illustrates cell unit 13 when being seen sideway. Each connecting member 12 includes a bent stage portion 12a, corresponding to a thickness of solar cell 11, formed at an almost center thereof. Through bent stage portion 12a, one connecting piece 12b is connected with a top face (negative electrode) 11a of solar cell 11 and the other connecting piece 12c is connected with a bottom face (positive electrode) 11b of adjoining solar cell 11. As illustrated in (b) of FIG. 57, connecting member 12 is a rectangular-shaped flat copper wire having a solder-plated surface.

FIGS. 49, 50, 51, 52 and 53 are perspective views respectively illustrating wiring members 41, 42, 43, 44 and 45 each of which is obtained as follows: a rectangular-shaped flat copper wire having a solder-plated surface is partly coated with an insulative coating member. Herein, the adjoining solar cells (e.g., 11a1 and 11a2, 11b1 and 11b2, 11c1 and 11c2, 11d1 and 11d2, 11e1 and 11e2) are connectable to each other. More specifically, the wiring member is formed into an almost "L" shape or an almost "F" shape in accordance with a part where the adjoining solar cells are connected to each other. In accordance with a shape of the connection part, a shape of the wiring member is determined. In the example disclosed in Japanese Patent Laying-Open No. 2003-86820, there are required seven wiring members of five types in accordance with an arrangement method of solar cells 11, orientation of an electrode, a position of an electrical output extracting port, and the like.

As illustrated in FIG. 49, for example, wiring member 41 includes a coupling piece 41a having a width of 6 mm and a thickness of 0.23 mm, and two protruding pieces 41b and 41b each having a width of 1.5 mm and a thickness of 0.15 mm. Protruding piece 41b connects coupling piece 41a to an electrode on a bottom face of each of solar cells 11a2, 11c2 and 11e2 (see FIG. 44). Wiring member 41 is formed into an almost "F" shape as a whole by connection by soldering between coupling piece 41a and protruding pieces 41b and 41b or by punching. Coupling piece 41a is entirely coated with an insulative coating member 411 (diagonally shaded). However, in coupling piece 41a, an end 41a1 located opposite to protruding pieces 41b and 41b and a portion 41a2 close to a center relative to end 41a1 are spaced away from each other by a predetermined distance, and coating member 411 is removed therefrom. Bare portions 41a1 and 41a2 are connected by soldering to the other connecting pieces 12c and 12c of connecting members 12 attached to each of solar cells 11a1, 11c1 and 11e1 (see FIG. 44). As is clear from FIGS. 50 to 53, each of other wiring members 41, 42, 43, 44 and 45 is also formed into a predetermined shape by a combination of a coupling piece and protruding pieces, and predetermined portions are coated with a coating member.

FIG. 54 illustrates examples of sectional structures of coated portions of wiring members 41, 42, 43, 44 and 45. In the drawing, dimensions of the respective components are described as one example. More specifically, a solder-plated copper wire having a width of 6 mm and a thickness of 0.23 mm, a solder-plated copper wire having a width of 1.5 mm and a thickness of 0.15 mm, and the like are formed by soldering into an almost "F" shape, an almost "E" shape, an almost "L" shape or the like; thus, integrated copper-wire formed bodies $41a$ to $45a$ are formed. Then, copper-wire formed bodies $41a$ to $45a$ are coated with films 411 to 451 such as a PET film, respectively. Films 411 to 451 are excellent in insulating performance and have various colors. This coating operation uses an adhesive, a double-faced tape or the like.

As the coating method, as illustrated in FIG. 54, generally, one of insulating films 411 to 451 is folded in two and the copper-wire formed body is sandwiched therebetween. According to this method, a deviation of a copper-wire formed body is suppressed upon adhesion, and insulation performance is ensured. Herein, the copper-wire formed body is covered with EVA resin upon manufacturing of a solar cell module in a subsequent step. Therefore, completed wiring members 41, 42, 43, 44 and 45 must be previously subjected to vacuum lamination or deaeration in order to prevent generation of air bubbles in the EVA resin. In addition, an adhesive or a double-faced tape which does not exert an adverse influence on the EVA resin must be selected herein. Further, since wiring members 41, 42, 43, 44 and 45 are mainly connected by soldering, it is preferable that coating members 411 to 451 are excellent in heat-resistant property.

As illustrated in FIG. 55, each of a tip end of coating member 441 for coating protruding piece $44c$ of wiring member 44 in FIG. 52 and a tip end of coating member 451 for coating protruding piece $45c$ of wiring member 45 in FIG. 53 has a tapered face P cut obliquely. Tapered face P exhibits the following advantage. That is, when bare portion $44c1$ of wiring member 44 and bare portion $45c1$ of wiring member 45 are derived from electrical output extracting ports $25a$ and $25b$ formed in back cover 17 made of a conductive film to the outside, the tip ends (tapered faces P) of coating members 441 and 451 can smoothly pass through electrical output extracting ports $25a$ and $25b$ without catch in peripheral portions of electrical output extracting ports $25a$ and $25b$.

Next, description will be given of a wiring step using wiring members 41, 42, 43, 44 and 45 each configured as described above, with reference to FIGS. 44 to 48. First, as illustrated in FIG. 45, three first wiring members 41, 41 and 41 are arranged along the adjoining solar cells (e.g., $11a1$ and $11a2$, $11c1$ and $11c2$, $11e1$ and $11e2$) located at a side edge of matrix 15. In this state, bare portions $41a1$ and $41a2$ of uppermost wiring member 41 are connected by soldering to the other connecting pieces $12c$ and $12c$ of connecting members 12 attached to solar cell $11a1$ with the use of a soldering iron or the like. Then, protruding pieces $41b$ and $41b$ of wiring member 41 are connected by soldering to an electrode on a bottom face of solar cell $11a2$ with the use of a soldering iron or the like.

Similarly, bare portions $41a1$ and $41a2$ of middle wiring member 41 are connected by soldering to the other connecting pieces $12c$ and $12c$ of connecting members 12 attached to solar cell $11c1$ with the use of a soldering iron or the like. Then, protruding pieces $41b$ and $41b$ of wiring member 41 are connected by soldering to an electrode on a bottom face of solar cell $11c2$ with the use of a soldering iron or the like.

Similarly, bare portions $41a1$ and $41a2$ of lowermost wiring member 41 are connected by soldering to the other connecting pieces $12c$ and $12c$ of connecting members 12 attached to solar cell $11e1$ with the use of a soldering iron or the like. Then, protruding pieces $41b$ and $41b$ of wiring member 41 are connected by soldering to an electrode on a bottom face of solar cell $11e2$ with the use of a soldering iron or the like. In FIG. 45, circular marks indicate soldered connection portions.

Next, wiring member 42 is arranged along the adjoining solar cells ($11b1$ and $11b2$) located at an upper center of an edge of matrix 15 (see FIG. 45). In this state, bare portions $42a1$ and $42a2$ of wiring member 42 are connected by soldering to the other connecting pieces $12c$ and $12c$ of connecting members 12 attached to solar cell $11b1$ with the use of a soldering iron or the like. Then, protruding pieces $42b$ and $42b$ of wiring member 42 are connected by soldering to an electrode on a bottom face of solar cell $11b2$ with the use of a soldering iron or the like.

Next, wiring member 43 is arranged along the adjoining solar cells ($11d1$ and $11d2$) located at a lower center of the edge of matrix 15 (see FIG. 45). In this state, bare portions $43a1$ and $43a2$ of wiring member 43 are connected by soldering to the other connecting pieces $12c$ and $12c$ of connecting members 12 attached to solar cell $11d1$ with the use of a soldering iron or the like. Then, protruding pieces $43b$ and $43b$ of wiring member 43 are connected by soldering to an electrode on a bottom face of solar cell $11d2$ with the use of a soldering iron or the like.

Thereafter, a bypass diode (not illustrated) is connected between a tip end $42c1$ of protruding piece $42c$ of wiring member 42 and a tip end $43c1$ of protruding piece $43c$ of wiring member 43.

Next, wiring member 44 is arranged so as to extend from the center of the side edge to an upper end in matrix 15 (see FIG. 46). In this state, protruding pieces $44b$ and $44b$ of wiring member 44 are connected by soldering to an electrode on a bottom face of solar cell $11f$ with the use of a soldering iron or the like. Then, tip end $44c1$ of protruding piece $44c$ of wiring member 44 is derived from electrical output extracting port $25a$ to the outside.

Next, wiring member 45 is arranged so as to extend from the center of the side edge to a lower end in matrix 15 (see FIG. 46). In this state, bare portions $45a1$ and $45a2$ of wiring member 45 are connected by soldering to the other connecting pieces $12c$ and $12c$ of connecting members 12 attached to solar cell $11g$ with the use of a soldering iron or the like. Then, a tip end $45c1$ of protruding piece $45c$ of wiring member 45 is derived from electrical output extracting port $25b$ to the outside.

In addition, a bypass diode (not illustrated) is connected between tip end $42c1$ of protruding piece $42c$ of wiring member 42 and tip end $44c1$ of protruding piece $44c$ of wiring member 44.

Moreover, a bypass diode (not illustrated) is connected between tip end $43c1$ of protruding piece $43c$ of wiring member 43 and tip end $45c1$ of protruding piece $45c$ of wiring member 45.

FIGS. 46 and 47 respectively illustrate a state after completion of the aforementioned wiring step. The other connecting pieces $12c$, $12c$, . . . protruding from the side edge of matrix 15 are cut after completion of the wiring step (shown by broken lines in FIG. 46). FIG. 48 is a partly enlarged view illustrating a positional relation between wiring members near electrical output extracting ports $25a$ and $25b$. In FIG. 45, circular marks indicate soldered connection portions. The number of soldered connection portions of wiring members 41, 42, 43, 44 and 45 formed as disclosed in Japanese Patent Laying-Open No. 2003-86820 is 24.

However, in the structure of the typical solar cell module, wiring member 43 (45) for electrically connecting between the adjoining solar cells located at the both ends of the cell units intersects with wiring member 42 (44) for extracting an electrical output; therefore, a step of connecting a wiring member for connecting between adjoining solar cells and a step of connecting a wiring member for extracting an electrical output are implemented independently. Consequently, positional deviations of wiring members 42 and 44 or wiring members 44 and 45 are occurred, so that insulation performance failure due to a variation in outer appearance and a deviation in distance to a module end is occurred.

It is indispensable for a cell unit to perform positional adjustment for respective wiring members. Therefore, a frequency of positional adjustment work must be increased in accordance with the number of wiring members in addition to the connection by soldering between the wiring member and the cell unit. In view of the ensuring of an insulation distance between wiring members 44 and 45 for extracting an electrical output and the end of the cell unit or an insulation distance between wiring members 44 and 45 and an outer periphery of a module, such as a frame member made of aluminum, as the frequency of the positional adjustment work is increased, a margin due to a positional deviation must be secured excessively and an area of a module region which does not contribute to power generation is increased, so that power generation efficiency per unit area as a solar cell module is lowered.

Since wiring members 44 and 45 for extracting an electrical output are connected and fixed only by solar cells 11f and 11g located at the matrix end, the wiring members are flexed when being led out to the center of the solar cell module. Consequently, it is difficult to perform positional adjustment and to control arrangement of wiring members when the EVA resin filled into a mold is thermally solidified, so that a variation in outer appearance is occurred.

In order to decrease the number of wiring members, it is considered that wiring members 42 and 44 or wiring members 43 and 45 are simply integrated with each other. However, a coating member which has a color identical to that of back cover 17 and ensures a heat-resistant property is rare and expensive. Consequently, such a coating member is not practically used. That is, coating member 441, which is insufficient in heat-resistant property when connecting pieces 12c are connected by soldering to bare portions 42a1 and 42a2, is broken due to heat generated in the connection by soldering, resulting in insulation failure.

If connecting pieces 12c are connected by soldering to bare portions 42a1 and 42a2 from the back side of wiring member 44 in a state where wiring member 42 is integrally overlaid on the back side of the wiring member 44, protruding piece 44b must be arranged on the back face of solar cell 11f, connecting pieces 12c must be led out from the top face of solar cell 11b1 and must be arranged in bare portions 42a1 and 42a2, and protruding piece 44b must be arranged on the bottom face of solar cell 11b2. That is, it is necessary that a wiring member obtained by integrating wiring members 42 and 44 with each other is arranged so as to weave the front and back sides of adjoining cell units alternately, resulting in complicated work.

It is considered herein that a current twice in amount is to be obtained by cell units connected in parallel. In order to eliminate loss as much as possible when string arrangements are arranged in serial, in the conventional arrangement where adjoining cell units are arranged upside down (polarities of adjoining cells in a direction almost orthogonal to a connecting direction of cell units are changed alternately, like positive, negative, positive, negative, . . . ), the wiring member must be arranged so as to weave the front and back sides of adjoining cell units alternately, resulting in complicated work.

Accordingly, as in the conventional technique, wiring members 42 and 44 or wiring members 43 and 45 must be arranged in a division manner so as to suppress complication.

Patent Document 1: Japanese Patent Laying-Open No. 2003-86820

DISCLOSURE OF THE INVENTION

Problems to be Solved by the Invention

The present invention is made to solve the aforementioned problems of the conventional technique. An object of the present invention is to provide an integrated wiring member for a solar cell module and a manufacturing method thereof, capable of facilitating a wiring step upon manufacturing a solar cell module, and achieving a solar cell module with improved insulation performance and improved aesthetic sense.

Means for Solving the Problems

The present invention provides an integrated wiring member for a solar cell module, including: a first wiring member; a second wiring member; and an insulating and protecting film for insulating the first wiring member and the second wiring member from each other, wherein the first wiring member and the second wiring member are integrated with each other through the insulating and protecting film.

Preferably, the first wiring member is coated with a first coating member, and the second wiring member is coated with a second coating member.

Preferably, the first wiring member has a portion joined to a connecting member of a solar cell, and the portion is not coated with the first coating member.

Preferably, the second wiring member has a portion joined to a connecting member of a solar cell, and the portion is not covered with the second coating member.

Preferably, the first wiring member has a plurality of portions each joined to the connecting member of the solar cell, and the plurality of portions are spaced away from each other by a predetermined distance.

Preferably, the second wiring member has a plurality of portions each joined to the connecting member of the solar cell, and the plurality of portions are spaced away from each other by a predetermined distance.

Preferably, each of the first wiring member and the second wiring member has an almost "L" shape.

Preferably, the first wiring member is integrated with the second wiring member so as to have an almost "F" shape in such a manner that the first wiring member is displaced from a predetermined position with respect to the second wiring member.

Preferably, the insulating and protecting film is located between portions, which are not coated with the second coating member, of the second wiring member and between the first wiring member and the second wiring member.

Preferably, a portion, joined to the first wiring member, of the second wiring member is not coated with the second coating member and is integrated with the first wiring member through the insulating and protecting film.

Preferably, the insulating and protecting film is interposed between parts, each joined to a connecting member of a solar cell, of the second wiring member.

Preferably, the second wiring member is not coated with the second coating member, in a region of the second wiring member substantially overlapped with the first wiring member, the second wiring member, the insulating and protecting film and the first wiring member are integrally coated with a third coating member, and a region other than the region of the second wiring member is coated with the third coating member.

Preferably, in the second wiring member, the third coating member is not present in portions each joined to a connecting member of a solar cell, and the portions are spaced away from each other by a predetermined distance.

Preferably, the insulating and protecting film is interposed between portions each joined to the connecting member of the solar cell, and is also interposed between the first wiring member and the second wiring member.

Preferably, a region of the first wiring member substantially overlapped with the second wiring member is not coated with the first coating member and a region other than the region of the first wiring member is coated with the first coating member, a region of the second wiring member substantially overlapped with the first wiring member is not coated with the second coating member and a region other than the region of the second wiring member is coated with the second coating member, and in the region where the first wiring member and the second wiring member are substantially overlapped with each other, the first wiring member and the second wiring member are joined to each other through the insulating and protecting film, and the first wiring member, the second wiring member and the insulating and protecting film are integrally coated with the third coating member.

Preferably, in the first wiring member and the second wiring member, portions each joined to a connecting member of a solar cell module have no coating member.

Preferably, each of the first wiring member and the second wiring member has an almost "T" shape.

Preferably, the first wiring member is integrated with the second wiring member so as to have an almost "Π" shape in such a manner that the first wiring member is displaced from a predetermined position with respect to the second wiring member.

Preferably, the insulating and protecting film is a heat-resistant film.

Preferably, the insulating and protecting film has a width equal to or narrower than that of the first coating member.

Preferably, the second wiring member has a width equal to or narrower than that of the insulating and protecting film.

Preferably, the insulating and protecting film has a width equal to that of the first coating member or wider than that of the second wiring member.

Preferably, each of the first coating member, the second coating member and the third coating member has an insulation property.

The present invention also provides a solar cell module having a structure that a plurality of solar cells are arranged in line and are electrically connected to each other to thereby form a cell unit, a plurality of cell units thus formed are arranged side by side, the adjoining solar cells located at respective both ends of the cell units are electrically connected to each other through a wiring member, and the solar cells arranged in a form of a matrix are entirely connected, wherein the aforementioned integrated wiring member is used as the wiring member.

Preferably, the integrated wiring member includes a first wiring member connected to a positive electrode of the solar cell module, and a second wiring member connected to a negative electrode of the solar cell module.

The present invention also provides a manufacturing method of an integrated wiring member for a solar cell module, including the steps of: forming each of a first wiring member and a second wiring member into an almost "L" shape; partly coating the first wiring member with a first coating member; forming an insulating and protecting film on one face of the first wiring member so as to partly coat the first wiring member with the insulating and protecting film; folding back the insulating and protecting film toward the other face; joining a second wiring member to a face, opposite to the folded side of the insulating and protecting film, through the insulating and protecting film; partly coating the second wiring member with a second coating member; and integrally coating the first wiring member and the second wiring member with a third coating member.

The present invention also provides a manufacturing method of a solar cell module, including the steps of: arranging a plurality of solar cells in line and electrically connecting the plurality of solar cells to each other to thereby form a cell unit; arranging a plurality of cell units thus formed side by side, and electrically connecting the adjoining solar cells located at one ends of the cell units through a third integrated wiring member; electrically connecting between the adjoining solar cells through a first integrated wiring member having output terminals with positive electrodes located at the other ends of the cell units, and electrically connecting the output terminals with positive electrodes to the adjoining solar cells; and electrically connecting between the adjoining solar cells through a second integrated wiring member having output terminals with negative electrodes located at the other ends of the cell units, and electrically connecting the output terminals with negative electrodes to the adjoining solar cells.

The present invention also provides a manufacturing method of a solar cell module, including the steps of: arranging a plurality of solar cells in line and electrically connecting the plurality of solar cells to each other to thereby form a cell unit; arranging a plurality of cell units thus formed side by side and electrically connecting wires led out from the adjoining solar cells located at one ends of the cell units to a third integrated wiring member, by soldering; and connecting positive electrode wires led out from solar cells located at the other ends of the cell units and wires led out from the adjoining solar cells to a first integrated wiring member, by soldering, and electrically connecting negative electrode wires led out from the solar cells located at the other ends of the cell units and wires led out from the adjoining solar cells to a second integrated wiring member, by soldering.

The present invention also provides a manufacturing method of an integrated wiring member for a solar cell module, including the steps of: forming each of a first wiring member and a second wiring member into an almost "T" shape; partly coating the first wiring member with a first coating member; forming an insulating and protecting film on one side of the first wiring member so as to partly coat the first wiring member with the insulating and protecting film; folding back the insulating and protecting film toward the other side of the first wiring member; joining a second wiring member to a face, opposite to the folded side of the insulating and protecting film, through the insulating and protecting film; partly coating the second wiring member with a second coating member; and integrally coating the first wiring member and the second wiring member with a third coating member.

The present invention also provides a manufacturing method of a solar cell module, including the steps of: arranging a plurality of solar cells in line and electrically connecting the plurality of solar cells to each other to thereby form a cell unit; arranging a plurality of cell units thus formed side by side, and electrically connecting between the adjoining solar cells located at one ends of the cell units through a third integrated wiring member; and electrically connecting between the adjoining solar cells through a fourth integrated wiring member which is located at the other ends of the cell units and includes output terminals with positive electrodes and output terminals with negative electrodes, and electrically connecting the output terminals with positive electrodes and the output terminals with negative electrodes to external terminals of the solar cells.

The present invention also provides a manufacturing method of a solar cell module, including the steps of: arranging a plurality of solar cells in line and electrically connecting the plurality of solar cells to each other to thereby form a cell unit; arranging a plurality of cell units thus formed side by side, and electrically connecting wires led out from the adjoining solar cells located at one ends of the cell units to a third integrated wiring member, by soldering; and connecting positive electrode wires led out from solar cells located at the other ends of the cell units and wires led out from the adjoining solar cells to a fourth integrated wiring member, by soldering, and electrically connecting negative electrode wires led out from the solar cells located at the other ends of the cell units and wires led out from the adjoining solar cells to the fourth integrated wiring member, by soldering.

Effects of the Invention

According to the present invention, it is possible to realize a solar cell module with reduced external variation and improved aesthetic sense. Further, it is possible to suppress insulation performance failure due to a variation in distance to a module end, and to improve an insulation property of a solar cell module.

In addition, a portion, other than a connection portion, of a wiring member or at least a part of the portion is coated with an insulative coating member, so that improved insulation performance and improved aesthetic sense can be achieved. Moreover, this coating member is allowed to have a color identical to those of peripheral members. As a result, the coating member is assimilated into the surface of the solar cell module; thus, an aesthetic sense can be further improved.

In addition, as an end-face sealing member for the solar cell module, there is used silicone resin, EVA resin, an elastomer or the like which enters a liquid state once upon manufacturing of the solar cell module. Therefore, even when generation of air bubbles or separation occurs, a wiring member is coated with an insulative coating member, so that insulation performance between the wiring member and peripheral members can be ensured sufficiently.

The solar cell module according to the present invention is formed into such a shape that a wiring member connecting between adjoining solar cells is connectable, so that work for connection by soldering in a wiring step in a solar cell module production process can be facilitated and a time for the work can be significantly reduced.

In the manufacturing method of a solar cell module according to the present invention, a wiring member is formed in accordance with a shape of a connection part, the wiring member is arranged in the connection part, and a connection terminal of a solar cell is connected by soldering to a connection portion of the wiring member. More specifically, formed wiring members are integrated with each other, so that work for connection by soldering in a wiring step in a solar cell module production process can be facilitated and a time for the work can be significantly reduced.

Since bare portions are aligned orderly, automated work for connection by soldering can be readily performed as compared with the conventional technique and cost reduction can be achieved. Thus, an inexpensive solar cell module can be provided.

Arrangement of electrodes from a plurality of cell units arranged side by side is, for example, positive, negative, negative, positive, positive, negative, negative, positive; thus, the cell units can be connected in parallel through the integrated wiring member according to the present invention. Accordingly, a solar cell module obtaining a current twice in amount can be provided.

In a case where cells (bus bars) in a solar cell module are connected in parallel so as to obtain a current twice in amount, arrangement of electrodes from a plurality of cell units arranged side by side is, for example, positive, negative, negative, positive, positive, negative, negative, positive, wherein identical polarities adjoin to each other; thus, an integrated wiring member can be connected. That is, in order to provide a solar cell module in which cell units are connected in parallel, there is adopted a mirror arrangement (e.g., positive, negative, negative, positive in a lateral direction) which is different in lateral arrangement of cells from the conventional technique; thus, an integrated wiring member can be connected.

DESCRIPTION OF THE REFERENCE SIGNS

1: solar cell module, 11: solar cell, 11a1, 11a2, 11b1, 11b2, 11c1, 11c2, 11d1, 11d2, 11e1, 11e2, 11f, 11g: solar cell, 12: connecting member, 12a: bent stage portion, 12b: one connecting piece, 12c: the other connecting piece, 13: cell unit, 14: wiring member, 15: matrix, 16, 18: filling member, 17: back cover, 19: front cover, 20: frame member, 21: silicone resin, 25a, 25b: electrical output extracting port, 41, 42, 43, 44, 45: wiring member, 41b, 42b, 42c, 43c, 44b, 44c, 45c, 49c, 49e: protruding piece, 411, 421, 431, 451, 461, 471, 481, 472, 482, 473, 483, 491, 492, 493: coating member, 41a1, 41a2, 42a1, 42a2, 42c1, 43a1, 43a2, 43c1, 44c1, 45a1, 45a2, 45c1, 46a1, 46a2, 46a3, 46a4, 47a1, 47a2, 47a3, 47a4, 48a1, 48a2, 48a3, 48a4, 47c1, 47e1, 48c1, 48e1, 49a1, 49a2, 49a3, 49a4, 49c1, 49d1, 49d2, 49d3, 49d4, 49e1: bare portion, 41a, 42a, 43a, 44a, 45a, 46a, 46c, 47a, 47c, 47d, 47e, 48a, 48c, 48d, 48e, 49d, 49e: coupling piece, 47(I), 48(I), 49(I): first wiring member, 47(II), 48(II), 49(II): second wiring member, 46: third wiring member, 47: first integrated wiring member, 48: second integrated wiring member, 49: fourth integrated wiring member, 50: insulating and protecting film, 60: adhesive tape.

BEST MODES FOR CARRYING OUT THE INVENTION

Embodiment 1

(Solar Cell Module)

Figure 1:
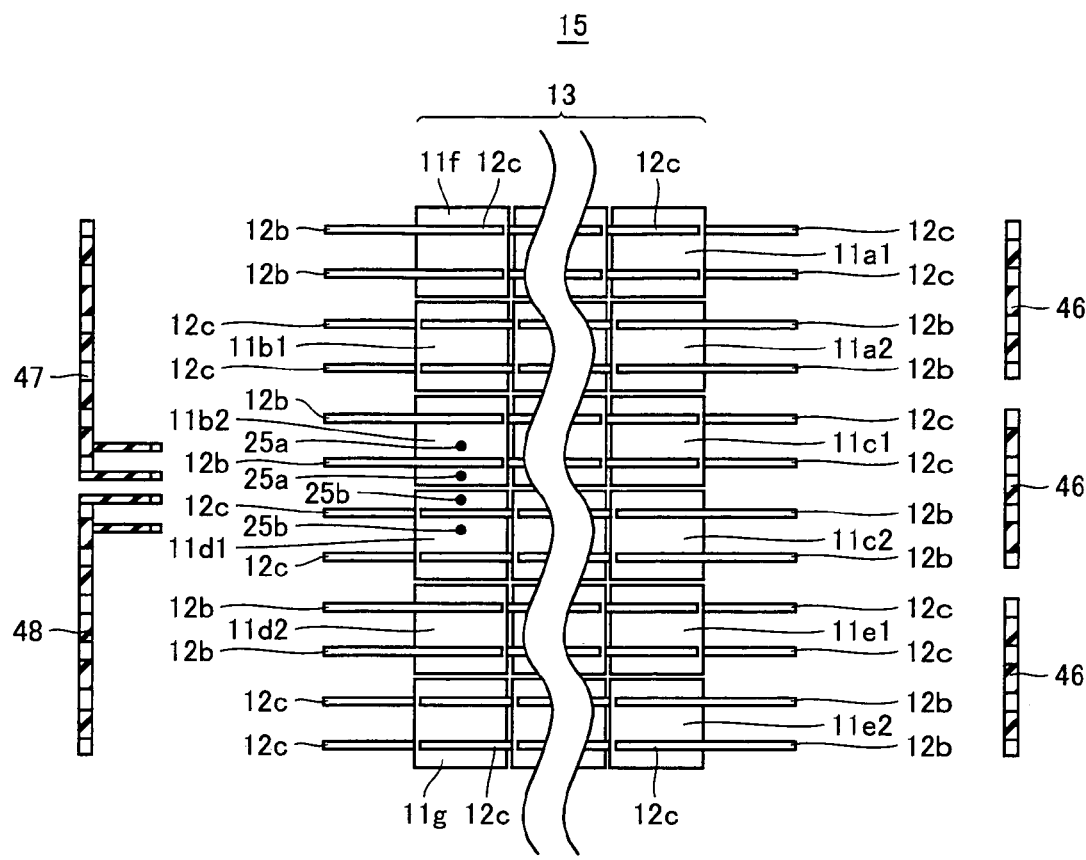
FIG. 1 is a plan view illustrating a structure of a solar cell module according to the present invention.

With reference to FIG. 1, a solar cell module according to the present invention has the following structure. That is, a plurality of solar cells 11 are arranged in line and are electrically connected to each other to thereby form a cell unit 13. Then, a plurality of cell units 13 formed as described above are arranged side by side, and the adjoining solar cells (e.g., 11a1 and 11a2, 11b1 and 11b2, and the like) located at respective both ends of cell units 13 are electrically connected to each other through integrated wiring members 46, 47 and 48; thus, the solar cells arranged in a form of a matrix 15 are entirely connected to each other in series. In the present invention, each of wiring members 46, 47 and 48 for electrically connecting between the solar cells is of an integrated type, unlike a conventional wiring member.

In an integrated wiring member according to the present invention, a portion other than a connection portion, in which solar cells of the wiring member are electrically connected to each other, is at least partly coated with an insulative coating member. Herein, a plurality of wiring members are used. One wiring member intersects with or overlaps with the other wiring member. At the intersection or the overlap portion, one wiring member is coated with the coating member and the other wiring member has at least a connection portion. A coating member having a heat-resistant property higher than that of the aforementioned coating member is inserted between one wiring member and the other wiring member.

As described above, in the solar cell module according to the present invention, use of the integrated wiring member according to the present invention makes it possible to improve insulation performance without breakage of a coating member when solar cells are electrically connected to each other by soldering of the connection portion of the wiring member. Further, a plurality of wiring members can be intersected with each other or overlapped with each other prior to the connection by soldering; therefore, a manufacturing step can be simplified. In addition, an area of a wiring member, exposed by overlapping wiring members, can be reduced, so that an aesthetic sense can be improved.

Herein, if the wiring member is a flat conductive wire, an outer appearance thereof becomes poor due to a wide width. However, if such a wiring member is coated with a coating member, the wiring member becomes inconspicuous. The coating member is allowed to have a color identical to those of peripheral members, so that the coating member is assimilated into the surface of the solar cell module. Thus, an aesthetic sense can be further improved. In contrast, the coating member is allowed to have a color different from those of the peripheral members, so that a factor in terms of a design is added. Thus, an aesthetic sense can be also improved.

Upon manufacturing a solar cell module while using silicone resin or EVA resin as an end-face sealing member for the solar cell module, the aforementioned resin enters a liquid state in course of the manufacturing. Therefore, use of only this resin tends to cause generation of air bubbles, separation and the like. In the present invention, however, at least one of adjacent wiring members is coated with an insulative member; therefore, insulation performance between two wiring members can be ensured sufficiently.

In the solar cell module according to the present invention, a wiring member at least including a wire for extracting an electrical output is formed into an almost "L" shape so as to extract the electrical output from a bottom face near a center of the solar cell module. In addition, a wiring member for electrically connecting between adjoining solar cells is formed into a shape so as to connect between the solar cells. For example, the wiring member is formed into an almost "I" shape in accordance with the connection part. In addition, a wiring member which connects between solar cells and is connected to a bypass diode is formed into a shape so as to connect between the solar cells and to be connected to the bypass diode. For example, the wiring member is formed into an almost "L" shape.

The almost "L"-shaped wiring member connecting between solar cells and the almost "L"-shaped wiring member at least including a wire for extracting an electrical output are partly overlapped with and intersected with each other. Further, it is preferable that the almost "L"-shaped wiring members are integrated with each other to form an almost "F" shape. As described above, a plurality of wiring member at least partly overlapped with or intersected with each other are integrated into one member; thus, work for connection by soldering in a wiring step in a solar cell module production process can be simplified and a time for the work can be reduced significantly.

A manufacturing method of a solar cell module according to the present invention includes a first step of arranging a plurality of solar cells in line and electrically connecting the plurality of solar cells to each other to thereby form a cell unit, and a second step of arranging a plurality of cell units, formed as described above, side by side and electrically connecting the adjoining solar cells, located at respective both ends of the cell units, to each other through integrated wiring members. The first step includes a step of forming a connecting piece electrically connecting both ends of a cell unit through a wiring member. A wiring member for connecting between connecting pieces at both ends of a cell unit and a wiring member for extracting an electrical output are integrated with each other. In the second step, this integrated wiring member is arranged in a connection part, and a connecting piece of a solar cell and a connection portion of the wiring member are connected by soldering to each other. As described above, wiring members are integrated into one member; thus, work for connection by soldering in a wiring step in a solar cell module production process can be simplified and a time for the work can be reduced significantly.

(Matrix)

Figure 2:
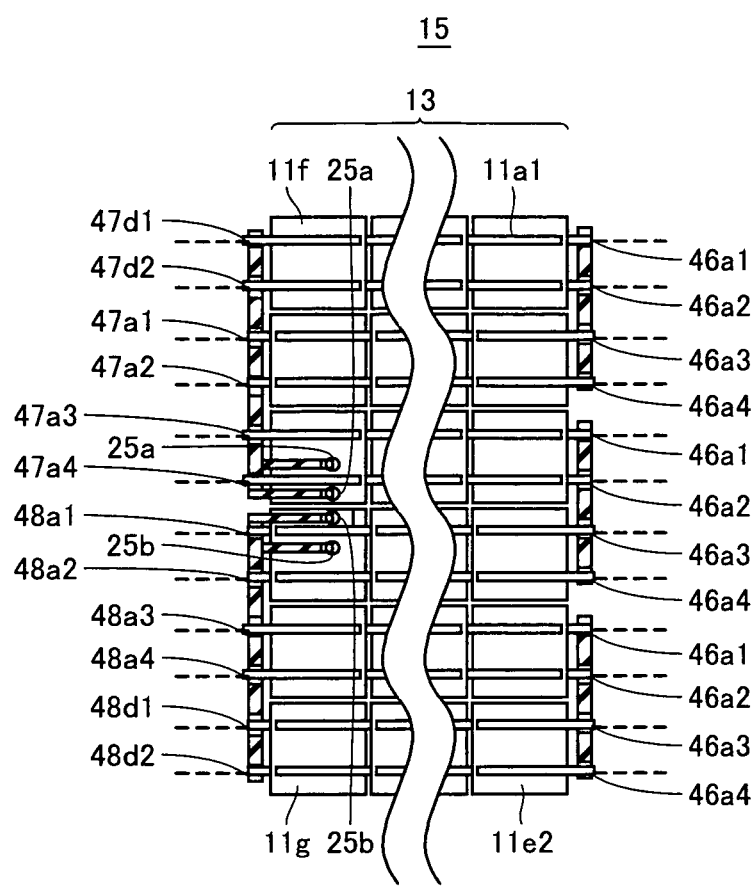
FIG. 2 is a plan view illustrating the structure of the solar cell module according to the present invention.

Next, description will be given of the solar cell module according to the present invention with reference to the drawings. FIGS. 1 and 2 are plan views each illustrating a state where integrated wiring members 46, 47 and 48 are arranged at both ends of matrix 15 forming the solar cell module according to the present invention and both ends of a solar cell unit in matrix 15. Herein, FIG. 1 illustrates a state before connection of the solar cells through integrated wiring members 46, 47 and 48, and FIG. 2 illustrates a state after connection of the solar cells through integrated wiring members 46, 47 and 48. In the present invention, the matrix refers to a state of a group of the solar cells, wherein the plurality of solar cells 111 are arranged in line and are electrically connected to each other to thereby form a cell unit and a plurality of cell units formed as described above are arranged side by side. In the present specification, as for a solar cell module, constituent members and constituent parts equal to those in the description of the conventional art are denoted by identical symbols.

With reference to FIGS. 1 and 2, as in the description of the conventional technique, in matrix 15, the plurality of solar cells 11 are arranged in line and are electrically connected to each other through wiring members 12 to form cell unit 13. In the present invention, connecting pieces 12 are connected to cell units 13 at both ends in a lateral direction, and connecting pieces 12c or 12b are led out. The plurality of cell units 13 (six in the examples illustrated in FIGS. 1 to 3) are arranged side by side, and the adjoining solar cells (11a1 and 11a2, 11b1 and 11b2, 11c1 and 11c2, 11d1 and 11d2, 11e1 and 11e2) located at both ends in a direction orthogonal to the lateral direction (i.e., direction in which the plurality of solar cells are arranged in line) are electrically connected to each other through integrated wiring members 46, 47 and 48; thus, 54 solar cells 11, 11, . . . are electrically connected to each other in series as a whole.

The present invention has a feature in the configurations of integrated wiring members 46, 47 and 48. Each of integrated wiring members 46, 47 and 48 is formed into a shape capable of connecting between the adjoining solar cells (11a1 and 11a2, 11b1 and 11b2, 11c1 and 11c2, 11d1 and 11d2, 11e1 and 11e2). Specifically, the wiring member includes a part formed into an almost "I" shape and a part formed into an almost "F" shape in accordance with connection parts. The wiring member may be formed in accordance with a shape of a connection part. In this embodiment, there are required five integrated wiring members of three types in accordance with an arrangement method of solar cells 11, an orientation of an electrode, a position of an electrical output extracting port, and the like.

In FIG. 2, connection portions between integrated wiring members 46, 47 and 48 and connecting members 12 of the solar cell module are illustrated as bare portions 46a1 to 46a4 as for integrated wiring member 46, bare portions 47a1 to 47a4, 47d1 and 47d2 as for integrated wiring member 47, and bare portions 48a1 to 48a4, 48d1 and 48d2 as for integrated wiring member 48. Herein, integrated wiring members 47 and 48 are connected to electrical output extracting ports 25a and 25b at a center of one end of solar cell module 15. Next, description will be given of this state with reference to FIG. 3.

Figure 3:
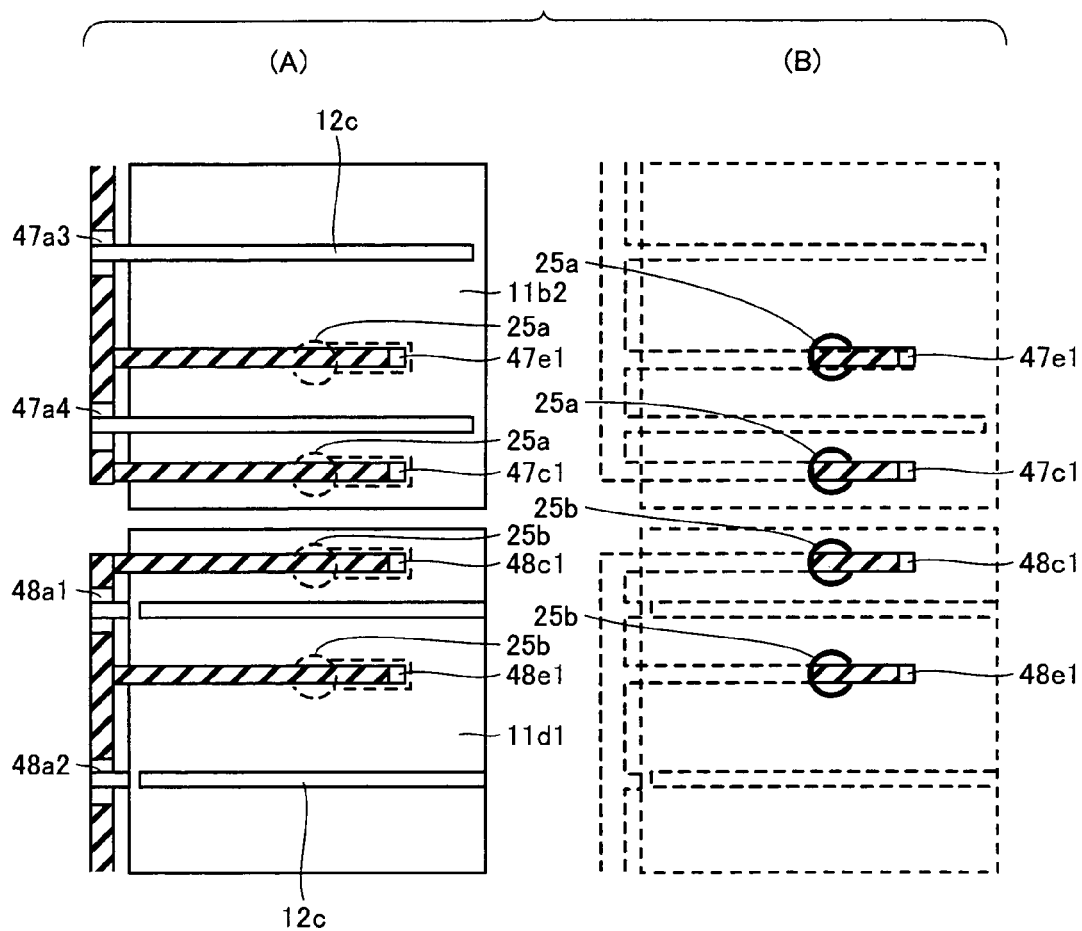
FIG. 3 is an enlarged plan view mainly illustrating a connection state between an integrated wiring member and an electrical output extracting port.
Figure 58:
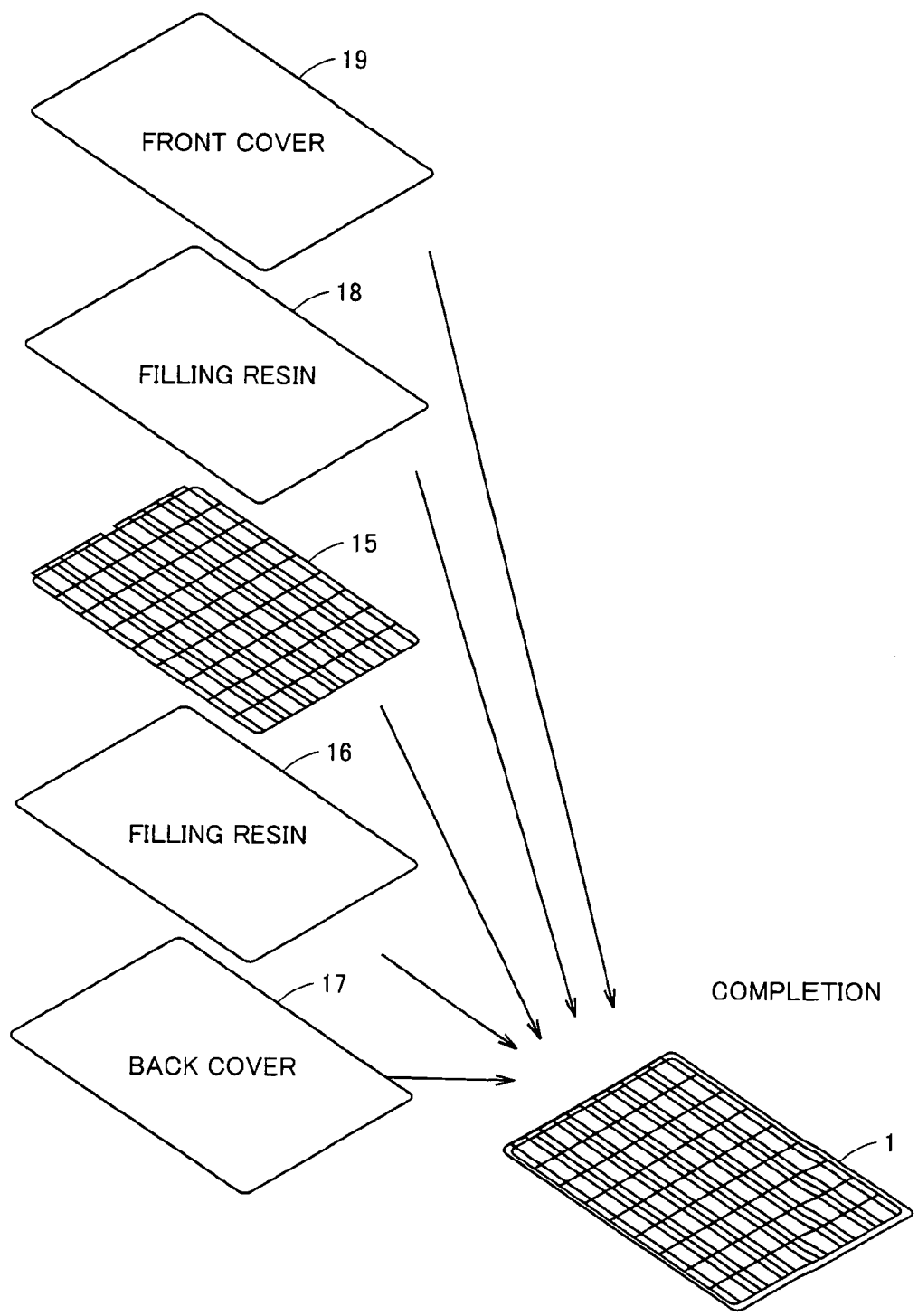
FIG. 58 illustrates a manufacturing step of the conventional solar cell module.

FIG. 3 is an enlarged plan view mainly illustrating a connection state between an integrated wiring member and an electrical output extracting port. In FIG. 3, specifically, (A) is an enlarged view illustrating the solar cell in FIG. 2, when being seen from below, and (B) is also an enlarged view illustrating the solar cell in FIG. 2, when being seen from below. That is, FIG. 3 illustrates a module covered with a back cover as illustrated in FIG. 58. As illustrated in FIG. 3, in integrated wiring members 47 and 48 each having an almost "F" shape, two short axes orthogonal to a long axis are inserted into electrical output extracting ports 25a and 25b. Bare portions 47e1 and 47c1 and bare portions 48e1 and 48c located at tip ends of these short axes are connected to wires (not illustrated) from the solar cell module.

Hereinafter, detailed description will be given of the respective wiring members.

(Integrated Wiring Member)

In the present invention, examples of an integrated wiring member includes first integrated wiring member 47, second integrated wiring member 48 and third integrated wiring member 46 as illustrated in FIG. 1. Description will be given of these integrated wiring members with reference FIGS. 4 to 8.

In the present invention, first integrated wiring member 47 includes a first wiring member 47(I) and a second wiring member 47(II). First wiring member 47(I) includes a coupling piece 47d and a protruding piece 47e. Second wiring member 47(II) includes a coupling piece 47a and a protruding piece 47c. Hereinafter, description will be given of the respective members.

Figure 4:
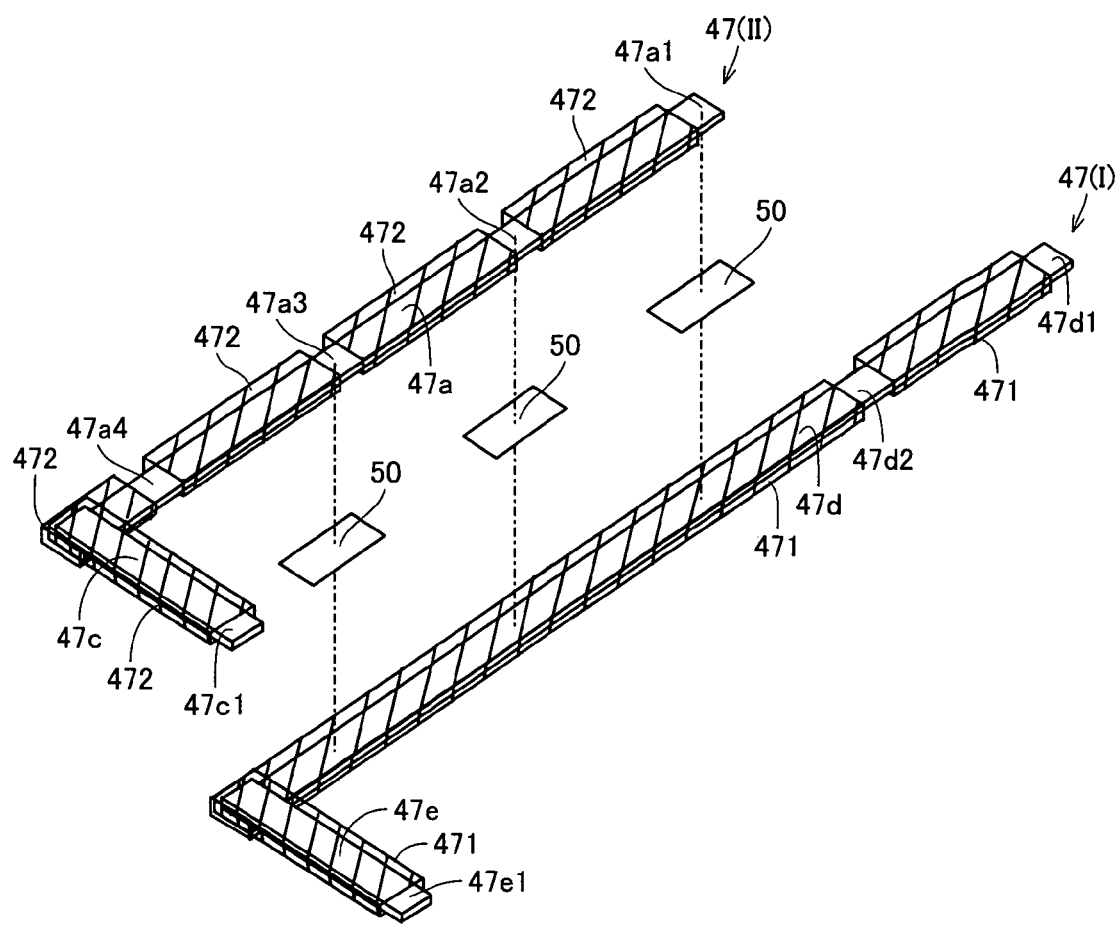
FIG. 4 is a perspective view illustrating one embodiment of a wiring member forming an integrated wiring member according to the present invention.

As illustrated in an upper side of FIG. 4, coupling piece 47a forms second wiring member 47(II), and laterally couples between connecting pieces 12c and 12b led out from the adjoining solar cells (11b1 and 11b2) located at a position above a center of a side edge of the solar cell provided with electrical output extracting ports 25a and 25b in FIG. 1. Also as illustrated in the upper side of FIG. 4, protruding piece 47c forms second wiring member 47(II), and is connected to a bypass diode (not illustrated in FIG. 1). As illustrated in a lower side of FIG. 4, coupling piece 47d forms first wiring member 47(I), and is coupled to connecting piece 12b led out from an electrode on a bottom face of solar cell 11f. Protruding piece 47e forms first wiring member 47(I), is mechanically coupled to electrical output extracting port 25a, and is electrically connected to an external terminal and a bypass diode.

As described above, second wiring member 47(II) includes coupling piece 47a and protruding piece 47c, and is formed into an almost "L" shape. Similarly, first wiring member 47(I) includes coupling 47d and protruding piece 47e, and is formed into an almost "L" shape. First wiring member 47(I) and second wiring member 47(II) are coated with a first coating member 471 and a second coating member 472, respectively. Herein, a portion to be connected to the connecting member from the solar cell is not coated with the coating member.

Figure 5:
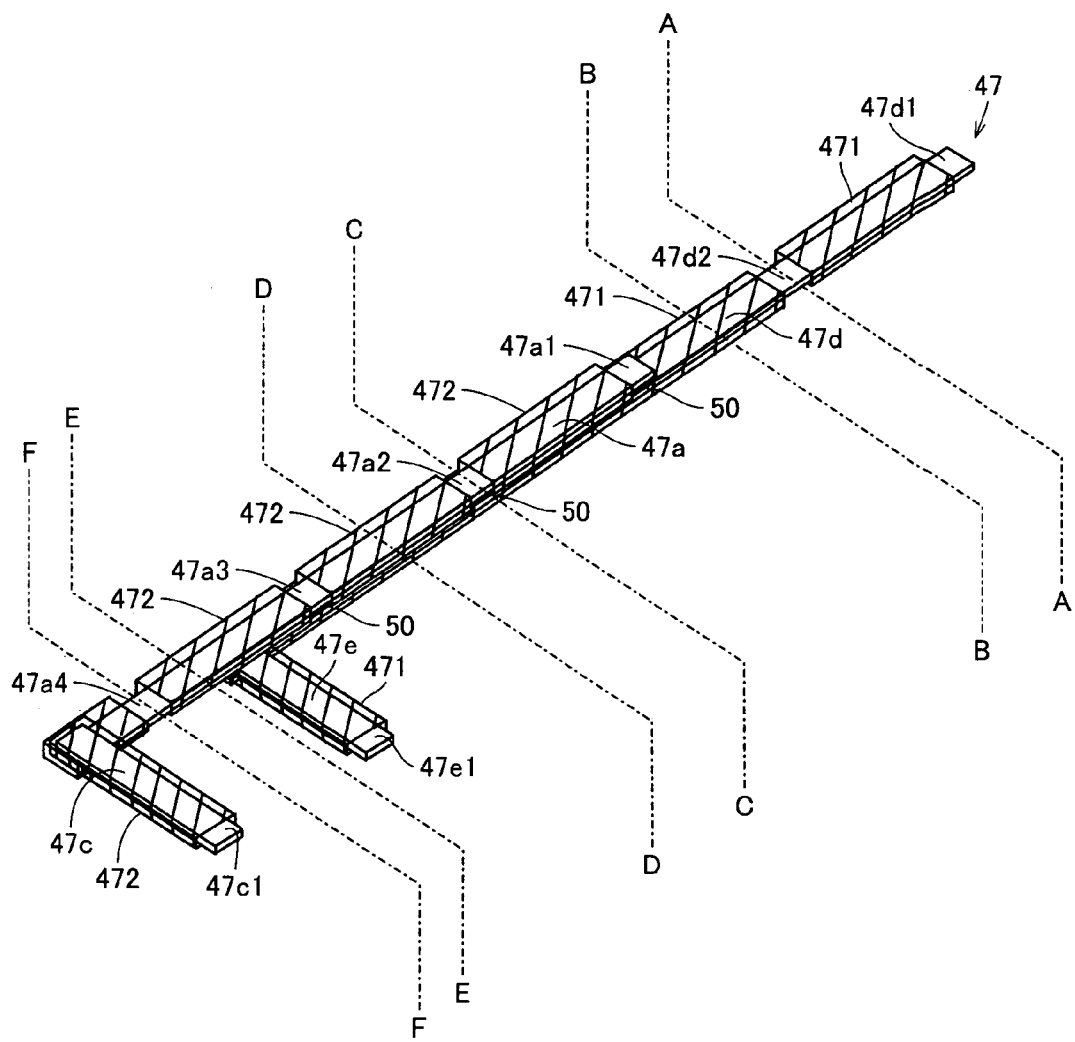
FIG. 5 is a perspective view illustrating one embodiment of the integrated wiring member according to the present invention.

As illustrated in FIG. 5, first wiring member 47(I) and second wiring member 47(II) are integrated with each other through insulating and protecting films 50; thus, first integrated wiring member 47 is formed.

Figure 6:
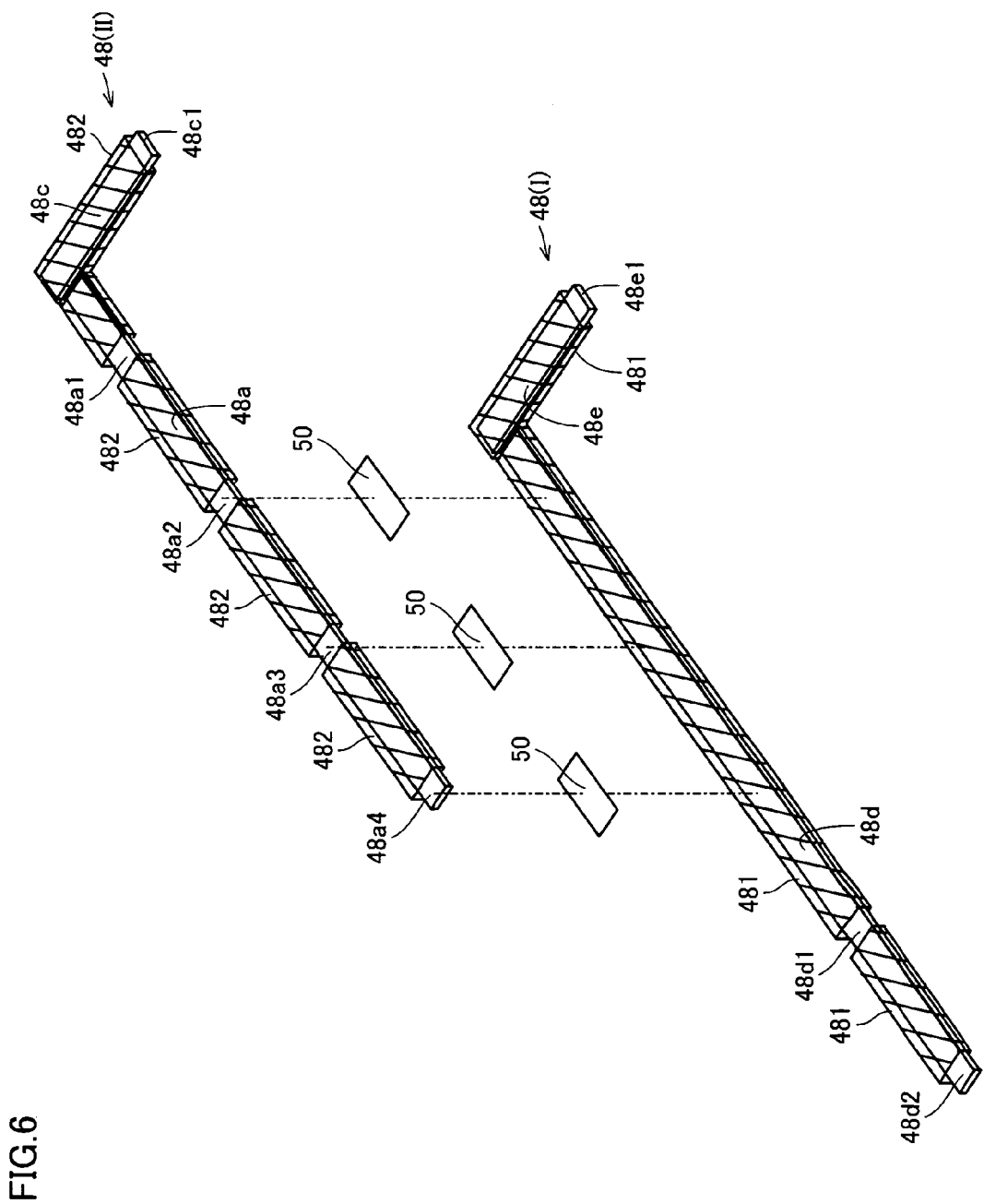
FIG. 6 is a perspective view illustrating one embodiment of a wiring member forming the integrated wiring member according to the present invention.

In the present invention, as illustrated in FIG. 6, second integrated wiring member 48 has a configuration similar to that of first integrated wiring member 47, and includes a first wiring member 48(I), a second wiring member 48(II) and insulating and protecting films 50 interposed between first wiring member 48(I) and second wiring member 48(II). First wiring member 48(I) includes a coupling piece 48d and a protruding piece 48e. Second wiring member 48(II) includes a coupling piece 48a and a protruding piece 48c.

As illustrated in an upper side of FIG. 6, coupling piece 48a forms second wiring member 48(II), and laterally couples between connecting pieces 12b and 12c led out from the adjoining solar cells (11d1 and 11d2) located at a position below the center of the side edge of the solar cell in FIG. 1. Protruding piece 48c is connected to the bypass diode in FIG. 1. Coupling piece 48d is coupled to connecting piece 12c led out from an electrode on a top face of solar cell 11g. Protruding piece 48e is mechanically coupled to electrical output extracting port 25b, and is electrically connected to an external terminal and a bypass diode.

As described above, second wiring member 48(II) includes coupling piece 48a and protruding piece 48c, and is formed into an almost "L" shape. Similarly, first wiring member 48(I) includes coupling piece 48d and protruding piece 48e, and is formed into an almost "L" shape. First wiring member 48(I) and second wiring member 48(II) are coated with a coating member 481 and a coating member 482, respectively. Herein, a portion to be connected to the connecting member from the solar cell is not coated with the coating member.

Figure 7:
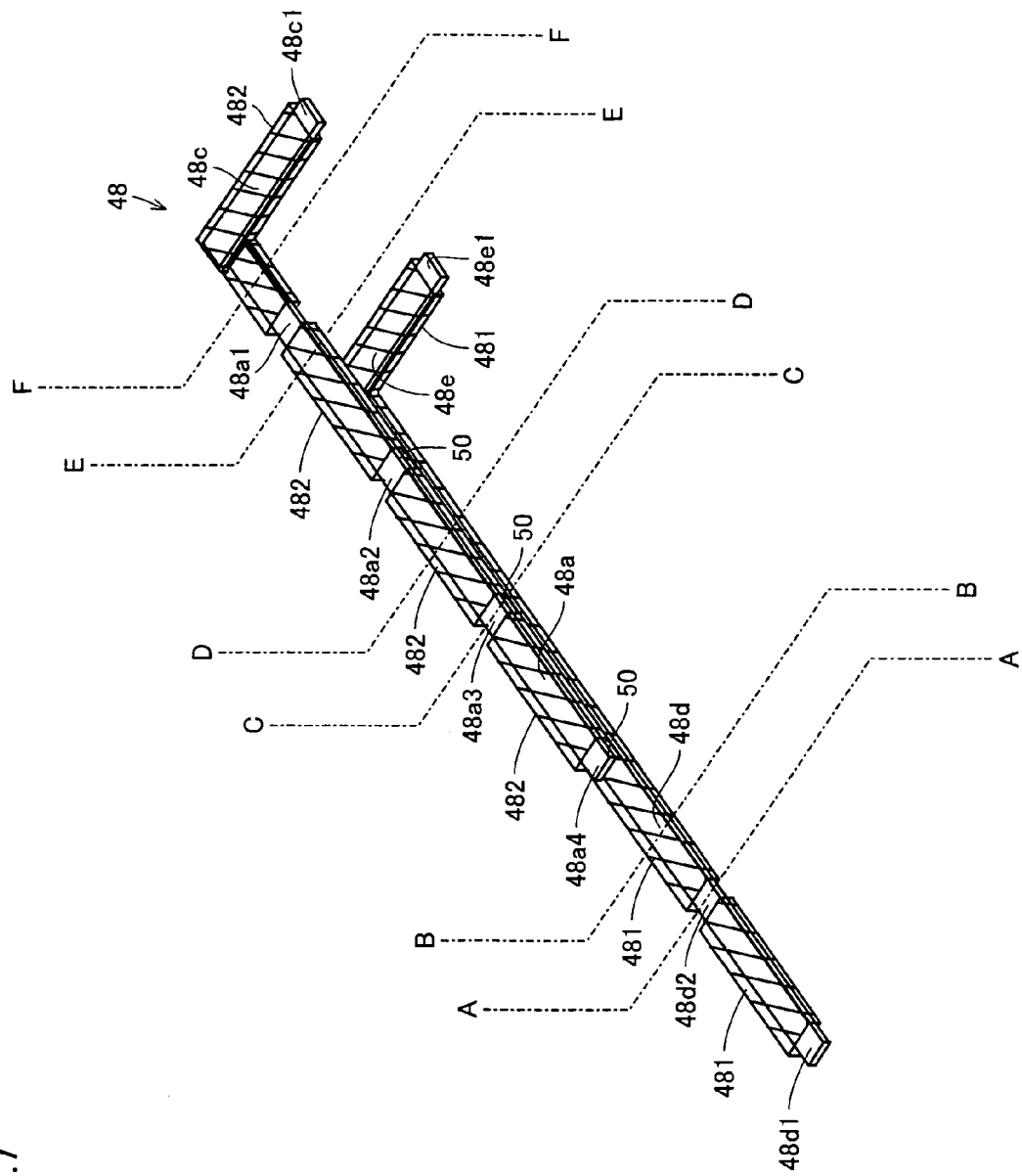
FIG. 7 is a perspective view illustrating one embodiment of the integrated wiring member according to the present invention.
Figure 8:
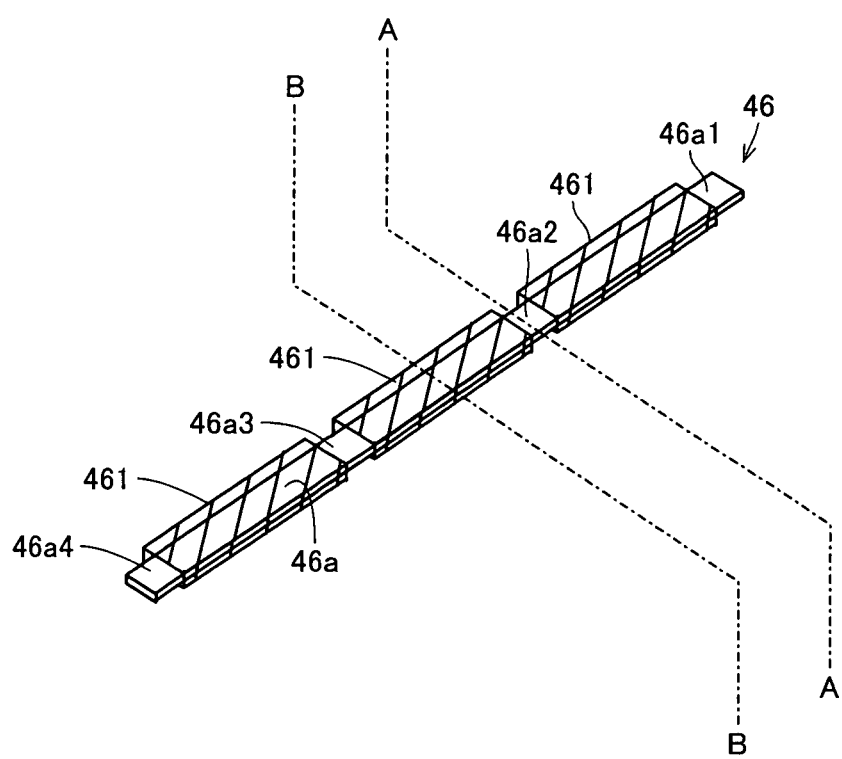
FIG. 8 is a perspective view illustrating one embodiment of the integrated wiring member according to the present invention.

As illustrated in FIG. 7, first wiring member 48(I) and second wiring member 48(II) are integrated with each other through insulating and protecting films 50; thus, second integrated wiring member 48 is formed. In the present invention, as illustrated in FIG. 8, third integrated wiring member 46 includes a coupling piece 46a for laterally coupling between connecting pieces 12c and 12b led out from the adjoining solar cells (11a1 and 11a2, 11c1 and 11c2, 11e1 and 11e2) located at a side edge opposite to the side edge provided with electrical output extracting ports 25a and 25b in FIG. 1. Coupling piece 46a is coated with a coating member 461. Third integrated wiring member 46 only includes coupling piece 46a and coating member 461; however, this configuration is defined as third integrated wiring member 46 for the sake of convenience.

In the present invention, three third integrated wiring members 46 among first, second and third integrated wiring members 46, 47 and 48 are required for connection between the solar cells. Therefore, there are required five integrated wiring members of three types as a whole. An electrical output extracting port 25 is provided with external terminals such as a diode external cable, and wiring members to be coupled to this electrical output extracting port are electrically connected to these terminals.

In the present invention, the wiring member may be made of copper, CiC (copper/indium/copper), Ag, Au, Fe or the like. Preferably, the wiring member has a solder-coated surface.

(First Integrated Wiring Member 47)

FIG. 4 is a perspective view illustrating a state where first wiring member 47(I) and second wiring member 47(II) each forming first integrated wiring member 47 are disassembled from each other. Hereinafter, detailed description will be given of first integrated wiring member 47.

As illustrated in the lower side of FIG. 4, first wiring member 47(I) includes coupling piece 47d for laterally connecting between connecting pieces 12b led out from the electrode on the bottom face of solar cell 11f and electrical output extracting port 25a of matrix 15, regions 47d1 and 47d2 connected to two connecting pieces 12b led out from the electrode on the bottom face of solar cell 11f, and protruding piece 47e connected to an end, located opposite to regions 47d1 and 47d2, of coupling piece 47d. For example, coupling piece 47d may have a width of 6 mm and a thickness of 0.23 mm, and protruding piece 47e may have a width of 6 mm and a thickness of 0.23 mm. Coupling piece 47d and protruding piece 47e are connected by soldering to each other; thus, first wiring member 47(I) is formed into an almost "L" shape as a whole.

As illustrated in FIG. 4, first wiring member 47(I), formed as described above, is coated with insulative coating member 471 (diagonally shaded). However, end 47d1, located opposite to protruding piece 47e, of coupling piece 47d, a portion 47d2 close to a center relative to end 47d1, and tip end 47e1 of protruding piece 47e are bare portions with coating member 471 removed therefrom. Herein, bare portions 47d1 and 47d2 are spaced away from each other by a predetermined distance. Bare portion 47d1 and 47d2 are connected by soldering to the other connecting pieces 12b and 12b of connecting members 12 attached to solar cell 11f (see FIG. 1). Bare portion 47e1 is connected to a portion derived from electrical output extracting port 25a to the outside and a bypass diode (to be described later).

As illustrated in the upper side of FIG. 4, the second wiring member 47(II) includes coupling member 47a, regions 47a1 and 47a2 connected to connecting pieces 12c led out from an electrode on a top face of solar cell 11b1, regions 47a3 and 47a4 connected to connecting pieces 12b led out from an electrode on a bottom face of solar cell 11b2, and protruding piece 47c connected to an end, located opposite to regions 47a1 and 47a2, of coupling piece 47a. For example, each of coupling piece 47a and protruding piece 47c may have a width of 6 mm and a thickness of 0.23 mm. Coupling piece 47a and protruding piece 47c are connected by soldering to each other; thus, second wiring member 47(II) is formed into an almost "L" shape as a whole. Alternatively, coupling piece 47a and protruding piece 47c may be integrated with each other by punching or the like.

Second wiring member 47(II), formed as described above, is entirely coated with insulative coating member 472 (diagonally shaded). However, end 47a1, located opposite to protruding piece 47c, of coupling piece 47a, portion 47a2 close to a center relative to end 47a1, portion 47a3 close to the center relative to portion 47a2, portion 47a4 close to the center relative to portion 47a3, and tip end 47c1 of protruding piece 47c are bare portions with coating member 472 removed therefrom. Herein, bare portions 47a1 and 47a2 are spaced away from each other by a predetermined distance. Bare portions 47a1 and 47a2 are connected by soldering to the other connecting pieces 12c and 12c of connecting members 12 attached to solar cell 11b1 (see FIG. 1). Bare portions 47a3 and 47a4 are spaced away from each other by a predetermined distance. Bare portions 47a3 and 47a4 are connected by soldering to the other connecting pieces 12b and 12b of connecting members 12 attached to solar cell 11b2 (see FIG. 1). Bare portion 47c1 is connected to a bypass diode (to be described later).

Herein, an SiPet film may be used as each of coating members 471 and 472 for coating first wiring member 47(I) and second wiring member 47(II). Preferably, each of coating members 471 and 472 is made of a material identical to that for the back film because a difference in degree of secular changes (bleaching) due to radiation of sunlight is not occurred, so that an aesthetic sense is not deteriorated.

FIG. 5 is a perspective view illustrating first integrated wiring member 47 in which first wiring member 47(I) and second wiring member 47(II), each illustrated in FIG. 4, are integrated with each other. Insulating and protecting films 50 with high heat-resistant property with respect to coating member 471 are arranged between bare portions 47a1, 47a2 and 47a3 each of which is connected to the solar cell and is not covered with coating member 472 and coupling piece 47d coated with coating member 471. As described above, insulating and protecting films 50 are inserted at positions illustrated in FIG. 4; thus, first wiring member 47(I) and second wiring member 47(II) can be integrated with each other before connection by soldering of each connection portion. Herein, examples of insulating and protecting film 50 may include a polyimide film, an aramid film, an SiPet film and the like.

(Second Integrated Wiring Member 48)

FIG. 6 is a perspective view illustrating a state where first wiring member 48(I) and second wiring member 48(II), each forming second integrated wiring member 48, are disassembled from each other. In FIG. 6, an upper side illustrates second wiring member 48(II) and a lower side illustrates first wiring member 48(I). Hereinafter, detailed description will be given of second integrated wiring member 48.

As illustrated in the lower side of FIG. 6, first wiring member 48(I) includes coupling piece 48*d* for laterally connecting between connecting pieces 12*c* led out from the electrode on the top face of solar cell 11*g* and electrical output extracting ports 25*b* of matrix 15, regions 48*d*1 and 48*d*2 connected to two connecting pieces 12*c* led out from the electrode on the upper face of solar cell 11*g*, and protruding piece 48*e* connected to an end, located opposite to regions 48*d*1 and 48*d*2, of coupling piece 48*d*. For example, each of coupling piece 48*d* and protruding piece 48*e* may have a width of 6 mm and a thickness of 0.23 mm.

Coupling piece 48*d* and protruding piece 48*e* are connected by soldering to each other; thus, first wiring member 48(I) is formed into an almost "L" shape as a whole. Then, first wiring member 48(I) is entirely coated with insulative coating member 481 (diagonally shaded). However, end 48*d*2, located opposite to protruding piece 48*e*, of coupling piece 48*d*, portion 48*d*1 close to a center relative to end 48*d*2, and tip end 48*e*1 of protruding piece 48*e* are bare portions with coating member 481 removed therefrom. Herein, bare portions 48*d*1 and 48*d*2 are spaced away from each other by a predetermined distance. Bare portions 48*d*1 and 48*d*2 are connected by soldering to the other connecting pieces 12*c* and 12*c* of connecting members 12 attached to solar cell 11*g* (see FIG. 1). Bare portion 48*e*1 is connected to a portion derived from electrical output extracting port 25*b* to the outside, and a bypass diode (to be described later).

As illustrated in the upper side of FIG. 6, second wiring member 48(II) includes coupling piece 48*a*, regions 48*a*1 and 48*a*2 connected to connecting pieces 12*c* led out from an electrode on a top face of solar cell 11*d*1, regions 48*a*3 and 48*a*4 connected to connecting pieces 12*b* led out from an electrode on a bottom face of solar cell 11*d*2, and protruding piece 48*c* connected to an end, located opposite to regions 48*a*1 and 48*a*2, of coupling piece 48*a*. For example, each of coupling piece 48*a* and protruding piece 48*c* may have a width of 6 mm and a thickness of 0.23 mm. Coupling piece 48*a* and protruding piece 48*c* are connected by soldering to each other; thus, second wiring member 48(II) is formed into an almost "L" shape as a whole. Alternatively, coupling piece 48*a* and protruding piece 48*c* may be integrated with each other by punching or the like.

Then, second wiring member 48(II) is entirely coated with insulative coating member 482 (diagonally shaded). However, end 48*a*4, located opposite to protruding piece 48*c*, of coupling piece 48*a*, portion 48*a*3 close to a center relative to end 48*a*4, portion 48*a*2 close to the center relative to portion 48*a*3, portion 48*a*1 close to the center relative to portion 48*a*2, and tip end 48*c*1 of protruding piece 48*c* are bare portions with coating member 482 removed therefrom. Herein, bare portions 48*a*1 and 48*a*2 are spaced away from each other by a predetermined distance. Bare portions 48*a*1 and 48*a*2 are connected by soldering to the other connecting pieces 12*c* and 12*c* of connecting members 12 attached to solar cell 11*d*1 (see FIG. 1). Bare portions 48*a*3 and 48*a*4 are spaced away from each other by a predetermined distance. Bare portions 48*a*3 and 48*a*4 are connected by soldering to the other connecting pieces 12*b* and 12*b* of connecting members 12 attached to solar cell 11*d*2 (see FIG. 1). Bare portion 48*c*1 is connected to a bypass diode (to be described later).

FIG. 7 is a perspective view illustrating second integrated wiring member 48 in which first wiring member 48(I) and second wiring member 48(II), each illustrated in FIG. 6, are integrated with each other. Insulating and protecting films 50 with high heat-resistant property with respect to coating member 481 are arranged between bare regions 48*a*1, 48*a*2 and 48*a*3, each of which is connected to the solar cell and is not coated with coating member 482, and coupling piece 48*d* coated with coating member 481. As described above, insulating and protecting films 50 are inserted at positions illustrated in FIG. 8; thus, first wiring member 48(I) and second wiring member 48(II) can be integrated with each other before connection by soldering of each connection portion.

(Third Integrated Wiring Member 46)

FIG. 8 is a perspective view illustrating third integrated wiring member 46. Hereinafter, detailed description will be given of third integrated wiring member 46.

As illustrated in FIG. 8, third wiring member 46 includes coupling piece 46*a*, regions 46*a*1 and 46*a*2 connected to connecting pieces 12*c* led out from an electrode on a top face of each of solar cells 11*a*1, 11*c*1 and 11*e*1, and regions 46*a*3 and 46*a*4 connected to connecting pieces 12*b* led out from an electrode on a bottom face of each of solar cells 11*a*2, 11*c*2 and 11*e*2. Third wiring member 46 is formed into an almost "I" shape. For example, coupling piece 46*a* may have a width of 6 mm and a thickness of 0.23 mm.

Then, third integrated wiring member 46, formed as described above, is entirely coated with insulative coating member 461 (diagonally shaded). However, end 46*a*1 of coupling piece 46*a* and portion 46*a*2 close to a center relative to end 46*a*1 are spaced away from each other by a predetermined distance, and are bare portions with coating member 461 removed therefrom. Bare portions 46*a*1 and 46*a*2 are connected by soldering to the other connecting pieces 12*c* and 12*c* of connecting members 12 attached to each of solar cells 11*a*1, 11*c*1 and 11*e*1 (see FIG. 1).

In addition, end 46*a*4 of coupling piece 46*a* and portion 46*a*3 close to the center relative to end 46*a*4 are spaced away from each other by a predetermined distance, and are bare portions with coating member 461 removed therefrom. Bare portions 46*a*3 and 46*a*4 are connected by soldering to the other connecting pieces 12*b* and 12*b* of connecting members 12 attached to each of solar cells 11*a*2, 11*c*2 and 11*e*2 (see FIG. 1).

(Manufacturing Method of Integrated Wiring Member)

Figure 9:
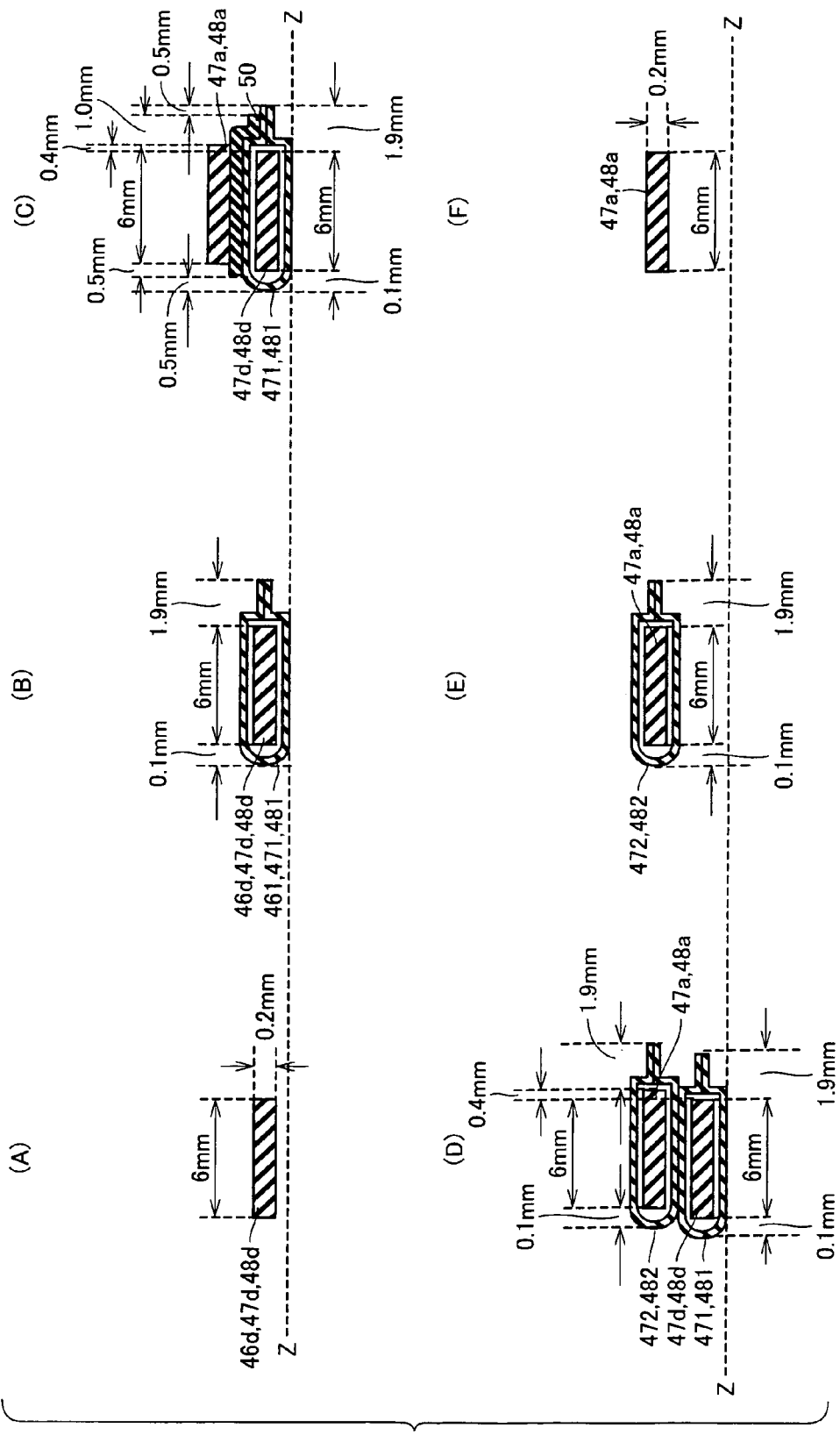
FIG. 9 is a sectional view illustrating a section of the integrated wiring member according to the present invention.

FIG. 9 illustrates examples of sectional structures of first, second and third integrated wiring members 46, 47 and 48. In FIG. 9, (A), (B), (C), (D), (E) and (F) are sectional views taken along broken lines A-A, B-B, C-C, D-D, E-E and F-F in FIGS. 5, 7 and 8, respectively. In (A) to (F) of FIG. 9, dimensions of the respective components are described as examples. However, the present invention does not intend to be interpreted by limitation of these dimensions.

Hereinafter, description will be given of a manufacturing method of first integrated wiring member 47 in addition to a coating method of a coating member with reference to FIGS. 4, 5 and 9. As illustrated in FIG. 4, coupling piece 47*a* is coated with coating member 472, and coupling piece 47*d* is coated with coating member 471. More specifically, a copper-wire formed body obtained in such a manner that solder-plated copper wires having widths of 6 mm and 1.5 mm and a thickness of 0.23 mm are connected by soldering to each other so as to integrally form an almost "L" shape is covered with a film as coating member 472 with insulation performance and selectable color such as a PET film. In this operation, an adhesive, a double-faced tape or the like may be used.

Description will be given of one example of this operation with reference to FIG. 9. With reference to (E) of FIG. 9, one insulating film 472 is folded in two, and the copper-wire formed body is sandwiched therebetween. When one insulating film 472 is folded in two as described above, a deviation of the copper-wire formed body is suppressed upon adhesion, so that insulation performance can be ensured with reliability. Herein, the copper-wire formed body is covered with EVA resin upon manufacturing of a solar cell module in a subsequent step. Therefore, completed first integrated wiring member 47 must be previously subjected to vacuum lamination or deaeration in order to prevent generation of air bubbles in the EVA resin. In addition, an adhesive or a double-faced tape which does not exert an adverse influence on the EVA resin must be selected herein.

Figure 55:
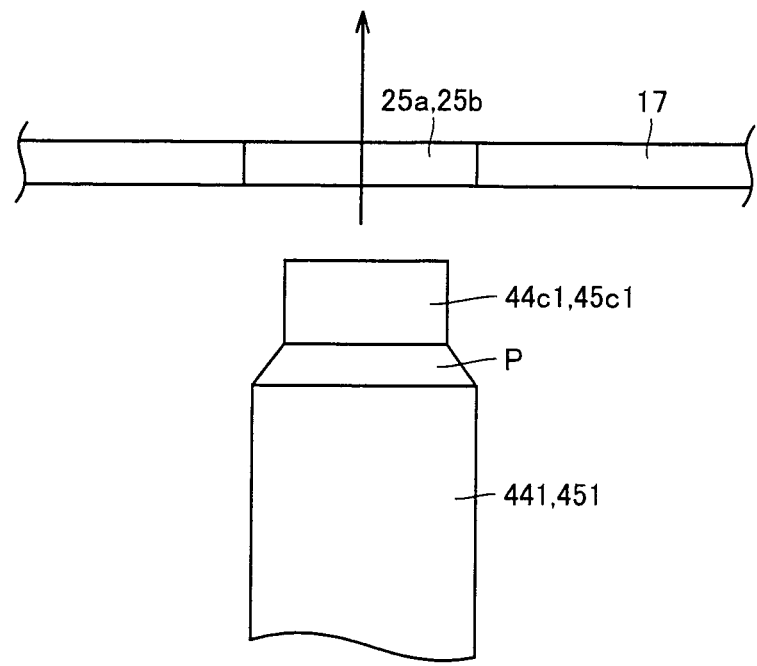
FIG. 55 illustrates a tip end shape of a coating member in the conventional solar cell module.
Figure 56:
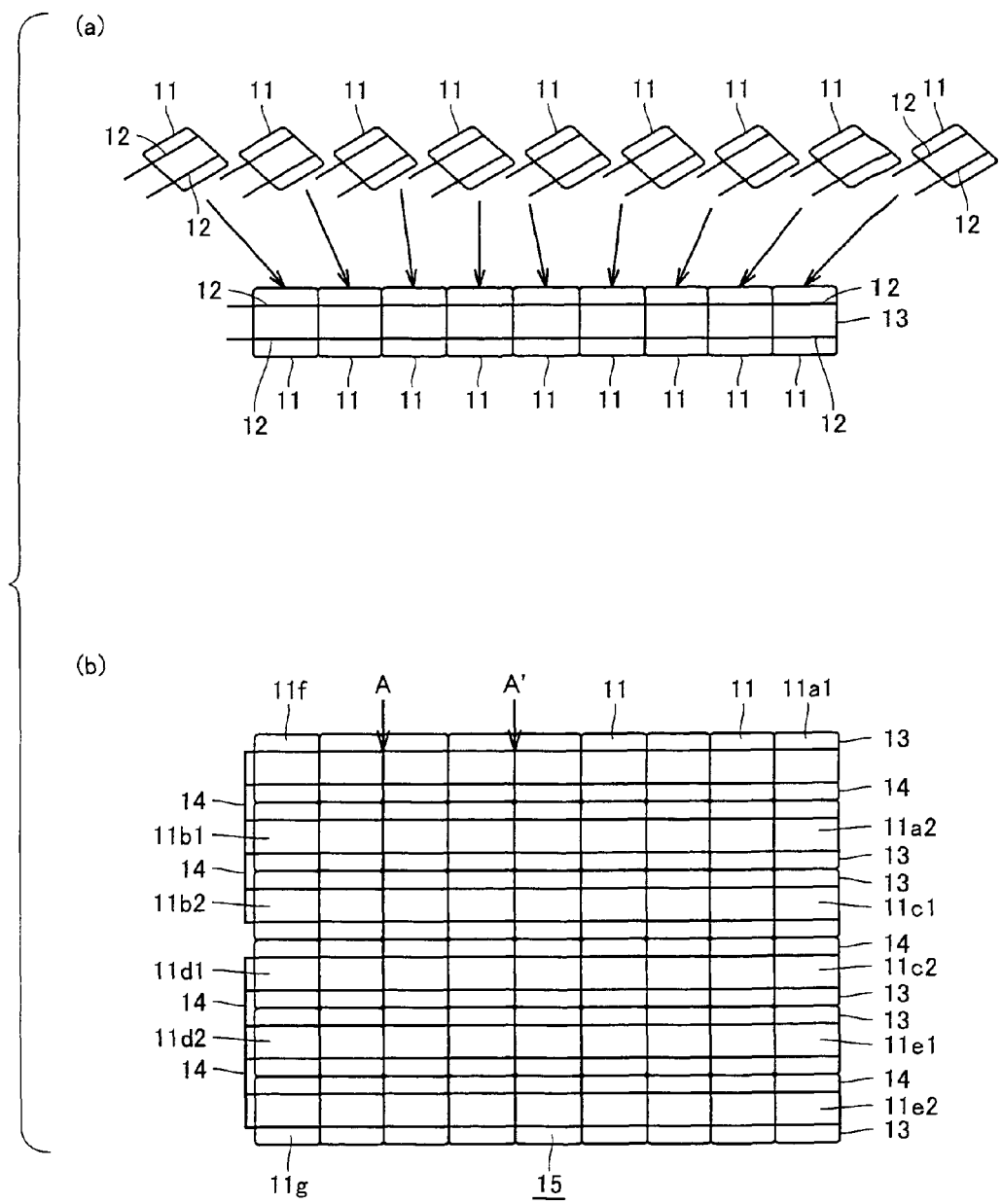
In FIG. 56, (a) and (b) are plan views each illustrating a manufacturing step of the conventional solar cell module.
Figure 57:
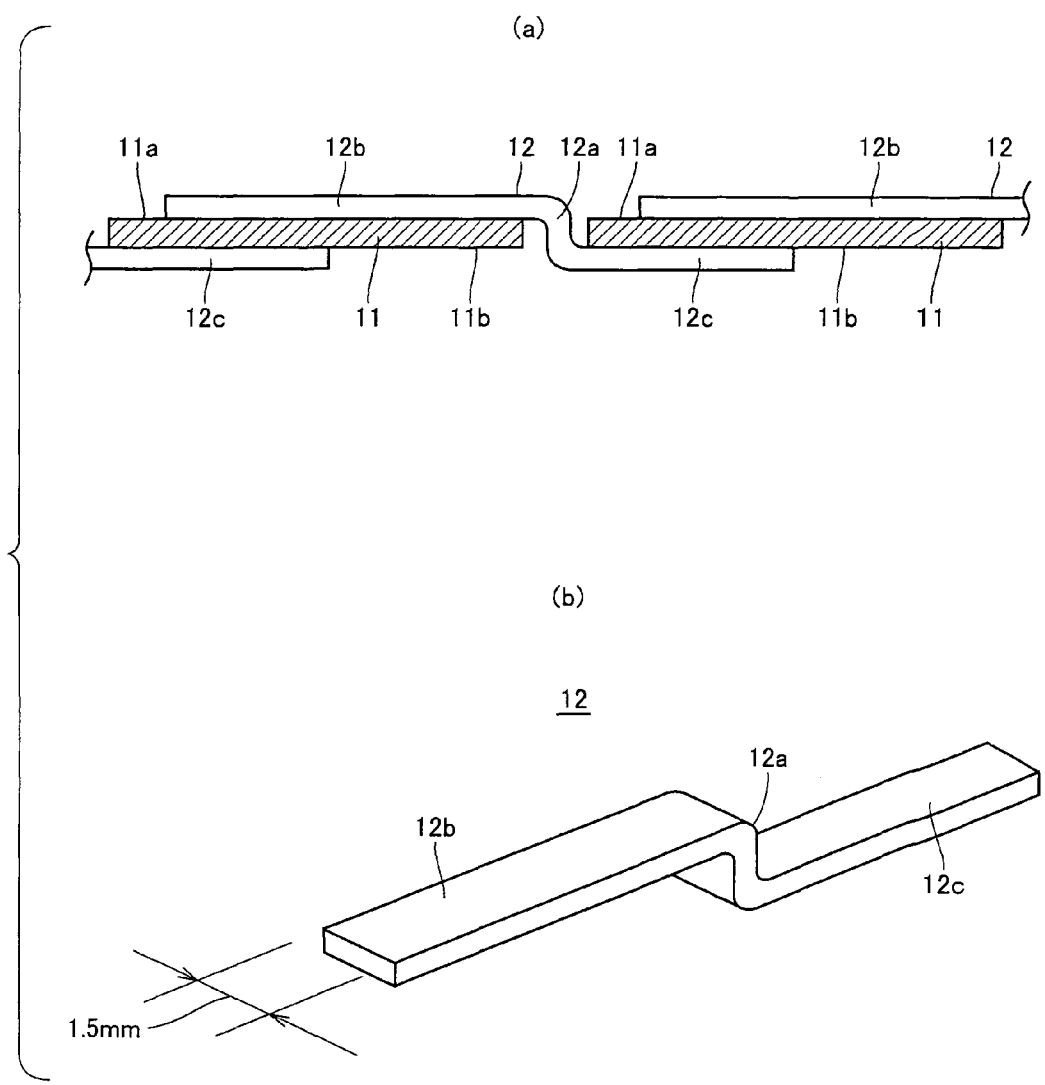
In FIG. 57, (a) is a sectional view taken along a line A-A' in (b) of FIG. 56, and (b) is a perspective view of a connecting member.

As in the conventional example illustrated in FIG. 55, the tip end of coating member 472 for coating protruding piece 47c of second wiring member 47(II) has tapered face P cut obliquely. Tapered face P exhibits the following advantage. That is, when bare portion 47c1 of second wiring member 47(II) is derived from electrical output extracting port 25a formed in back cover 17 made of a conductive film to the outside, the tip end (tapered face P) of coating member 472 can smoothly pass through electrical output extracting port 25a without catch in peripheral portions of electrical output extracting port 25a. Thus, there is completed first integrated wiring member 47 as the copper-wire formed body wherein second wiring member 47(II) having coupling piece 47a and protruding piece 47c connected therebetween is coated with coating member 472.

Similarly, there can be formed first wiring member 47(I) as the copper-wire formed body wherein solder-plated copper wires having widths of 6 mm and 1.5 mm and a thickness of 0.23 mm are connected by soldering to each other so as to have an almost "L" shape and, then, are coated with coating member 471.

Thereafter, an adhesive, a double-faced tape or the like is used for fixing first wiring member 47(I) and second wiring member 47(II) at respective desired positions so as to integrate first wiring member 47(I) with second wiring member 47(II); thus, first integrated wiring member 47 is completed. Herein, as described above, insulating and protecting film 50 is interposed between first wiring member 47(I) and second wiring member 47(II).

Next, description will be given of a sectional structure of first integrated wiring member 47, integrated as described above, with reference to FIGS. 5 and 9. In FIG. 9, a broken line Z-Z is a reference line indicating a positional relation of each section. Each of broken lines Z-Z described subsequently in the present specification has similar meaning.

In FIG. 9, (A) illustrates a sectional structure taken along a broken line A-A in FIG. 5. Herein, coupling piece 47d, which is a solder-plated flat copper wire having a width of 6 mm, is bared. In coupling piece 47d, it is sufficient that only a face, where at least connection by soldering is performed, is bared. Preferably, first wiring member 47(I) other than the face, where connection by soldering is performed, is coated with coating member 471.

In FIG. 9, (B) illustrates a sectional structure taken along a broken line B-B in FIG. 5. Herein, coupling piece 47d, which is a solder-plated flat copper wire having a width of 6 mm, is coated with film-shaped coating member 471 folded in two, as described above. A distance between an outer tip end on the folded side of coating member 471 and the tip end of coupling piece 47d in an identical direction is 0.1 mm, and a distance between an apex of overlaid both ends of folded coating member 471 and the tip end of coupling piece 47d in an identical direction is 1.9 mm. Herein, coating member 471 has an outer dimension of about 0.2 mm to 0.3 mm in a thickness direction.

In FIG. 9, (C) illustrates a sectional structure taken along a broken line C-C in FIG. 5. Herein, insulating and protecting film 50 with high heat-resistant property with respect to coating member 471 is placed immediately on first wiring member 47(I) coated with film-shaped coating member 471 folded in two, and a portion, which is not coated with film-shaped coating member 472, of second wiring member 47(II) is placed immediately on insulating and protecting film 50.

A distance between an outer tip end on the folded side of coating member 471 and the tip end of insulating and protecting film 50 in an identical direction is 0.5 mm, and a distance between the tip end of insulating and protecting film 50 and the tip end of coupling piece 47a of second wiring member 47(II) in an identical direction is 0.5 mm. Further, a distance between an apex of overlaid both ends of coating member 471 and the tip end of insulating and protecting film 50 in an identical direction is 0.5 mm, a distance between the tip end of insulating and protecting film 50 and the tip end of coupling piece 47a of second wiring member 47(II) in an identical direction is 1.0 mm. Coupling piece 47a of first wiring member 47(I) and coupling piece 47d of second wiring member 47(II) are 6.0 mm in width, and are displaced from each other by 0.4 mm. That is, when being seen from the light receiving face of the solar cell module (when being seen from below in FIG. 9), insulating and protecting film 50 is shielded by coating member 471, and coupling piece 47a of first wiring member 47(I) is located inward with respect to the width of insulating and protecting film 50. The numerical values described herein are merely examples, and the present invention is not limited thereto as long as the aforementioned states are kept. Thus, if insulating and protecting film 50 with high heat-resistant property is different in color from coating member 471 and back cover 17, the aforementioned feature is effectively exerted, thus, an aesthetic sense of the surface of the solar cell module can be maintained.

In FIG. 9, (D) illustrates a sectional structure taken along a broken line D-D in FIG. 5. Herein, second wiring member 47(II) coated with film-shaped coating member 472 folded in two is placed immediately on first wiring member 47(I) coated with film-shaped coating member 471 folded in two. As also illustrated in (B) of FIG. 9, coupling piece 47d of first wiring member 47(I) and coupling piece 47a of second wiring member 47(II) are 6.0 mm in width and are displaced from each other by 0.4 mm.

In FIG. 9, (E) illustrates a sectional structure taken along a broken line E-E in FIG. 5. Herein, as described above, coupling piece 47a, which is a solder-plated flat copper wire having a width of 6 mm, is coated with film-shaped coating member 472 folded in two. A distance between an outer tip end of the folded side of coating member 472 and the tip end of coupling piece 47a in an identical direction is 0.1 mm, and a distance between an apex of overlaid both ends of coating member 472 and the tip end of coupling piece 47a in an identical direction is 1.9 mm. Herein, coating member 472 has an outer dimension of about 0.2 mm to 0.3 mm in a thickness direction.

In FIG. 9, (F) illustrates a sectional structure taken along a broken line F-F in FIG. 5. Herein, coupling piece 47a, which is a solder-plated flat copper wire having a width of 6 mm, is bared. In coupling piece 47a, it is sufficient that only a face, where at least connection by soldering is performed, is bared. Coupling member 47a other than the face, where connection by soldering is performed, may be coated with coating member 472.

That is, the first integrated wiring member is a combination of wiring members for a solar cell module, and includes (i) a part configured by a first wiring member, (ii) a part configured by the first wiring member coated with a first coating member, (iii) a part configured by a second wiring member adjoining to the first wiring member coated with the first coating member via an insulating and protecting film, (iv) a part configured by the second wiring member which adjoins to the first wiring member coated with the first coating member and is coated with a second coating member, (v) a part configured by the second wiring member coated with the second coating member, and (vi) a part configured by the second wiring member.

The aforementioned description is given of the sectional structure of first integrated wiring member 47. It is needless to say that the same holds true for second integrated wiring member 48 and third integrated wiring members 46. In particular, those skilled in the art readily understand that second integrated wiring member 48 and first integrated wiring member 47 are related in structure as mirror image and have a similar structure.

Further, first, second and third integrated wiring members 46, 47 and 48 are mainly connected by soldering to solar cells. Therefore, insulating and protecting film 50 excellent in heat-resistant property is used herein. Use of insulating and protecting film 50 leads to improved aesthetic sense because of widened choice of coating member 472.

(Wiring Step)

Next, description will be given of a wiring step for a solar cell module using first, second and third wiring members 46, 47 and 48 with reference to FIGS. 1 and 2. First, three third integrated wiring members 46, 46 and 46 are arranged along the adjoining solar cells (11a1 and 11a2, 11c1 and 11c2, 11e1 and 11e2) located at the side edge of matrix 15, respectively (see FIG. 1). In this state, bare portions 46a1 and 46a2 of uppermost third integrated wiring member 46 in FIG. 1 are connected by soldering to the other connecting pieces 12c and 12c of connecting members 12 attached to solar cell 11a1 with the use of a soldering iron or the like. Further, bare portions 46a3 and 46a4 of uppermost third wiring member 46 are connected by soldering to the other connecting pieces 12b and 12b of connecting members 12 attached to solar cell 11a2 with the use of a soldering iron or the like.

Similarly, bare portions 46a1 and 46a2 of middle third integrated wiring member 46 in FIG. 1 are connected by soldering to the other connecting pieces 12c and 12c of connecting members 12 attached to solar cell 11c1 with the use of a soldering iron or the like. Further, bare portions 46a3 and 46a4 of middle third integrated wiring member 46 are connected by soldering to the other connecting pieces 12b and 12b of connecting members 12 attached to solar cell 11c2 with the use of a soldering iron or the like.

Similarly, bare portions 46a1 and 46a2 of lowermost third integrated wiring member 46 in FIG. 1 are connected by soldering to the other connecting pieces 12c and 12c of connecting members 12 attached to solar cell 11e1 with the use of a soldering iron or the like. Further, bare portions 46a3 and 46a4 of lowermost third integrated wiring member 46 are connected by soldering to the other connecting pieces 12b and 12b of connecting members 12 attached to solar cell 11e2 with the use of a soldering iron or the like.

Next, first integrated wiring member 47 is arranged along the adjoining solar cells (11b1 and 11b2) located at a position above a center of the edge of matrix 15 (see FIG. 1). In this state, bare portions 47a1 and 47a2 of second wiring member 47(II) are connected by soldering to the other connecting pieces 12c and 12c of connecting members 12 attached to solar cell 11b1 with the use of a soldering iron or the like. Further, bare portions 47a3 and 47a4 of second wiring member 47(II) are connected by soldering to the other connecting pieces 12b and 12b of connecting members 12 attached to solar cell 11b2 with the use of a soldering iron or the like. Moreover, bare portions 47d1 and 47d2 of first wiring member 47(I) are connected by soldering to the other connecting pieces 12b and 12b of connecting members 12 attached to solar cell 11f with the use of a soldering iron or the like. In addition, tip end 47e1 of protruding piece 47e of first wiring member 47(I) is derived from electrical output extracting port 25a to the outside.

Herein, a bypass diode (not illustrated) is connected between tip end 47c1 of protruding piece 47c of second wiring member 47(II) and tip end 47e1 of protruding 47e of first wiring member 47(I).

Next, second integrated wiring member 48 is arranged along the adjoining solar cells (11d1 and 11d2) located at a position below the center of the edge of matrix 15 (see FIG. 1). In this state, bare portions 48a1 and 48a2 of second wiring member 48(II) are connected by soldering to the other connecting pieces 12c and 12c of connecting members 12 attached to solar cell 11d1 with the use of a soldering iron or the like. Further, bare portions 42a3 and 42a4 of second wiring member 48(II) are connected by soldering to the other connecting pieces 12b and 12b of connecting members 12 attached to solar cell 11d2 with the use of a soldering iron or the like. Moreover, bare portions 48d1 and 48d2 of first wiring member 48(I) are connected by soldering to the other connecting pieces 12c and 12c of connecting members 12 attached to solar cell 11g with the use of a soldering iron. In addition, tip end 48e1 of protruding piece 48e of first wiring member 48(I) is derived from electrical output extracting ports 25b to the outside.

Herein, a bypass diode (not illustrated) is connected between tip end 48c1 of protruding piece 48c of second wiring member 48(II) and tip end 48e1 of protruding piece 48e of first wiring member 48(I).

The soldering operations may be performed successively as described above or may be performed at a time. The soldering operations are not in particular order.

FIG. 2 illustrates a state after completion of the wiring work. Herein, connecting pieces 12b, 12b, 12c, 12c, . . . protruding from the side edges of matrix 15 are cut (shown by broken lines in FIG. 2) after completion of the wiring work.

FIG. 3 is an enlarged view mainly illustrating a connection state between integrated wiring members 47 and 48 and the electrical output extracting ports in the solar cell. In FIG. 3, (A) is a plan view when being seen from the bottom face side of the solar cell module and (B) is also a plan view when being seen from the bottom face side of the solar cell module. Herein, the solar cell module is formed while being covered with the back cover as illustrated in FIG. 58. FIG. 3 illustrates a positional relation of the wiring members near electrical output extracting ports 25a and 25b. Protruding pieces 47c1 and 47e1 connected to electrical output extracting ports 25a and protruding pieces 48c1 and 48e1 connected to electrical output extracting ports 25b are connected to external terminals, respectively.

As illustrated in FIGS. 1 and 2, when first, second and third integrated wiring members 46, 47 and 48 formed in accordance with this embodiment are used, 24 soldered connection parts are aligned orderly. Thus, work for connection by soldering can be simplified, a time for this work can be reduced, and efficiency for this work can be significantly improved.

Further, as a typical end-face sealing member for the solar cell module, there is used silicone resin, EVA resin or the like which enters a liquid state once upon manufacturing of the solar cell module. However, each of first, second and third integrated wiring members 46, 47 and 48 is coated with a member excellent in insulation performance and moisture-resistant performance such as a PET film. Therefore, even if generation of air bubbles or separation is occurred at the silicone resin, the EVA resin or the like, protection by coating members 461, 471 and 481 makes it possible to significantly reduce a possibility of generation of insulation failure.

A case where first, second and third integrated wiring members 46, 47 and 48 are coated with coating members 461, 471 and 481 exhibits the following advantage in comparison with a conventional case in terms of outer appearance. That is, soldered portions (47a1, 47a2, 47a3, 48a1, 48a2, 48a3) in second wiring members 47(II) and 48(II) are shielded from the top face side of the solar cell module by coating members 471 and 481 for coating coupling pieces 47d and 48d of first wiring members 47(I) and 48(I) each extracting an electrical output from the ends of matrix 15 configured by the solar cells connected in series. Thus, an aesthetic sense can be ensured even when the solar cell module is seen from a position under the eaves.

In this embodiment, first, second and third integrated wiring members 46, 47 and 48 are coated with the coating members except portions to be connected by soldering to connecting pieces 12b and connecting pieces 12c of connecting members 12 attached to the solar cells. However, for example, protruding pieces 47c and 48c of second wiring members 47(II) and 48(II) and protruding pieces 47e and 48e of first wiring members 47(I) and 48(I) are partly located at the bottom face side of the solar cell module after completion of the connection by soldering. As a result, the hidden portions are not seen from the top face side of the solar cell module and, therefore, may not be coated with coating members. In addition, the respective coupling pieces of first, second and third integrated wiring members 46, 47 and 48, which are inconspicuous when being seen from the top face side of the solar cell module, may not be coated with coating members partly.

In the integrated wiring member according to Embodiment 1, the first wiring member and the second wiring member are independently coated with coating members; thus, an insulating property can be retained. Further, film-shaped insulating and protecting films with high heat-resistant property can be arranged only at desired positions; thus, cost reduction can be achieved.

Embodiment 2

Figure 10:
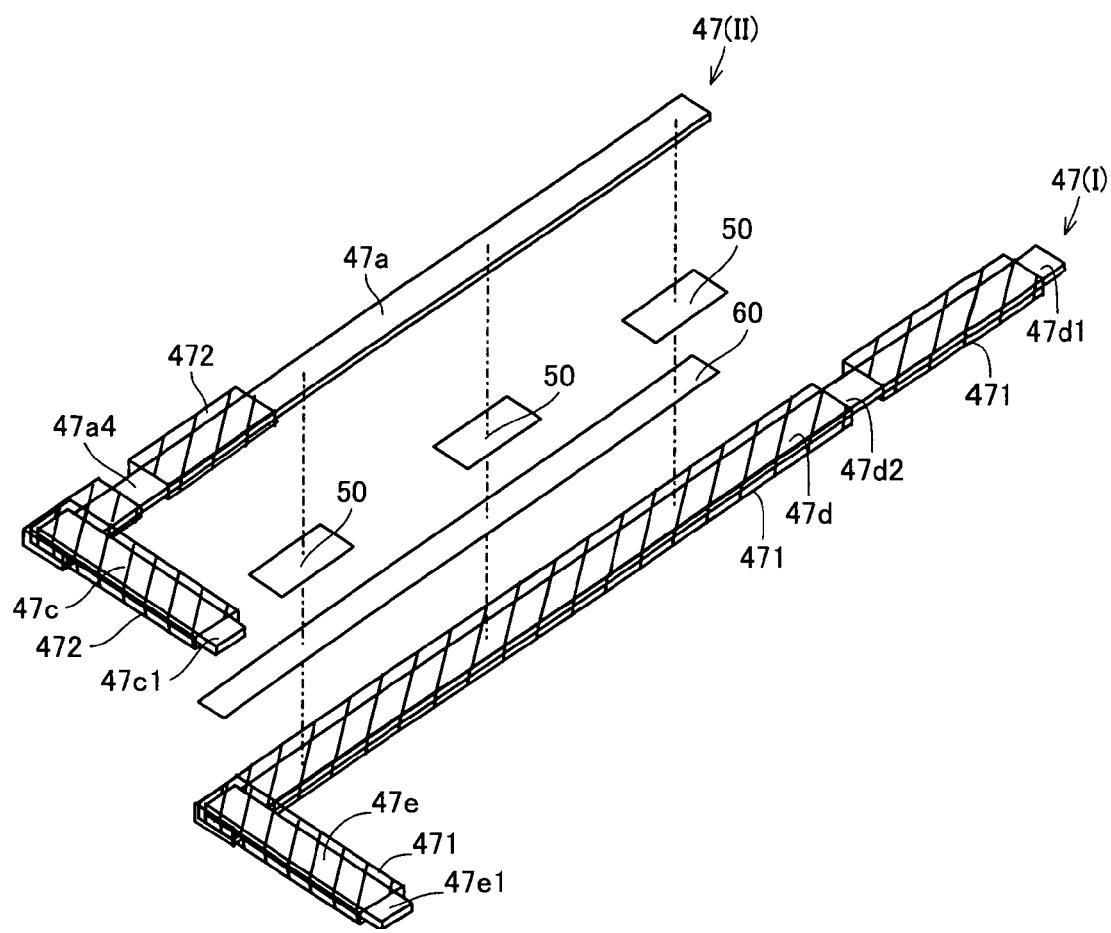
FIG. 10 is a perspective view illustrating one embodiment of the wiring member forming the integrated wiring member according to the present invention.
Figure 11:
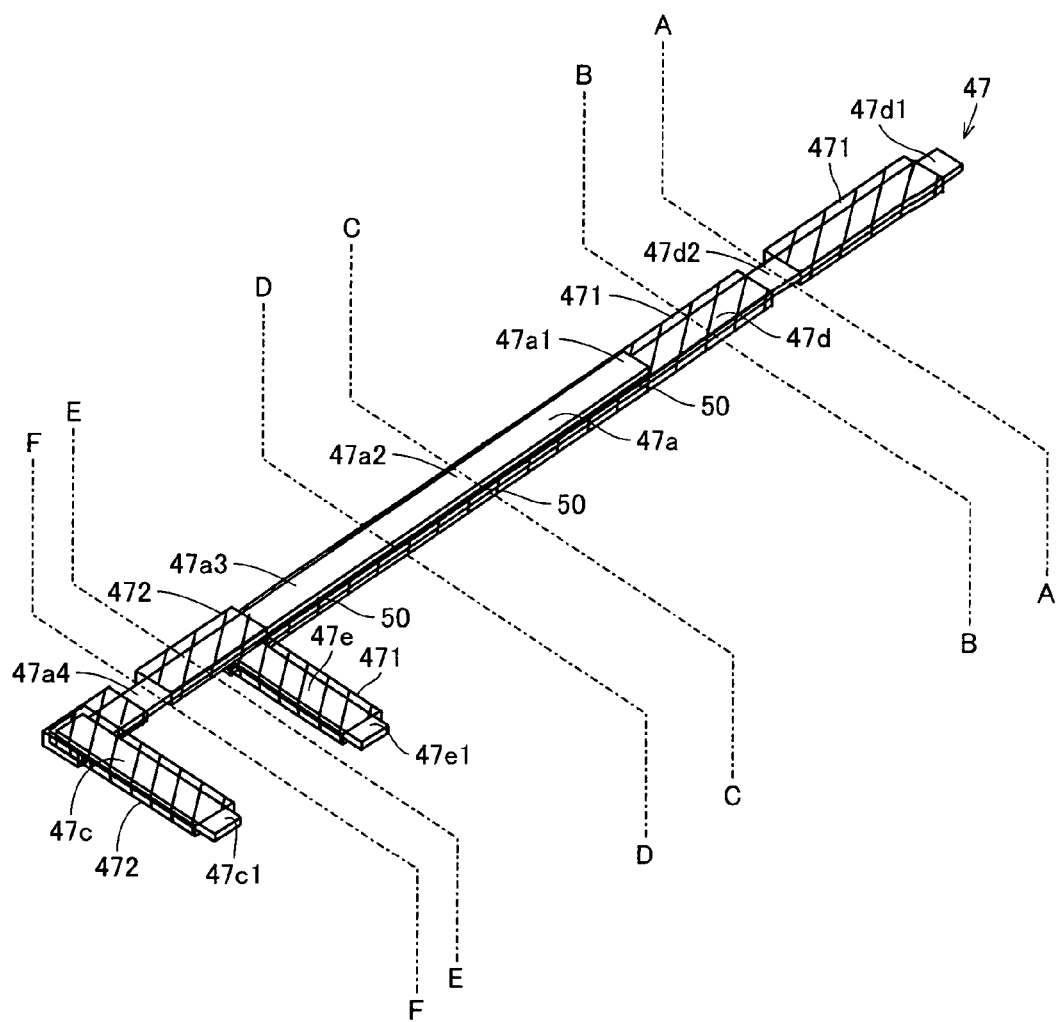
FIG. 11 is a perspective view illustrating one embodiment of the integrated wiring member according to the present invention.
Figure 12:
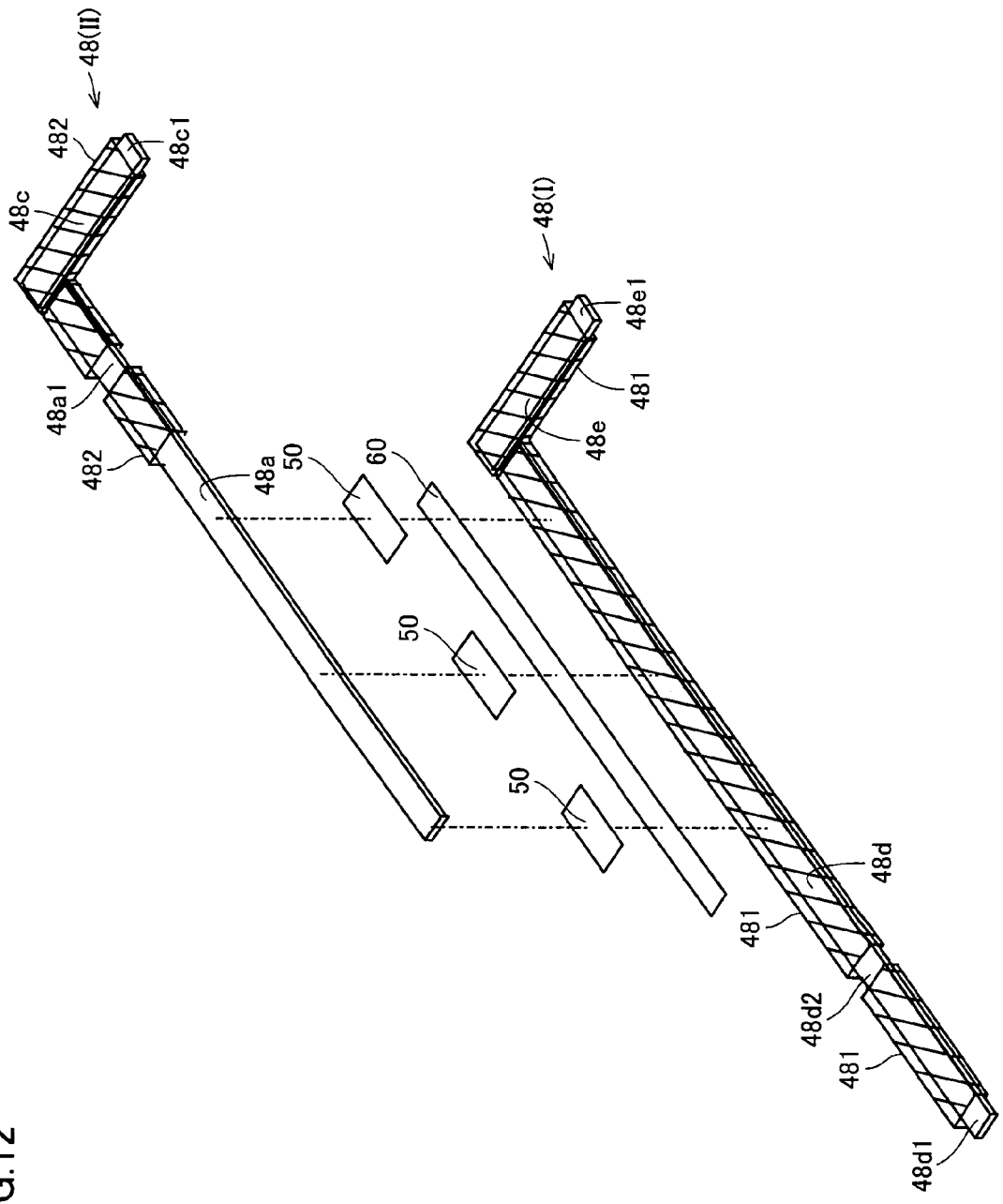
FIG. 12 is a perspective view illustrating one embodiment of the wiring member forming the integrated wiring member according to the present invention.
Figure 13:
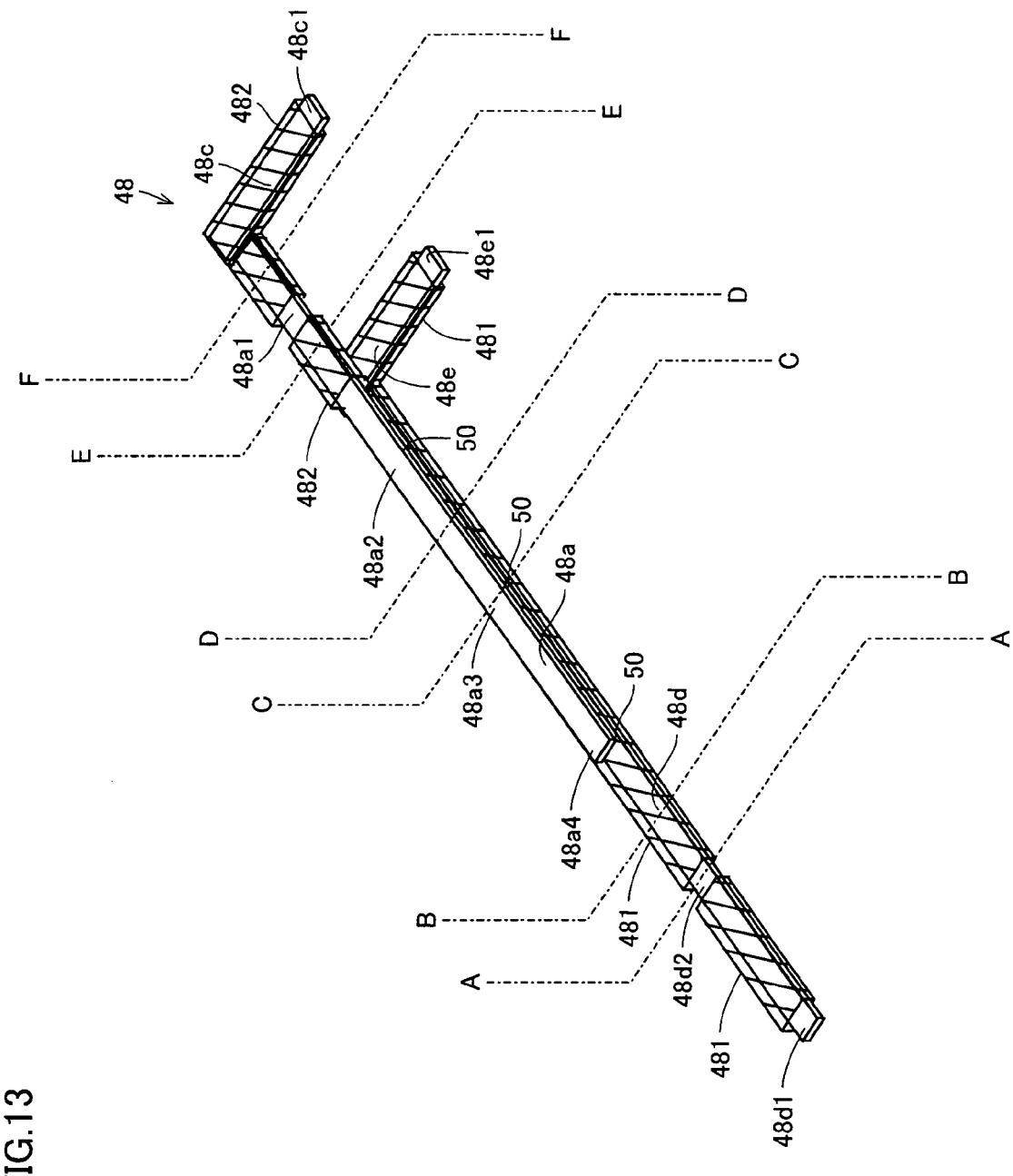
FIG. 13 is a perspective view illustrating one embodiment of the integrated wiring member according to the present invention.

In Embodiment 2, description will be given of another embodiment of the integrated wiring member according to the present invention. FIG. 10 is a perspective view illustrating first wiring member 47(I) and second wiring member 47(II) separated from each other in first integrated wiring member 47. FIG. 11 is a perspective view illustrating first integrated wiring member 47 in which first wiring member 47(I) and second wiring member 47(II) separated from each other in FIG. 10 are integrated with each other. FIG. 12 is a perspective view illustrating first wiring member 48(I) and second wiring member 48(II) separated from each other in second integrated wiring member 48. FIG. 13 is a perspective view illustrating second integrated wiring member 48 in which first wiring member 48(I) and second wiring member 48(II) separated from each other in FIG. 12 are integrated with each other.

As illustrated in FIGS. 10 and 12, Embodiment 2 is similar to Embodiment 1 except that there are omitted coating members 472 and 482 on portions of second wiring members 47(II) and 48(II) shielded from the top face side of the solar cell module by first coating members 471 and 481 on first wiring members 47(I) and 48(I). More specifically, as illustrated in FIGS. 10 and 12, coupling pieces 47a and 48a of second wiring members 47(II) and 48(II), which are substantially overlaid on portions extending from bare portions 47d2 and 48d2 of coupling pieces 47d and 48d to protruding pieces 47e and 48e in first wiring members 47(I) and 48(I), are not partly coated with coating members 472 and 482. That is, coupling pieces 47a and 48a are partly bared.

As described above, when first wiring members 47(I) and 48(I) are integrated with second wiring members 47(II) and 48(II), respectively, the bare portions in second wiring members 47(II) and 48(II) are shielded from sunlight by the portions, substantially overlaid on second wiring members 47(II) and 48(II), respectively, of first wiring members 47(I) and 48(I). Hence, the bare portions may not be coated with the coating member. In addition, since insulating and protecting films 50 ensure an insulation property between first wiring members 47(I) and 48(I) and second wiring members 47(II) and 48(II), the bare portions may not be coated with the coating members. As a result, an amount of coating members for the second wiring member is reduced, which is economically advantageous. In addition, a time for a coating process can be reduced, which is preferable.

Figure 14:
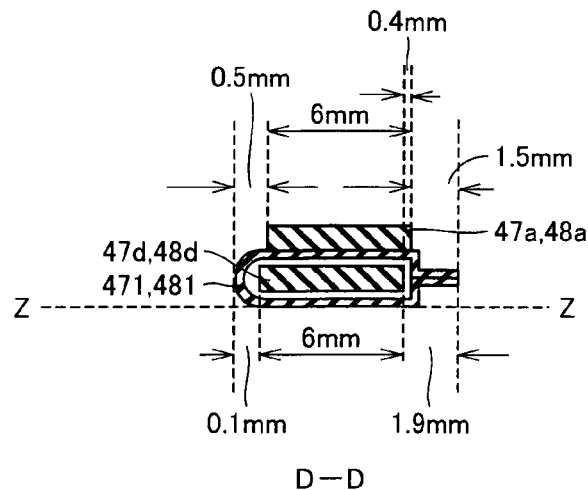
FIG. 14 is a sectional view illustrating a sectional structure taken along a broken line D-D in each of FIGS. 11 and 13.

FIG. 14 is a sectional view taken along a broken line D-D in each of FIGS. 11 and 13. As illustrated in FIG. 14, second wiring members 47(II) and 48(II) are placed immediately on first wiring members 47(I) and 48(I) coated with film-shaped coating members 471 and 481 each folded in two. As illustrated in FIGS. 10 and 12, it is preferable that an adhesive tape 60 or the like is used upon integration of first wiring members 47(I) and 48(I) with second wiring members 47(II) and 48(II). Adhesive tape 60 may be made of a material of a thermoplastic film (ACF: Anisotropic Conductive Film). Preferably, the adhesive tape has a width almost equal to that of insulating and protecting film 50. As for a length of the adhesive tape, it is sufficient that the first wiring member and the second wiring member can be stuck to each other securely. In Embodiment 2, symbols shown in FIGS. 10 to 14, which are not described particularly, denote members denoted by the same symbols in Embodiment 1.

In this embodiment, that is, the first integrated wiring member is a combination of wiring members for a solar cell module, and includes (i) a part configured by a first wiring member, (ii) a part configured by the first wiring member coated with a first coating member, (iii) a part configured by a second wiring member adjoining to the first wiring member coated with the first coating member via an insulating and protecting film, (iv) a part configured by the second wiring member adjoining to the first wiring member coated with the first coating member, (v) a part configured by the second wiring member coated with the second coating member, and (vi) a part configured by the second wiring member.

The aforementioned description is given of the sectional structure of first integrated wiring member 47. It is needless to say that the same holds true for second integrated wiring member 48 and third integrated wiring member 46. In particular, those skilled in the art readily understand that second integrated wiring member 48 and first integrated wiring member 47 are related in structure as mirror image and have a similar structure.

In Embodiment 2, symbols shown in FIGS. 10 to 14, which are not described particularly, denote members and configurations denoted by the same symbols in Embodiment 1. In the integrated wiring member according to Embodiment 2, as described above, the first wiring member and the second wiring member are shielded by the coating members provided on the light receiving face side of the solar cell module when being seen from the light receiving face. Thus, an amount of the coating members for the second wiring member can be reduced, a wiring step can be simplified, and cost reduction can be achieved.

Embodiment 3

Figure 15:
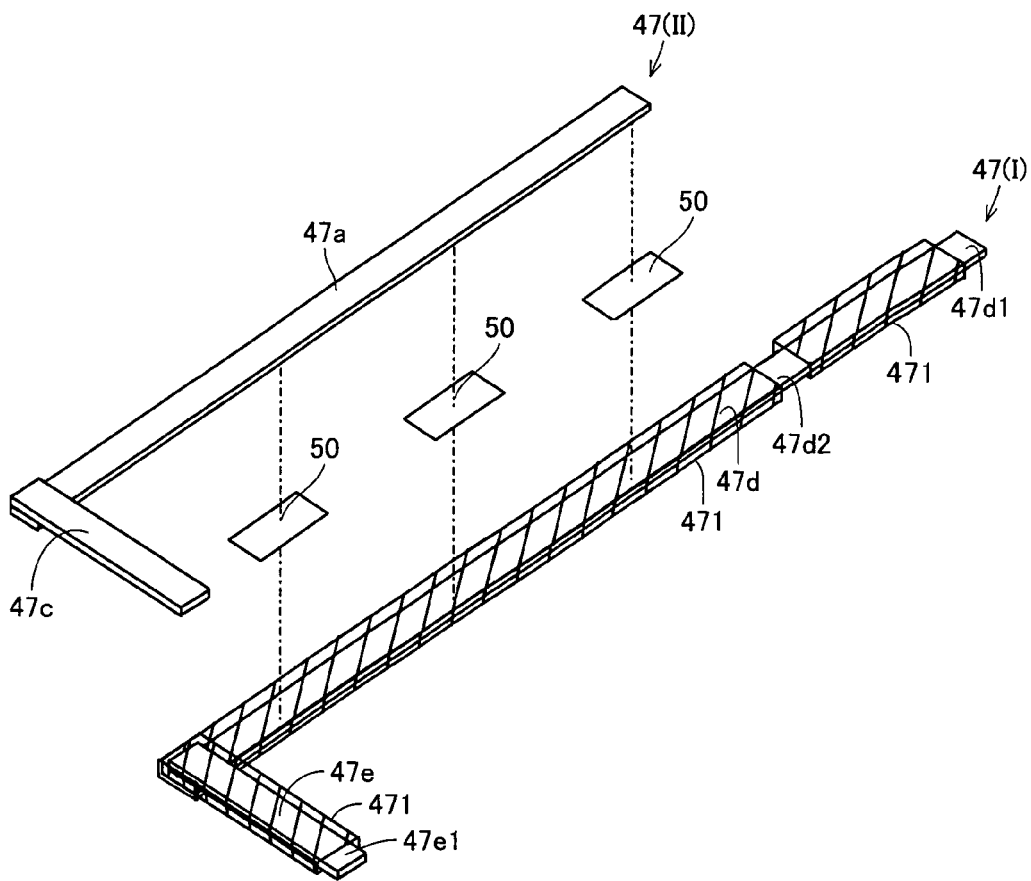
FIG. 15 is a perspective view illustrating one embodiment of the wiring member forming the integrated wiring member according to the present invention.
Figure 16:
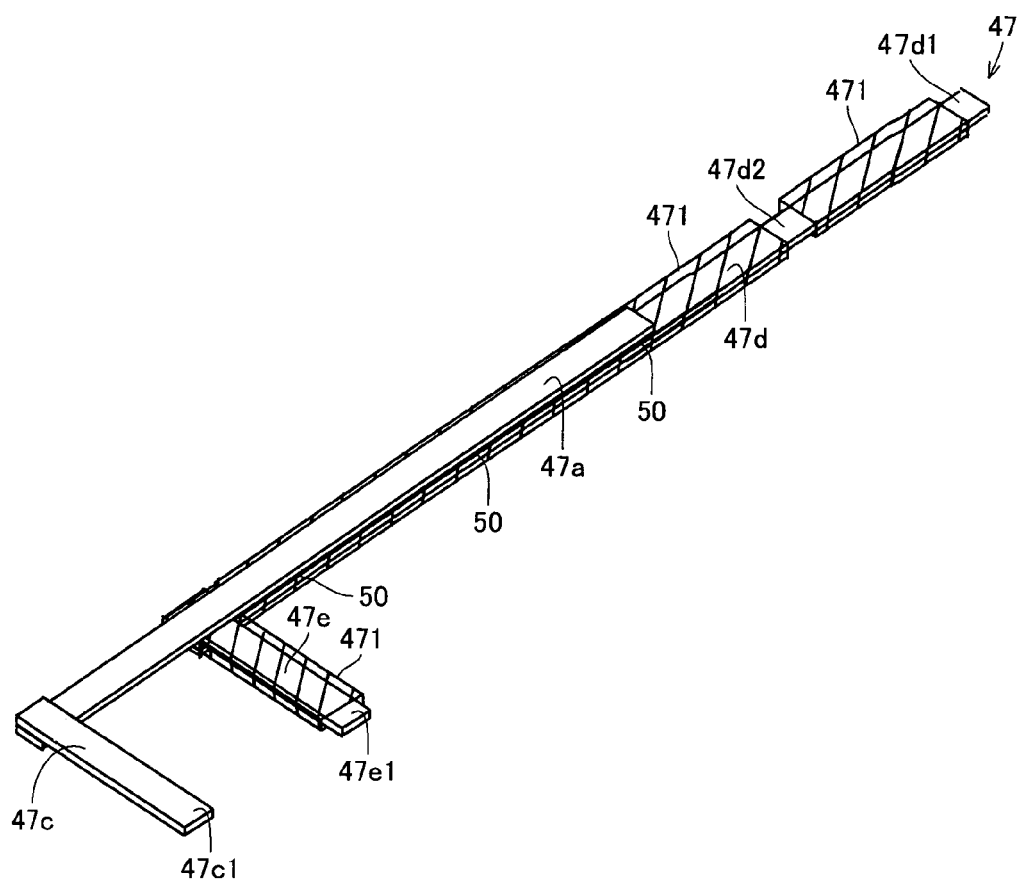
FIG. 16 is a perspective view illustrating one embodiment of the integrated wiring member according to the present invention.
Figure 17:
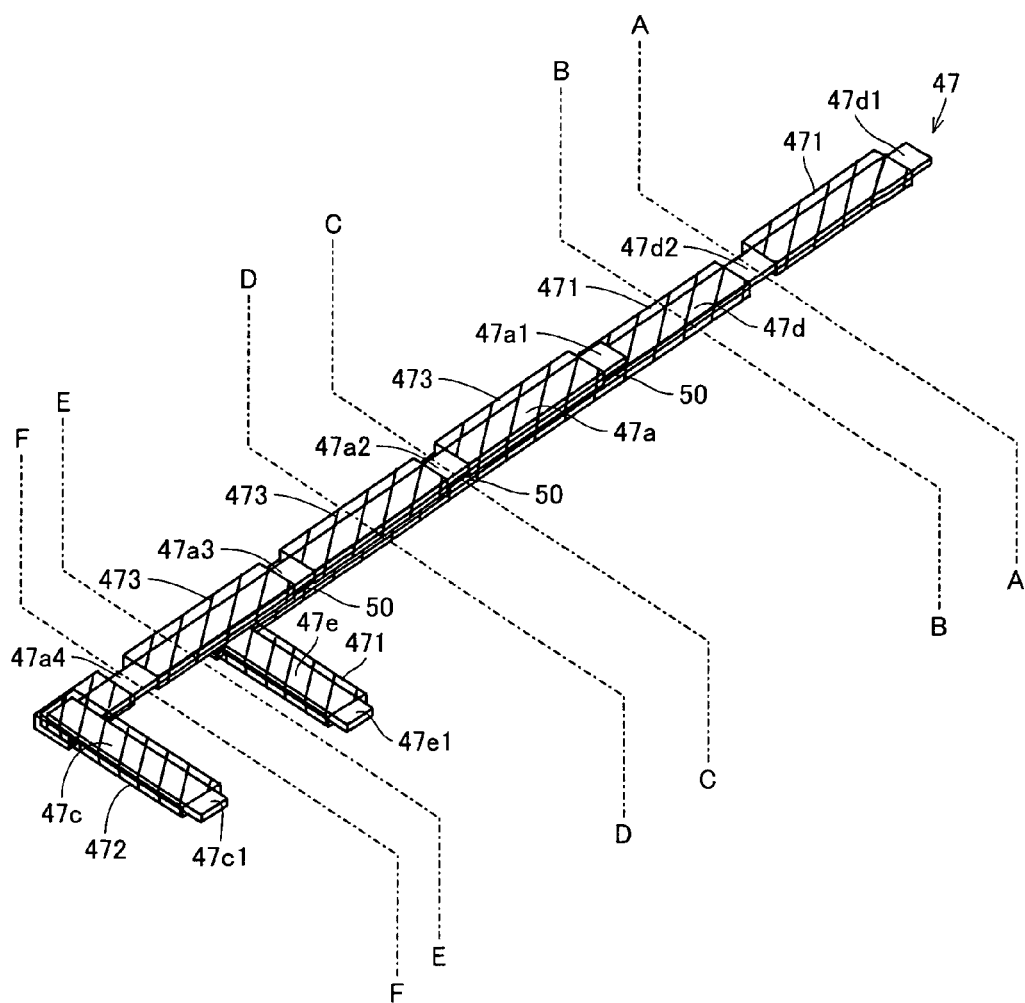
FIG. 17 is a perspective view illustrating one embodiment of the integrated wiring member according to the present invention.

In Embodiment 3, description will be given of still another embodiment of the integrated wiring member according to the present invention. FIG. 15 is a perspective view illustrating first wiring member 47(I) and second wiring member 47(II) separated from each other in first integrated wiring member 47. In FIG. 15, second wiring member 47(II) is coated with no coating member. FIG. 16 is a perspective view illustrating first integrated wiring member 47 in which first wiring member 47(I) and second wiring member 47(II) separated from each other in FIG. 15 are integrated with each other. FIG. 17 is a perspective view illustrating a state where the first integrated wiring member in FIG. 16 is coated with the coating member.

Figure 18:
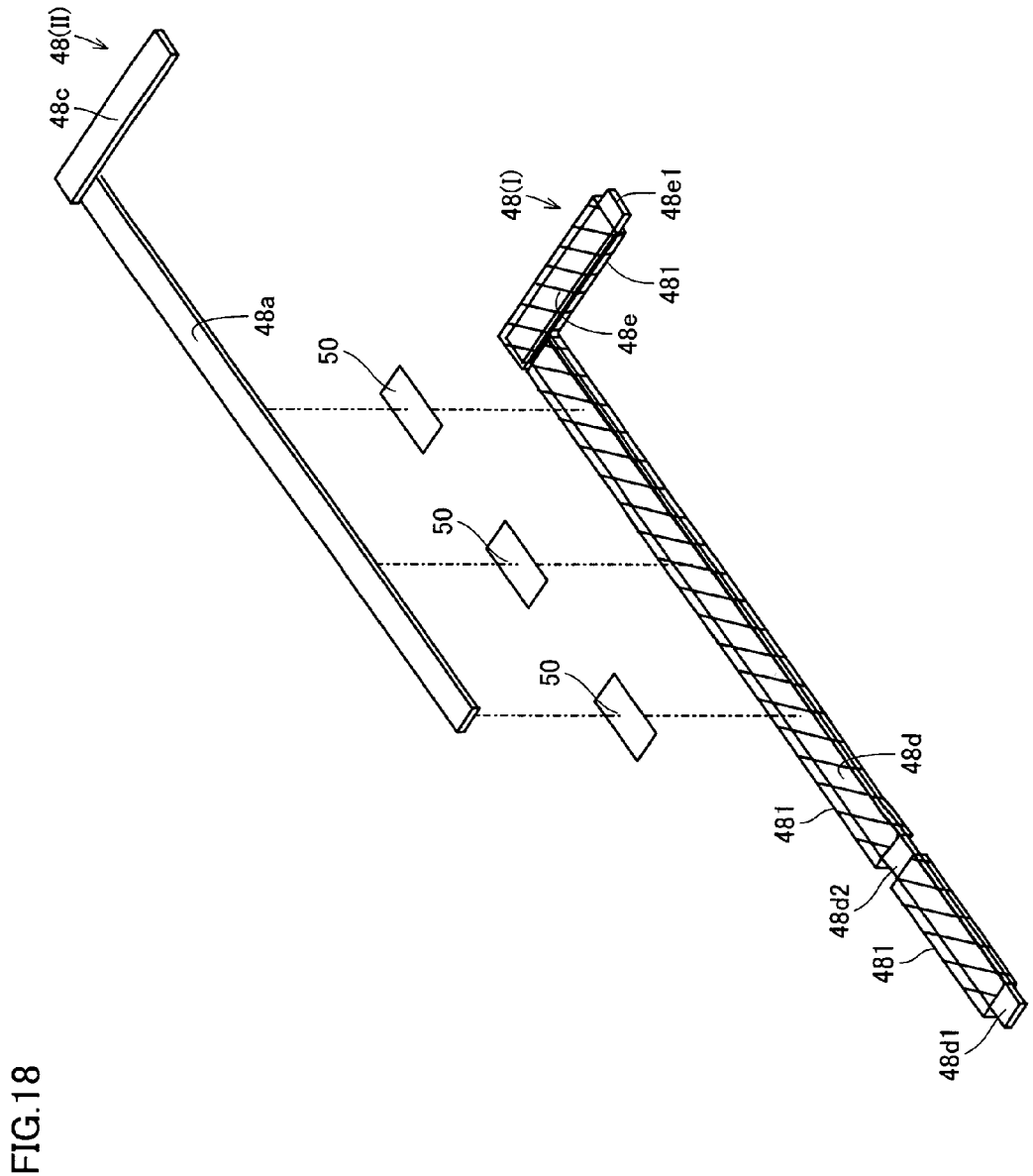
FIG. 18 is a perspective view illustrating one embodiment of the wiring member forming the integrated wiring member according to the present invention.
Figure 19:
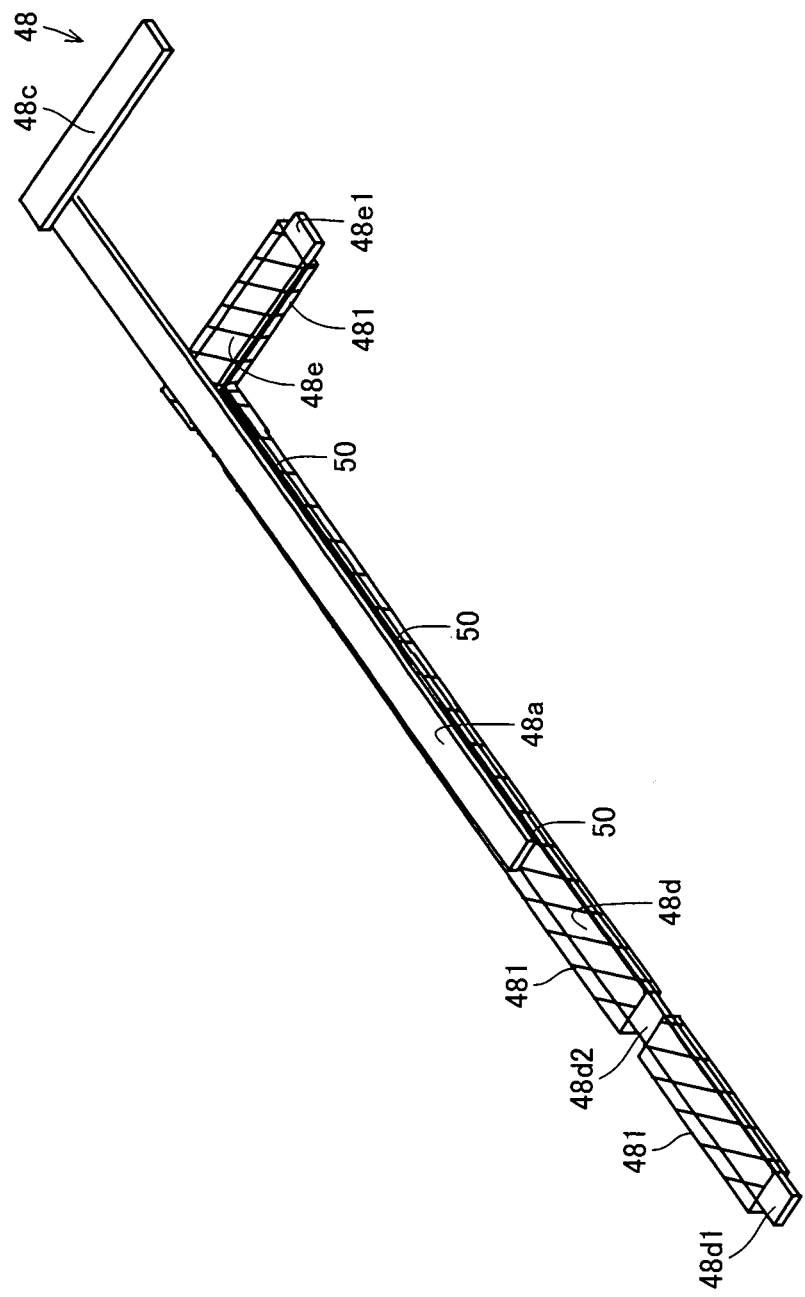
FIG. 19 is a perspective view illustrating one embodiment of the integrated wiring member according to the present invention.
Figure 20:
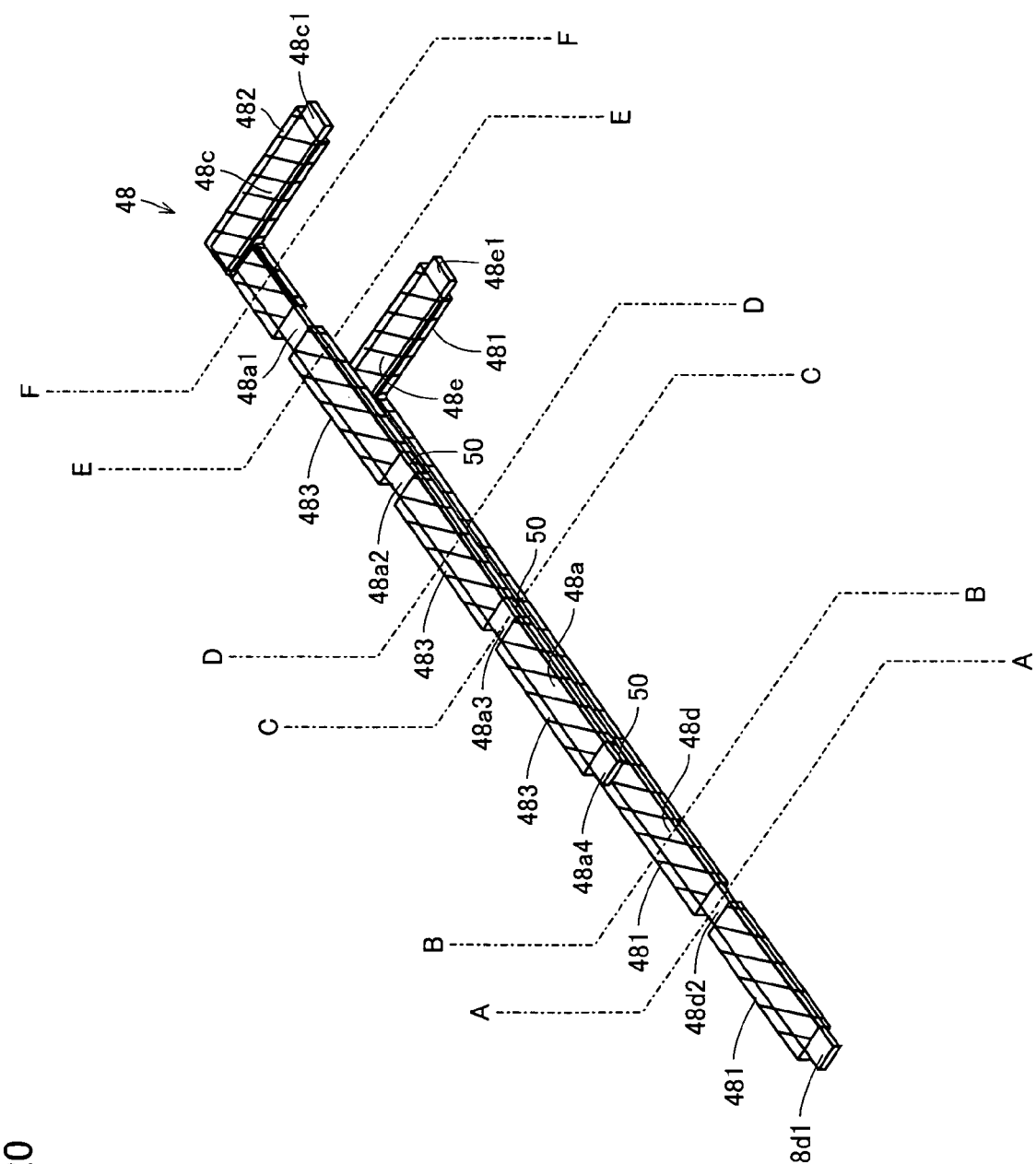
FIG. 20 is a perspective view illustrating one embodiment of the integrated wiring member according to the present invention.

FIG. 18 is a perspective view illustrating first wiring member 48(I) and second wiring member 48(II) separated from each other in second integrated wiring member 48. In FIG. 18, second wiring member 48(II) is coated with no coating member. FIG. 19 is a perspective view illustrating second integrated wiring member 48 in which first wiring member 48(I) and second wiring member 48(II) separated from each other in FIG. 18 are integrated with each other. FIG. 20 is a perspective view illustrating a state where the second integrated wiring member in FIG. 19 is coated with the coating member.

In Embodiment 3, as illustrated in FIGS. 15 and 18, second wiring members 47(II) and 48(II) are not coated with coating members 472 and 482. That is, the second wiring member is coated with no coating member. As illustrated in FIGS. 16 and 19, second wiring members 47(II) and 48(II) coated with no coating members are integrated with first wiring members 47(I) and 48(I). Then, as illustrated in FIGS. 17 and 20, the first wiring members and the second wiring members are collectively and fixedly coated with film-shaped third coating members 473 and 483 each folded in two. As described above, the second wiring member coated with no coating member is integrated with the first wiring member. Then, the second wiring member and the first wiring member are collectively coated with the coating member. As a result, a positional relation between the first wiring member and the second wiring member is secured; thus, positional adjustment of these wiring members can be facilitated. Conventionally, positional adjustment must be performed twice: positional adjustment between the first wiring member and the connecting piece of connecting member 12 attached to the endmost solar cell, and positional adjustment between the second wiring member and the connecting piece of connecting member 12 attached to the endmost solar cell. In contrast, the integrated wiring member according to this embodiment requires only one positional adjustment. Moreover, conventionally, the long wiring member (the first wiring member in this embodiment) is fixed to only the connecting piece of connecting member 12 attached to the endmost solar cell and, therefore, becomes an unstable state upon manufacturing of a solar cell module. Hence, a tape for fixing the wiring member is required. In contrast, the integration in this embodiment makes it possible to entirely fix parallel members to the connecting pieces of connecting members 12 attached to the solar cell. Thus, this embodiment exhibits an advantageous effect that there are no tape and work for fixing wiring members independently.

As illustrated in FIGS. 15 and 18 as well as 17 and 20, insulating and protecting films 50 are interposed between portions serving as bare portions in second wiring members 47(II) and 48(II) and first wiring members 47(I) and 48(I). The reason therefor is as follows: the first wiring member and the second wiring member are prevented from contact with each other, that is, are insulated from each other.

Embodiment 3 is similar to Embodiment 1 except that the first wiring member is integrated with the second wiring member in a state where the first wiring member is coated with no coating member and, then, the first wiring member and the second wiring member are coated with the coating member.

Figure 21:
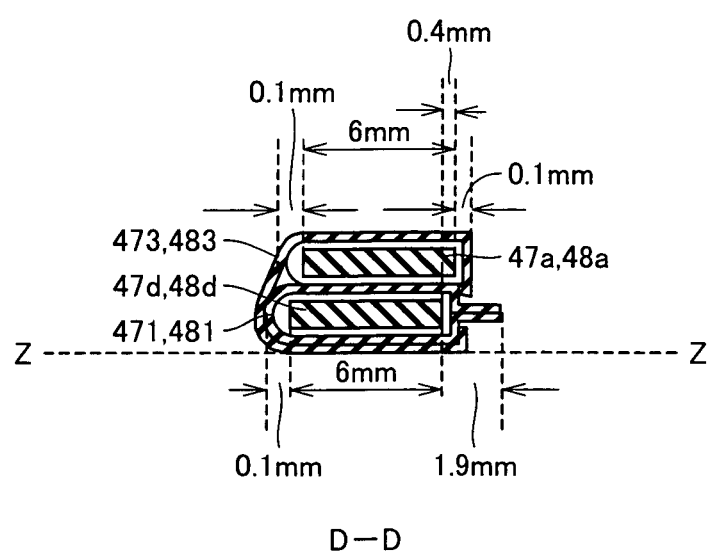
FIG. 21 is a sectional view illustrating a sectional structure taken along a broken line D-D in each of FIGS. 17 and 20.

FIG. 21 illustrates a sectional structure of the integrated wiring member taken along a broken line D-D in each of FIGS. 17 and 20. In Embodiment 3, as described above, if second wiring members 47(II) and 48(II) coated with no coating members are integrated with first wiring members 47(I) and 48(I) and, then, the first wiring member and the second wiring member are integrally coated with the coating member, as illustrated in FIG. 21, second wiring members 47(II) and 48(II) are placed immediately on first wiring members 47(I) and 48(I) coated with film-shaped coating members 471 folded in two and, then, the first wiring member and the second wiring member are coated with film-shaped coating member 473 folded in two.

In this embodiment, that is, the first integrated wiring member is a combination of wiring members for a solar cell module, and includes (i) a part configured by a first wiring member, (ii) a part configured by the first wiring member coated with a first coating member, (iii) a part configured by a second wiring member adjoining to the first wiring member coated with the first coating member via an insulating and protecting film, (iv) a part where the first wiring member coated with the first coating member and the second wiring member adjoining thereto are coated with a third coating member, (v) a part configured by the second wiring member coated with the second coating member, and (vi) a part configured by the second wiring member.

In FIGS. 15 to 21, members denoted by identical symbols, which are not described particularly, mean the same members in Embodiment 1.

As described above, in the integrated wiring member according to Embodiment 3, the first wiring member and the second wiring member which is coated with no coating member are laminated with and fixed to each other by one coating member; thus, a coating step can be simplified and cost reduction can be achieved.

Embodiment 4

Figure 22:
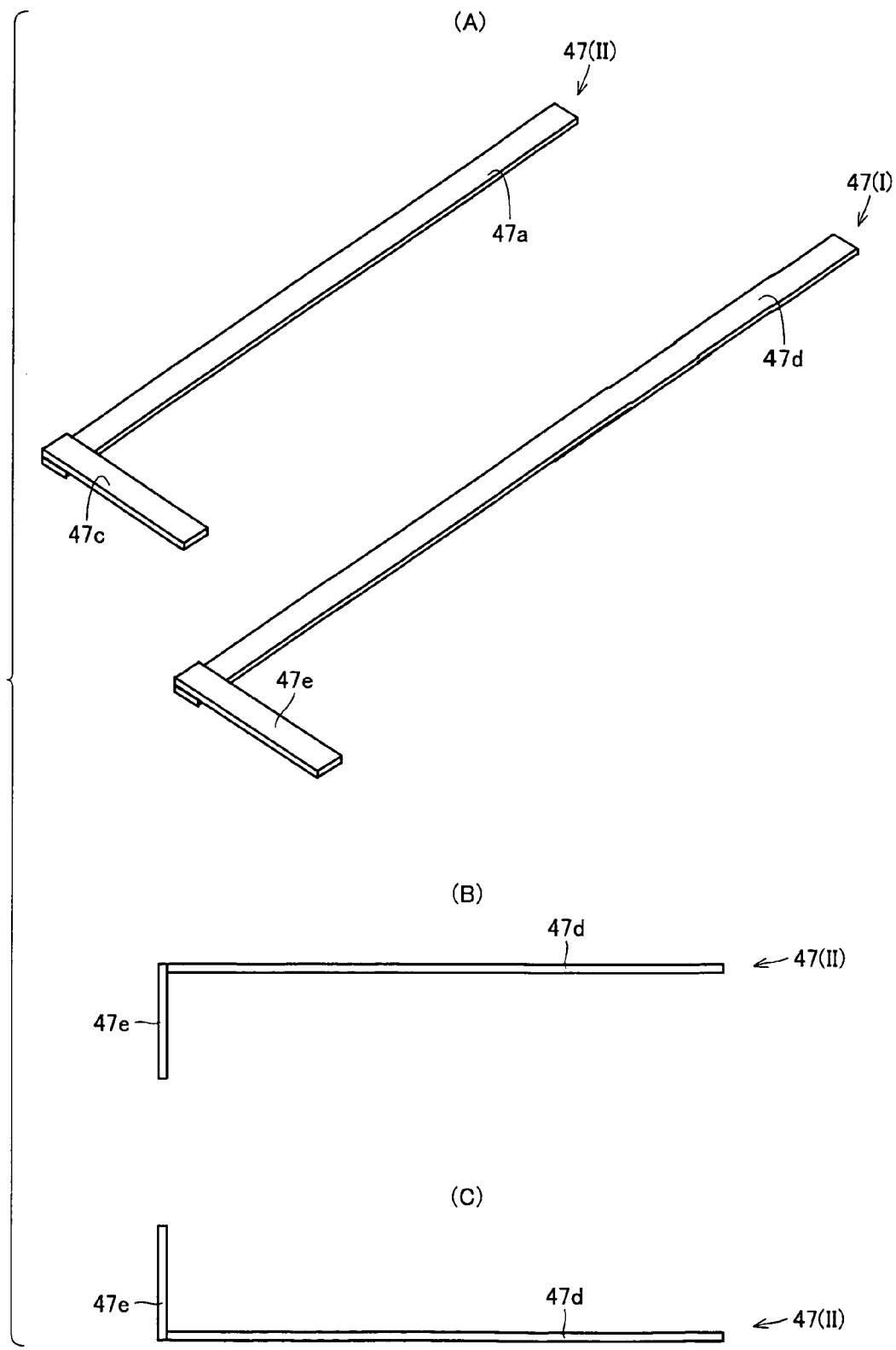
FIG. 22 is a perspective view illustrating one embodiment of the wiring member forming the integrated wiring member according to the present invention.

In Embodiment 4, description will be given of yet another embodiment of the integrated wiring member according to the present invention. In FIG. 22, (A) is a perspective view illustrating a state where first integrated wiring member 47 is divided into first wiring member 47(I) and second wiring member 47(II). As illustrated in (A) of FIG. 22, first and second wiring members 47(I) and 47(II) are not coated with the coating members, respectively. In FIG. 22, (B) is a plan view of first wiring member 47(I) illustrated in (A) of FIG. 22, when being seen from above, that is, a plan view of first wiring member 47(I) when being seen from the bottom face side of the solar cell module. In FIG. 22, (C) is a plan view of first wiring member 47(I) illustrated in (A) of FIG. 22, when being seen from below, that is, a plan view of first wiring member 47(I) when being seen from the light receiving face side of the solar cell module. Also in the following drawings, a relation between the top face and the bottom face of the solar cell module is invariant.

As illustrated in (A) of FIG. 22, first wiring member 47(I) includes coupling piece 47d and protruding piece 47e each having, for example, a width of 6 mm and a thickness of 0.2 mm, and second wiring member 47(II) includes coupling piece 47a and protruding piece 47c each having, for example, a width of 6 mm and a thickness of 0.2 mm. In (A) of FIG. 22, first and second wiring members 47(I) and 47(II) are not coated with the coating members.

Figure 23:
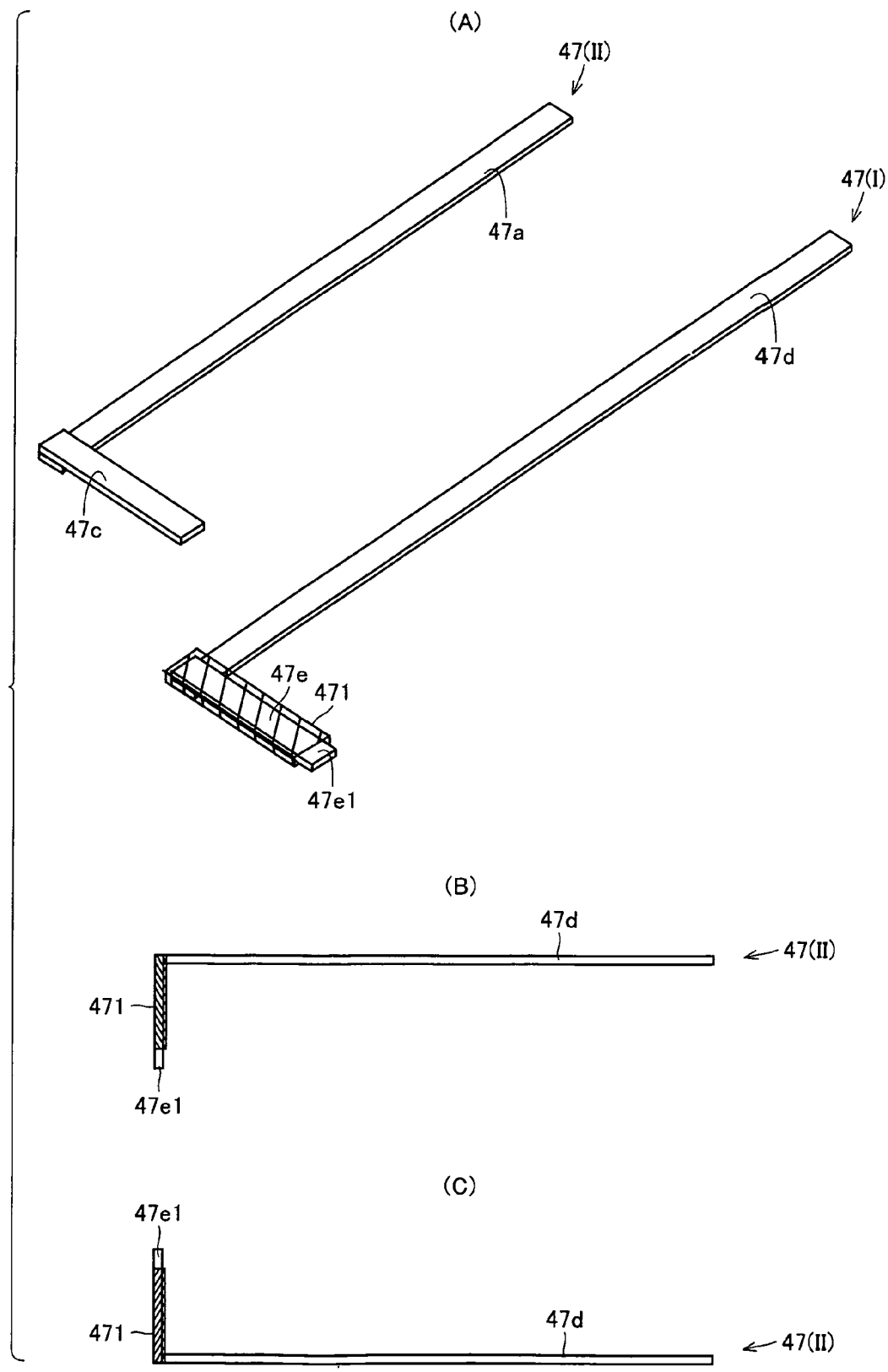
FIG. 23 is a perspective view illustrating one embodiment of the wiring member forming the integrated wiring member according to the present invention.

As illustrated in (A) of FIG. 23, protruding piece 47e of first wiring member 47(I) is entirely coated with coating member 471 except the tip end thereof. Bare portion 47e1, which is the tip end of protruding piece 47e, is thus formed. In Embodiment 4, as a coating method using coating member 471, coating member 471 folded in two is made contact with protruding piece 47e of the almost "L"-shaped wiring member and, then, is aligned with one of edges. Herein, coating member 471 is made contact with and aligned with protruding member 47e in such a manner that the outer side, that is, the left side face of the almost "L"-shaped wiring member illustrated in (B) and (C) of FIG. 23 is fit to the valley portion of folded coating member 471. Thus, a positional reference between the coating member and the wiring member can be readily determined, resulting in improved workability. Further, there is no deviation between protruding piece 47e of first wiring member 47(I) and coating member 471. It is sufficient that a full width at maximum of coating member 471 is designed as a width of a margin based on a width of protruding piece 47e. For example, when protruding piece 47e has a width of 6 mm and a thickness of 0.2 mm, the full width at half maximum is obtained from the following expression: (6.2 mm+margin)× 2+0.2 mm. When each side of the margin is 1 mm, it is sufficient that the width of first coating member 471 before being folded in two is 14.2 mm. In FIG. 23, (B) and (C) are plan views of the first wiring member illustrated in (A) when being viewed from above and below, respectively.

Figure 24:
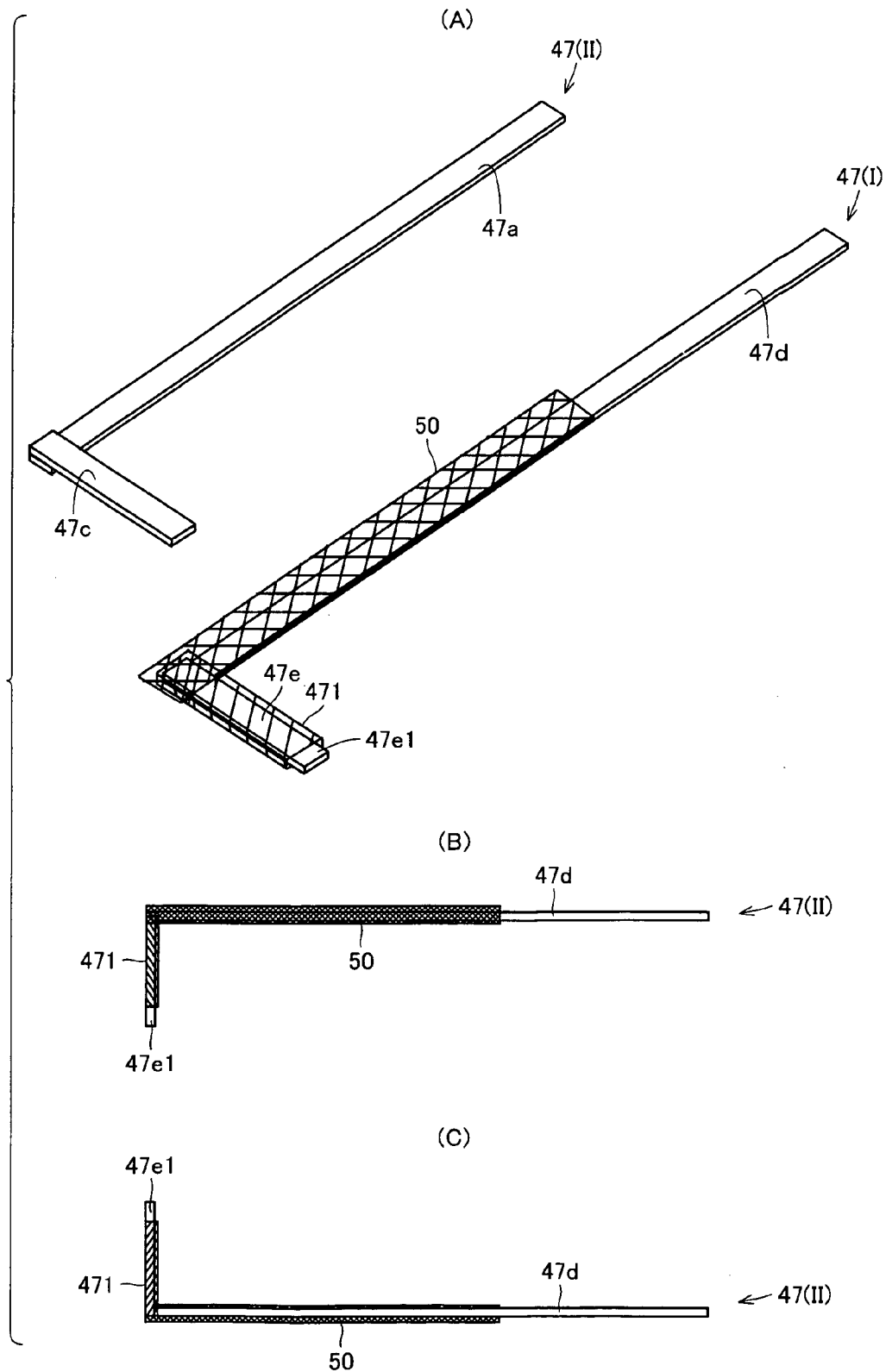
FIG. 24 is a perspective view illustrating one embodiment of the wiring member forming the integrated wiring member according to the present invention.

As illustrated in (A) of FIG. 24, insulating and protecting film 50 wider in width than coupling piece 47d of first wiring member 47(I) is stuck to a part of coupling piece 47d by an adhesive or the like. For example, when coupling piece 47d has a width of 6 mm and a thickness of 0.2 mm, insulating and protecting film 50 preferably has a width of 6.2 mm or more. In this embodiment, for example, insulating and protecting film 50 may have a width of 9 mm. As illustrated in (B) and (C) of FIG. 24, insulating and protecting film 50 is stuck to coupling piece 47d so as to protrude from coupling piece 47d by about 2 mm in a direction opposite to a direction that protruding piece 47e protrudes. That is, insulating and protecting film 50 protrudes from coupling piece 47d by about 1 mm in the direction that protruding piece 47e protrudes. In order to ensure insulation with reliability, preferably, insulating and protecting film 50 protrudes from a corner of the "L" shape formed by protruding piece 47e and coupling piece 47d (side face of protruding piece 47e or tip end face of coupling piece 47d) by about 1 mm.

Figure 25:
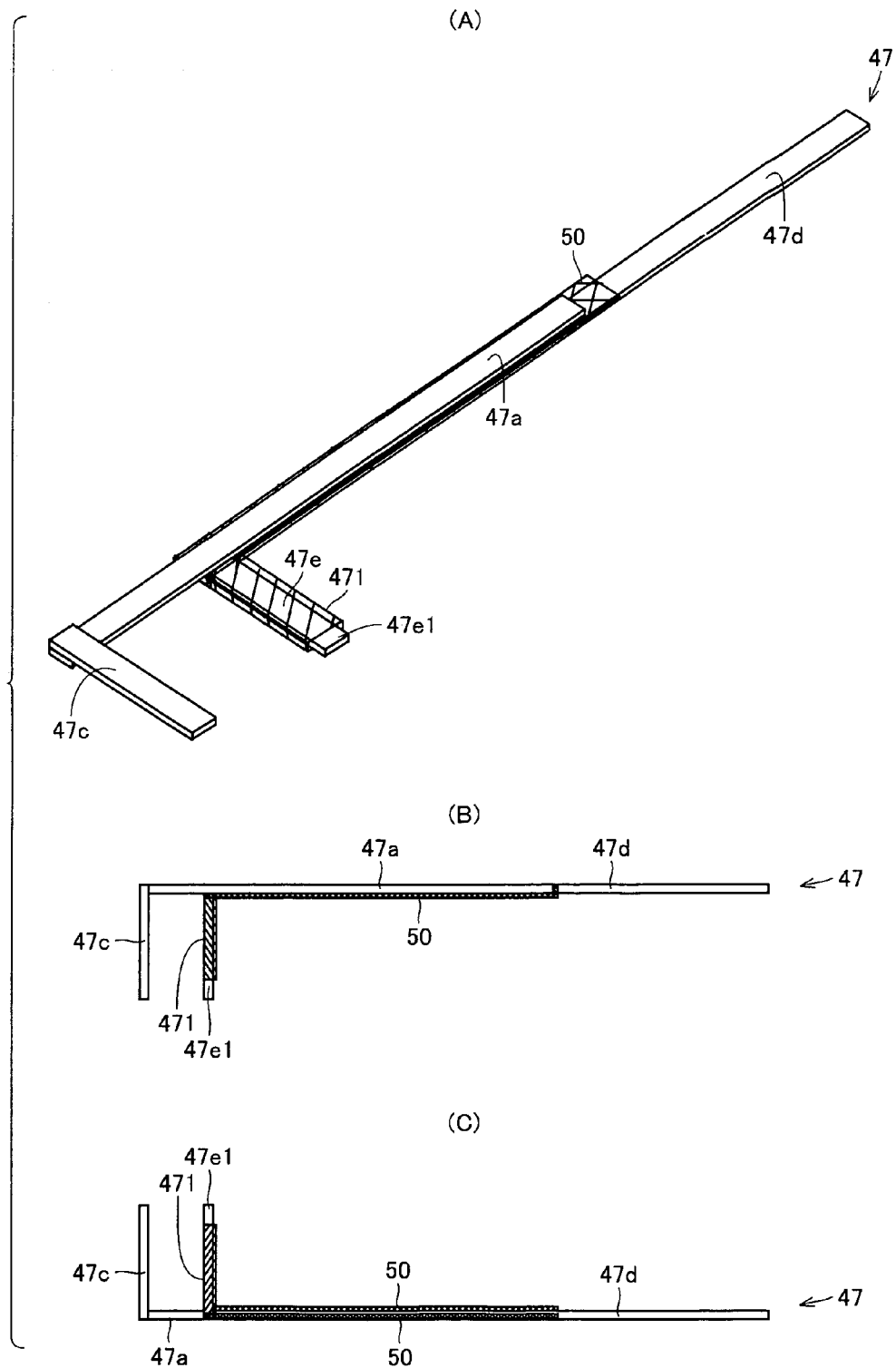
FIG. 25 is a perspective view illustrating one embodiment of the integrated wiring member according to the present invention.

Next, insulating and protecting film 50 is wound around coupling piece 47d in first wiring member 47(I) in the direction opposite to protruding piece 47e in first wiring member 47(I). Then, as illustrated in (A) of FIG. 25, second wiring member 47(II) is stuck to the surface of insulating and protecting film 50 stuck to coupling piece 47d. In FIG. 25, (B) and (C) illustrate states of (A) when being seen from above and below, respectively. As illustrated in (B) and (C) of FIG. 25, insulating and protecting film 50 protrudes from coupling piece 47d by about 1 mm in width in the direction that protruding piece 47e protrudes.

Figure 26:
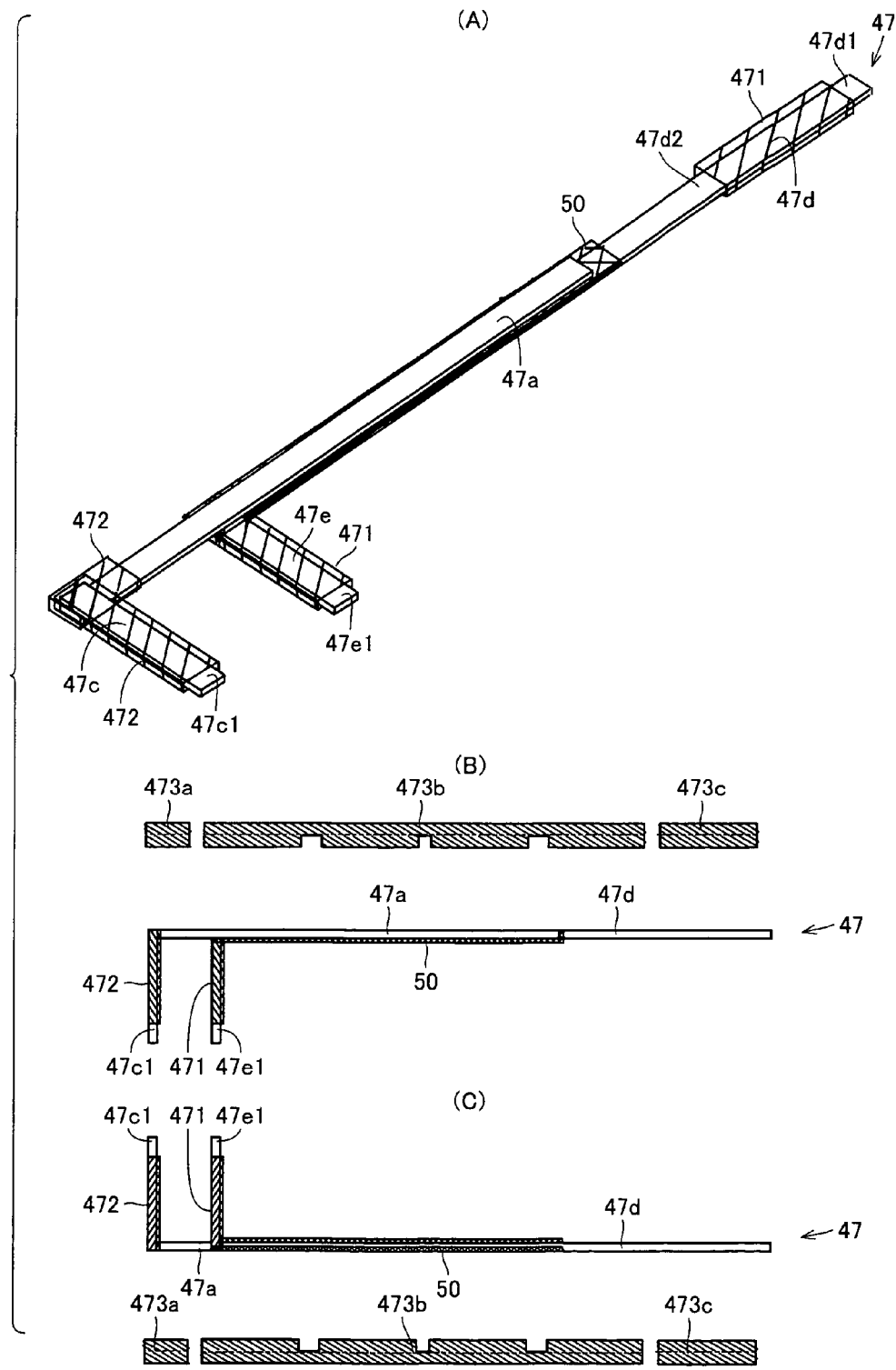
FIG. 26 is a perspective view illustrating one embodiment of the integrated wiring member according to the present invention.

Next, as illustrated in (A) of FIG. 26, protruding piece 47c is entirely coated with coating member 472 except tip end 47c1 of protruding piece 47c of second wiring member 47(II). Herein, the tip end of protruding piece 47c serves as bare portion 47c1. In Embodiment 4, as in the coating method of protruding piece 47e of first wiring member 47(I), coating member 472 folded in two is made contact with protruding piece 47c of the almost "L"-shaped wiring member and, then, is aligned with one of edges. Herein, coating member 472 is made contact with and aligned with protruding member 47c in such a manner that the outer side, that is, the left side face of the almost "L"-shaped wiring member illustrated in (B) and (C) of FIG. 26 is fit to the valley portion of folded coating member 472. Thus, a positional reference between the coating member and the wiring member can be readily determined, resulting in improved workability. Further, there is no deviation between protruding piece 47c of second wiring member 47(II) and coating member 472. It is sufficient that a full width at maximum of coating member 47c is designed as a width of a margin based on a width of protruding piece 47c. For example, when protruding piece 47c has a width of 6 mm and a thickness of 0.2 mm, the full width at half maximum is obtained from the following expression: (6.2 mm+margin)× 2+0.2 mm. When each side of the margin is 1 mm, it is sufficient that the width of coating member 472 before being folded in two is 14.2 mm. In FIG. 26, (B) and (C) are plan views of the first and second wiring members, coated with coating member 473, illustrated in (A) when being viewed from above and below, respectively.

Thereafter, as illustrated in (B) and (C) of FIG. 26, first wiring member 47(I), insulating and protecting film 50 and second wiring member 47(II) are collectively integrated with each other as illustrated in (A) of FIG. 26 in such a manner that coating member 473 (473a, 473b, 473c) is folded in two along a broken line and, then, first wiring member 47(I) and second wiring member 47(II) are coated with coating member 473. Herein, coating member 473 is formed so as to be opened only at portions 47a1, 47a2 and 47a3 to be connected by soldering to wires 12 which will be led out from the cell. Further, a face opposite to the soldered connection portion, that is, a portion of first wiring member 47(I) corresponding to the opening of second wiring member 47(II) is coated with the third coating member (see (B) and (C) of FIG. 26). That is, as illustrated in (C) of FIG. 27, a region from the light receiving face of the solar cell module to first wiring member 47(I) is coated with and shielded by the coating member. In (B) of FIG. 27, portion 47a4 to be connected by soldering to wire 12, which will be led out from the cell, is formed between coating members 473b and 473a. Further, portion 47d2 to be connected by soldering to wire 12, which will be led out from the cell, is formed between coating members 473a and 473c. Moreover, the first wiring member 47(I) is coated with coating member 473c so as to form bare portion 47d1 corresponding to the tip end of protruding piece 47d.

Figure 27:
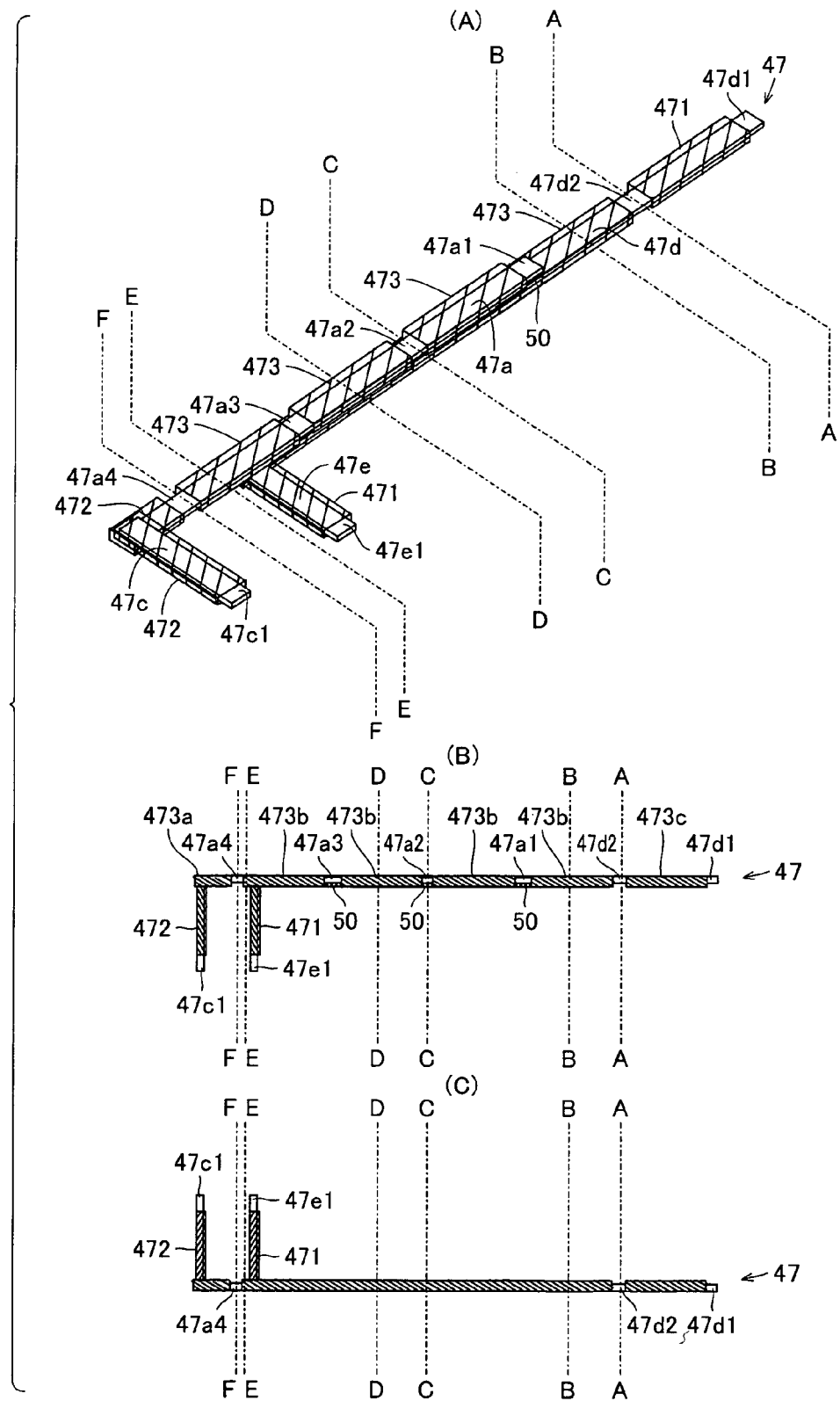
FIG. 27 is a perspective view illustrating one embodiment of the integrated wiring member according to the present invention.
Figure 28:
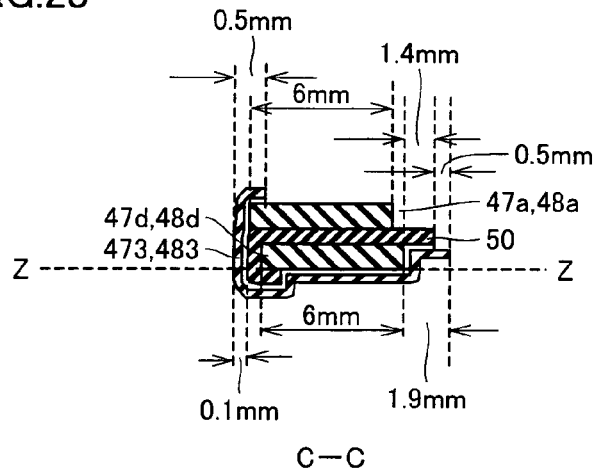
FIG. 28 is a sectional view illustrating a sectional structure taken along a broken line C-C in FIG. 27.

FIG. 28 is a sectional view illustrating a sectional structure taken along a broken line C-C in each of (A) to (C) of FIG. 27. As illustrated in FIG. 28, coupling piece 47d of first wiring member 47(I) is coated with film-shaped insulating and protecting film 50 with high heat-resistant property, which is folded in two, and coupling piece 47a of second wiring member 47(II) is placed immediately on insulating and protecting film 50. Further, coupling piece 47d of first wiring member 47(I), insulating and protecting film 50, and coupling piece 47a of second wiring member 47(II) are collectively coated with film-shaped coating member 473 folded in two.

As illustrated in FIG. 28, a distance between the outer tip end on the folded side of coating member 473 and the bare portion of coupling piece 47a of second wiring member 47(II) is 0.5 mm. A distance between the tip end, opposite to the folded side, of coating member 473 and the tip end of insulating and protecting film 50 in an identical direction is 0.5 mm. A distance between the tip end of insulating and protecting film 50 and the tip end of coupling piece 47d of first wiring member 47(I) in an identical direction is 1.4 mm. In addition, each of coupling piece 47d of first wiring member 47(I) and coupling piece 47a of second wiring member 47(II) has a width of 6 mm, and the end face on the folded side of insulating and protecting film 50 is overlaid on the tip end of coupling piece 47d of first wiring member 47(I) in an identical direction in a state where the end face on the folded side of insulating and protecting film 50 is flush with the tip end of coupling piece 47d of first wiring member 47(I). Therefore, coupling piece 47d of first wiring member 47(I) is displaced from coupling piece 47a of second wiring member 47(II) by the thickness of insulating and protecting film 50.

When being seen from the light receiving face side of the solar cell module (when being seen from below in FIG. 28), insulating and protecting film 50 is shielded by coating member 473, that is, coupling piece 47a of second wiring member 47(II) is located inward with respect to the width of insulating and protecting film 50. The numerical values described herein are merely examples, and the present invention is not limited thereto as long as the aforementioned states are kept. Thus, if insulating and protecting film 50 with high heat-resistant property is different in color from coating member 471 and back cover 17, the aforementioned feature is effectively exerted; thus, an aesthetic sense of the surface of the solar cell module can be maintained.

Figure 29:
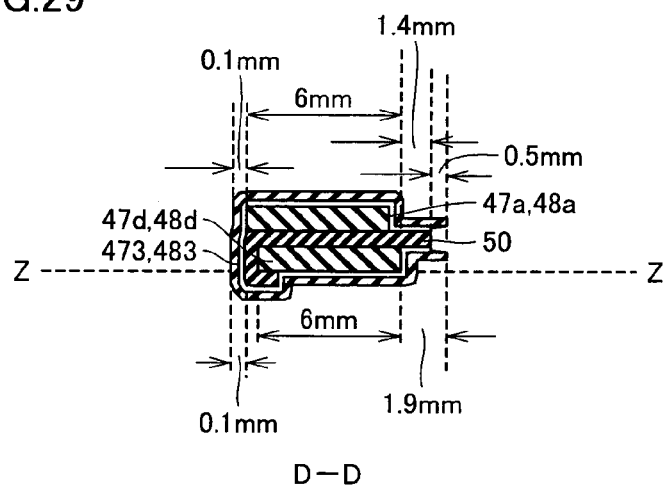
FIG. 29 is a sectional view illustrating a sectional structure taken along a broken line D-D in FIG. 27.

FIG. 29 is a sectional view illustrating a sectional structure taken along a broken line D-D in each of (A) to (C) of FIG. 27. The structure illustrated in FIG. 29 is similar to that illustrated in FIG. 28 except that there is no bare portion of coupling piece 47a of second wiring member 47(II). As described above, coupling piece 47d of first wiring member 47(I), insulating and protecting film 50, and coupling piece 47a of second wiring member 47(II) can be integrated with and fixed to each other in such a manner that these components are coated with coating member 473 folded in two.

Film-shaped insulating and protecting film 50 with high heat-resistant property is folded back along first wiring member 47(I), so that a creepage distance between first wiring member 47(I) and second wiring member 47(II) can be ensured; thus, an insulation property can be improved.

Figure 30:
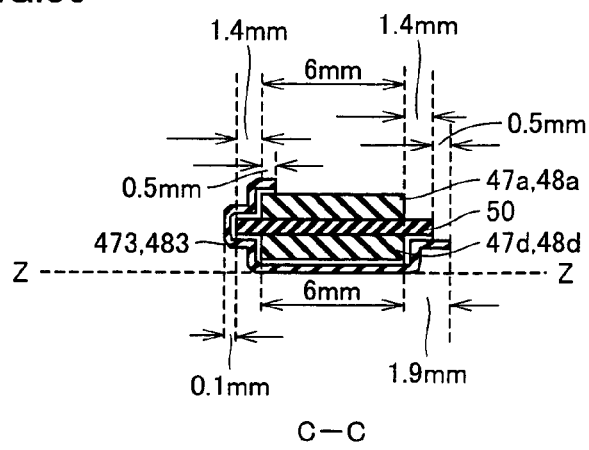
FIG. 30 is a sectional view illustrating an alternative embodiment of FIG. 28.
Figure 31:
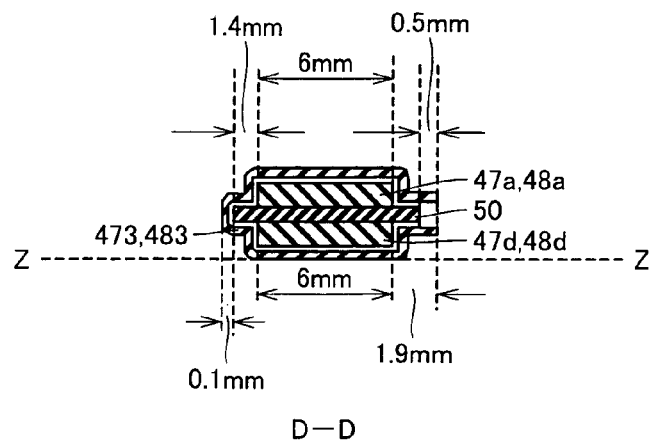
FIG. 31 is a sectional view illustrating an alternative embodiment of FIG. 29.

FIGS. 30 and 31 are sectional views each illustrating a case where insulating and protecting film 50 is not folded back along coupling piece 47d of first wiring member 47(I) in FIGS. 28 and 29. The structures illustrated in FIGS. 30 and 31 are similar to those illustrated in FIGS. 28 and 29 except that the end of coupling piece 47d of first wiring member 47(I) and coupling piece 47a of second wiring member 47(II) are placed while being evenly spaced away from the end of insulating and protecting film 50 by, for example, 1.4 mm.

As described above, the end of film-shaped insulating and protecting film 50 with high heat-resistant property is coated while being spaced away from the ends of first and second wiring members 47(I) and 47(II) by a certain distance, so that a creepage distance between first wiring member 47(I) and second wiring member 47(II) can be ensured; thus, an insulation property can be improved.

Figure 32:
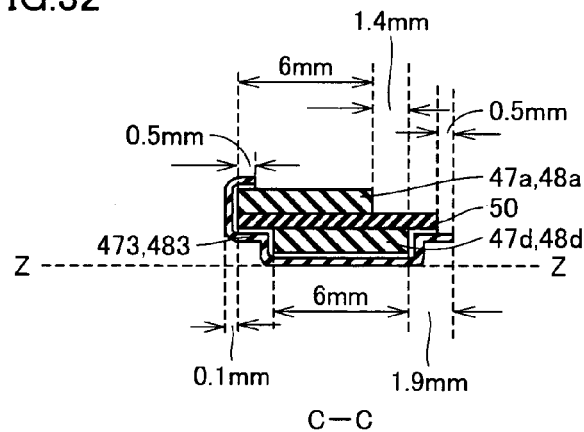
FIG. 32 is a sectional view illustrating an alternative embodiment of FIG. 28.
Figure 33:
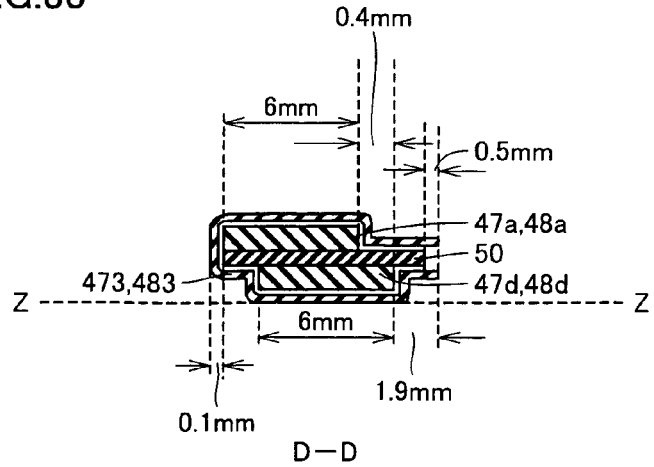
FIG. 33 is a sectional view illustrating an alternative embodiment of FIG. 29.

FIGS. 32 and 33 are sectional views each illustrating a case where insulating and protecting film 50 is not folded back along coupling piece 47d of second wiring member 47(II) in FIGS. 28 and 29. The structures illustrated in FIGS. 32 and 33 are similar to those illustrated in FIGS. 28 and 29 except that one of the ends of insulating and protecting film 50 is overlaid on the tip end of coupling piece 47a of second wiring member 47(II) in such a manner that one of the ends of insulating and protecting film 50 is flush with the tip end of coupling piece 47a of second wiring member 47(II), so that coupling piece 47d of first wiring member 47(I) is displaced from coupling piece 47a of second wiring member 47(II) by, for example, 1.4 mm. With this configuration, as illustrated in FIG. 32, the second wiring member is connected to the connecting piece of connecting member 12 attached to the solar cell; therefore, there is no insulating film on the bottom face of the solar cell module. As a result, wires (conductors) can be prevented from being bared more than necessary; thus, an insulation property from the outside can be improved. In addition, one of the ends of insulating and protecting film 50 is overlaid on the tip end of coupling piece 47a of second wiring member 47(II) in such a manner that one of the ends of insulating and protecting film 50 is flush with the tip end of coupling piece 47a of second wiring member 47(II), so that a creepage distance between first wiring member 47(I) and second wiring member 47(II) on the end face side to be connected to the connecting pieces of connecting members 12 can be ensured; thus, an insulation property can be improved.

As illustrated in FIG. 33, the portion, which is not connected to the connecting piece of connecting member 12, can be brought into no contact with (can be insulated from) the outside as much as possible. The top face of the solar cell module is coated with a film (insulating film) having a color identical to that of the back film; therefore, an aesthetic sense can be improved.

Figure 34:
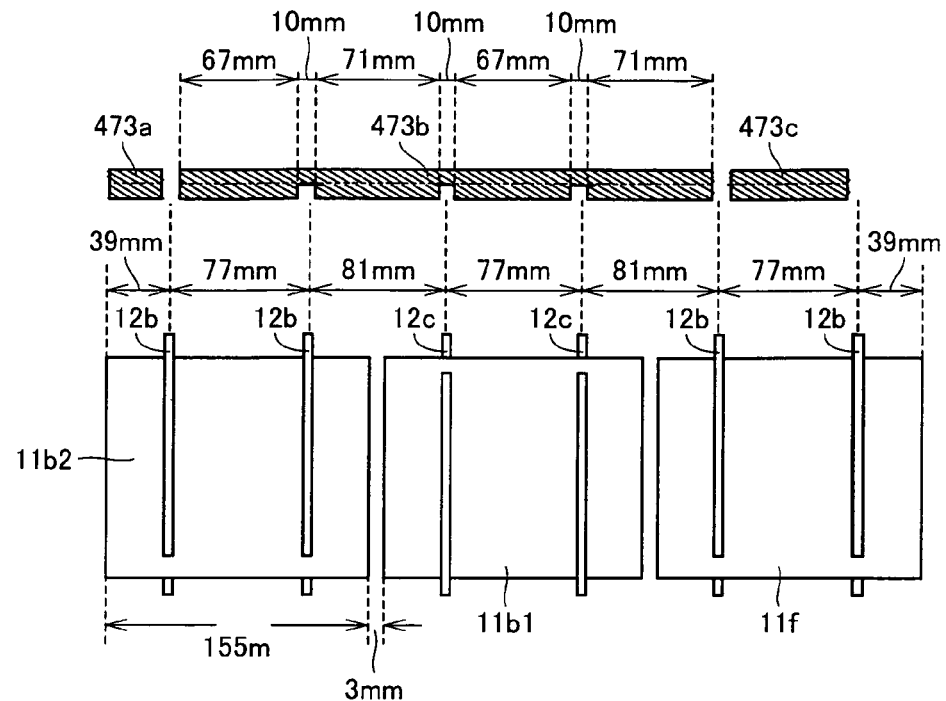
FIG. 34 is a plan view illustrating a relative positional relation between a coating member in a first integrated wiring member and a solar cell.
Figure 35:
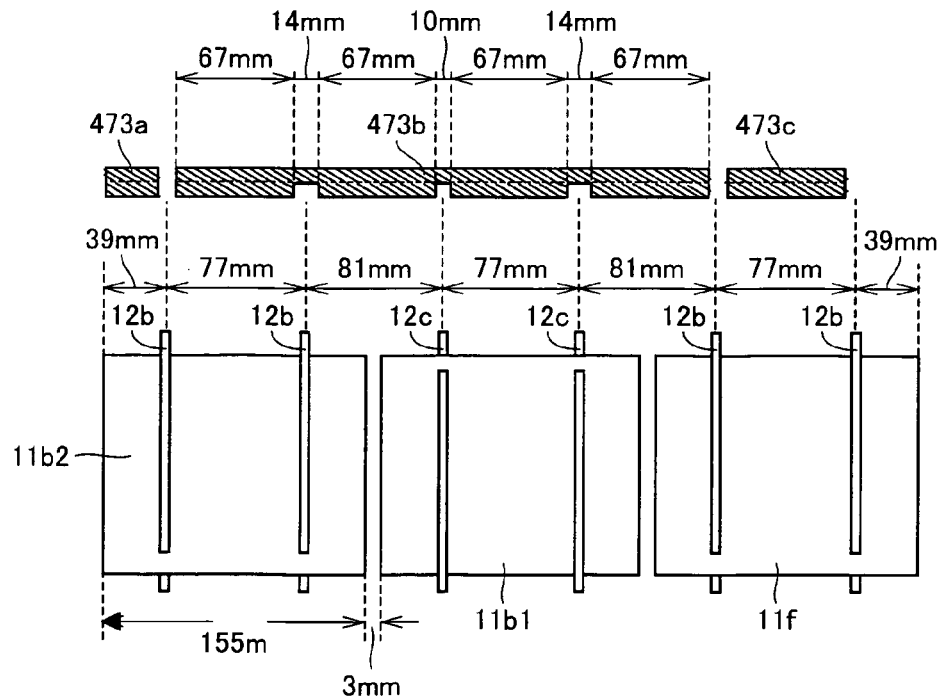
FIG. 35 is a plan view illustrating a relative positional relation between the coating member in the first integrated wiring member and the solar cell.

In Embodiment 4, FIGS. 34 and 35 illustrate a relative positional relation between coating member 473 of first integrated wiring member 47 and the solar cell. Cells 11f, 11b1 and 11b2 each having a size of 155 mm-square are arranged at a space of 3 mm. Connecting pieces 12b or 12c attached to cells 11f, 11b1 and 11b2 are connected to first integrated wiring member 47; however, the connection portions are determined by openings of coating member 473. As described above, the cell unit including cell 11f, the cell unit including cell 11b1 and the cell unit including cell 11b2 are manufactured in accordance with single specifications; therefore, a pitch between connecting pieces 12b is equal to a pitch between connecting pieces 12c. In Embodiment 4, for example, such a pitch may be set at 77 mm. In contrast, a pitch between connecting piece 12b and connecting piece 12c in the adjoining cell units is 81 mm including a space between cell units of 3 mm. If the opening of coating member 473, which is the connection portion of connecting pieces 12b and 12c, must have a thickness of 10 mm, a layout illustrated in FIG. 34 is required. As an alternative embodiment of FIG. 34, as illustrated in FIG. 35, two types of openings of coating member 473, that is, openings each having a width of 10 mm and openings each having a width of 14 mm are prepared so as to achieve a symmetrical form, so that coating member 473 for first integrated wiring member 47 can be used for second integrated wiring member 48, leading to preferable results that manufacturing cost can be reduced and manufacturing efficiency can be enhanced.

That is, in this embodiment, the first integrated wiring member is a combination of wiring members for a solar cell module, and includes (i) a part configured by a first wiring member, (ii) a part configured by a third coating member coated with the first coating member, (iii) a part where a second wiring member adjoining to the first wiring member via an insulating and protecting film is at least partly coated with the third coating member, (iv) a part where the second member adjoining to the first wiring member via the insulating and protecting film is coated with the third coating member, (v) a part configured by the second coating member coated with the third coating member, (vi) a part coated with the second coating member, (vii) a part configured by the second wiring member coated with the second coating member, and (viii) a part configured by the first wiring member coated with the first coating member.

On the other hand, in Embodiment 4, the detailed description is given of first integrated wiring member 47 as an example. Since second integrated wiring member 48 and first integrated wiring member 47 are related in structure as mirror image, the structure thereof can be readily understood in consideration of the mirror pattern of first integrated wiring member 47. Accordingly, those skilled in the art can readily understand that second integrated wiring member 48 is similar in structure to first integrated wiring member 47.

Figure 38:
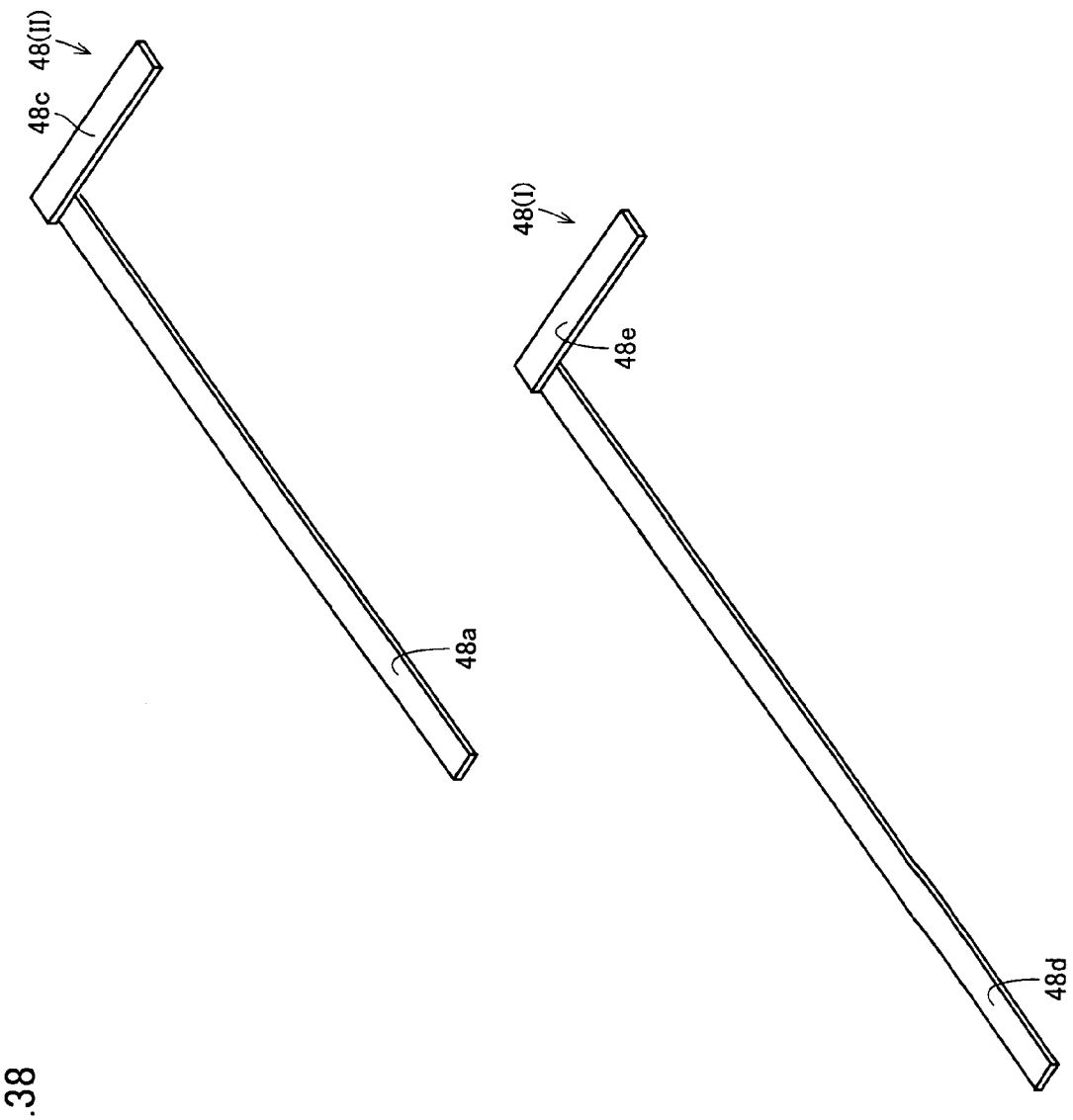
FIG. 38 is a perspective view illustrating one embodiment of the integrated wiring member according to the present invention.
Figure 39:
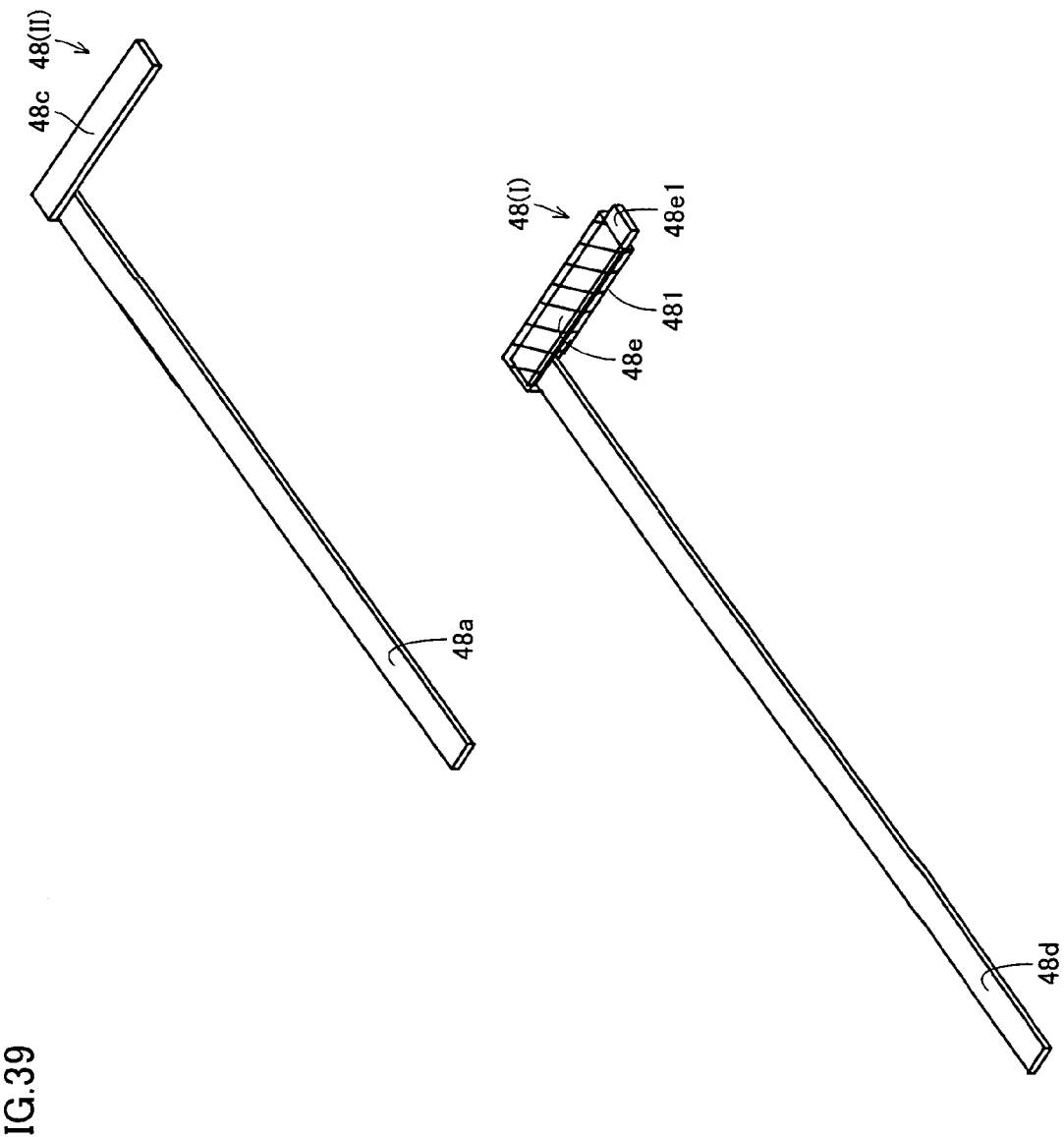
FIG. 39 is a perspective view illustrating one embodiment of the integrated wiring member according to the present invention.
Figure 40:
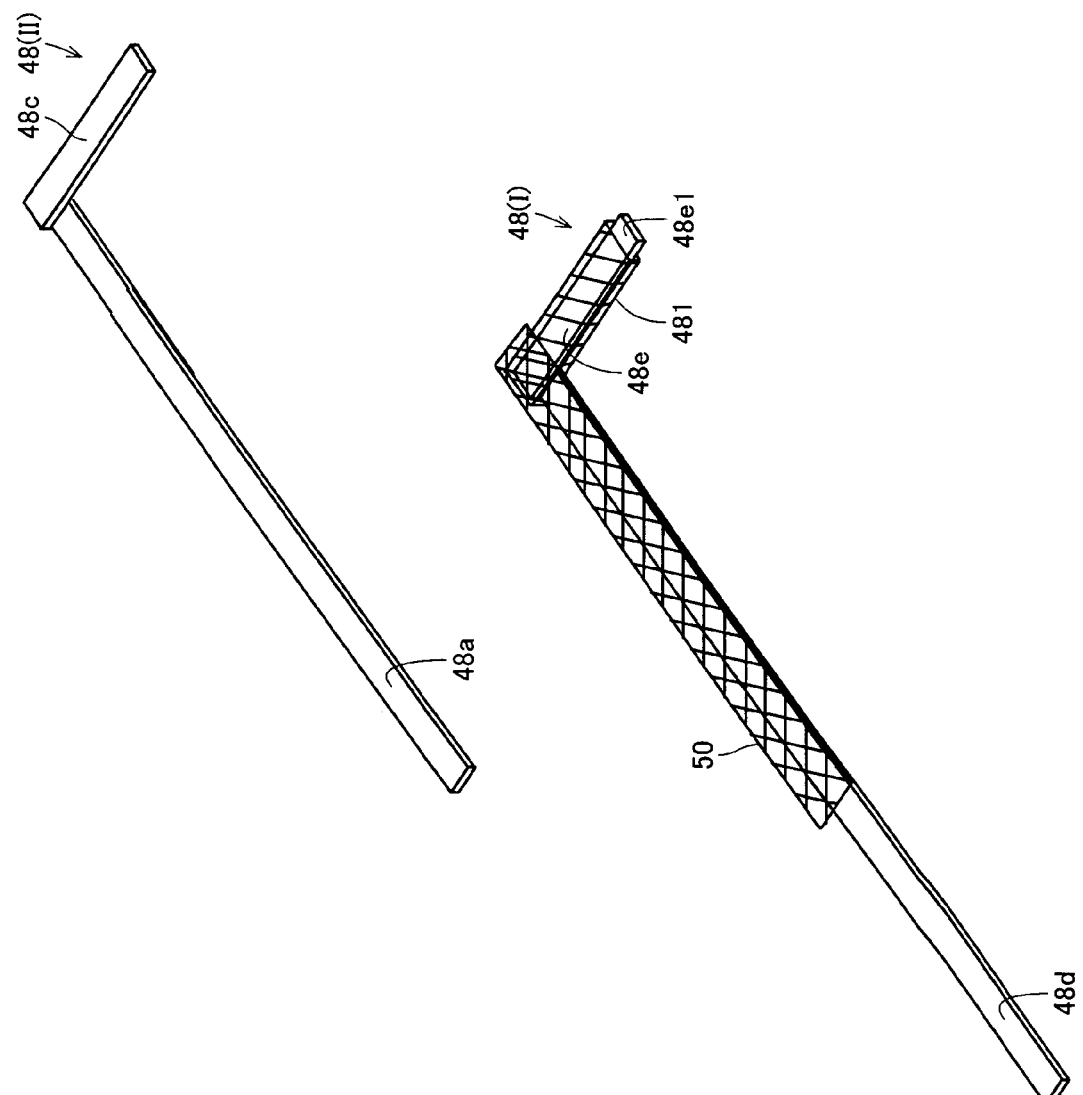
FIG. 40 is a perspective view illustrating one embodiment of the integrated wiring member according to the present invention.
Figure 41:
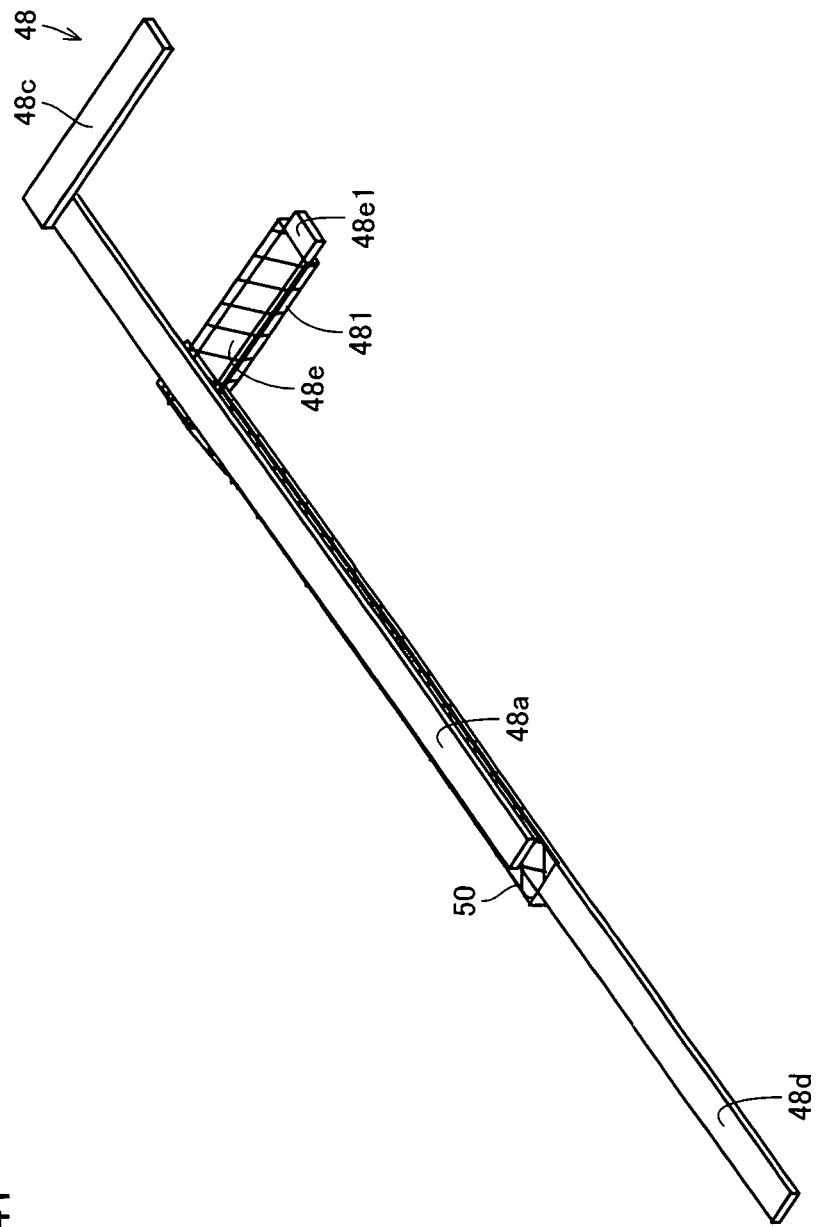
FIG. 41 is a perspective view illustrating one embodiment of the integrated wiring member according to the present invention.
Figure 42:
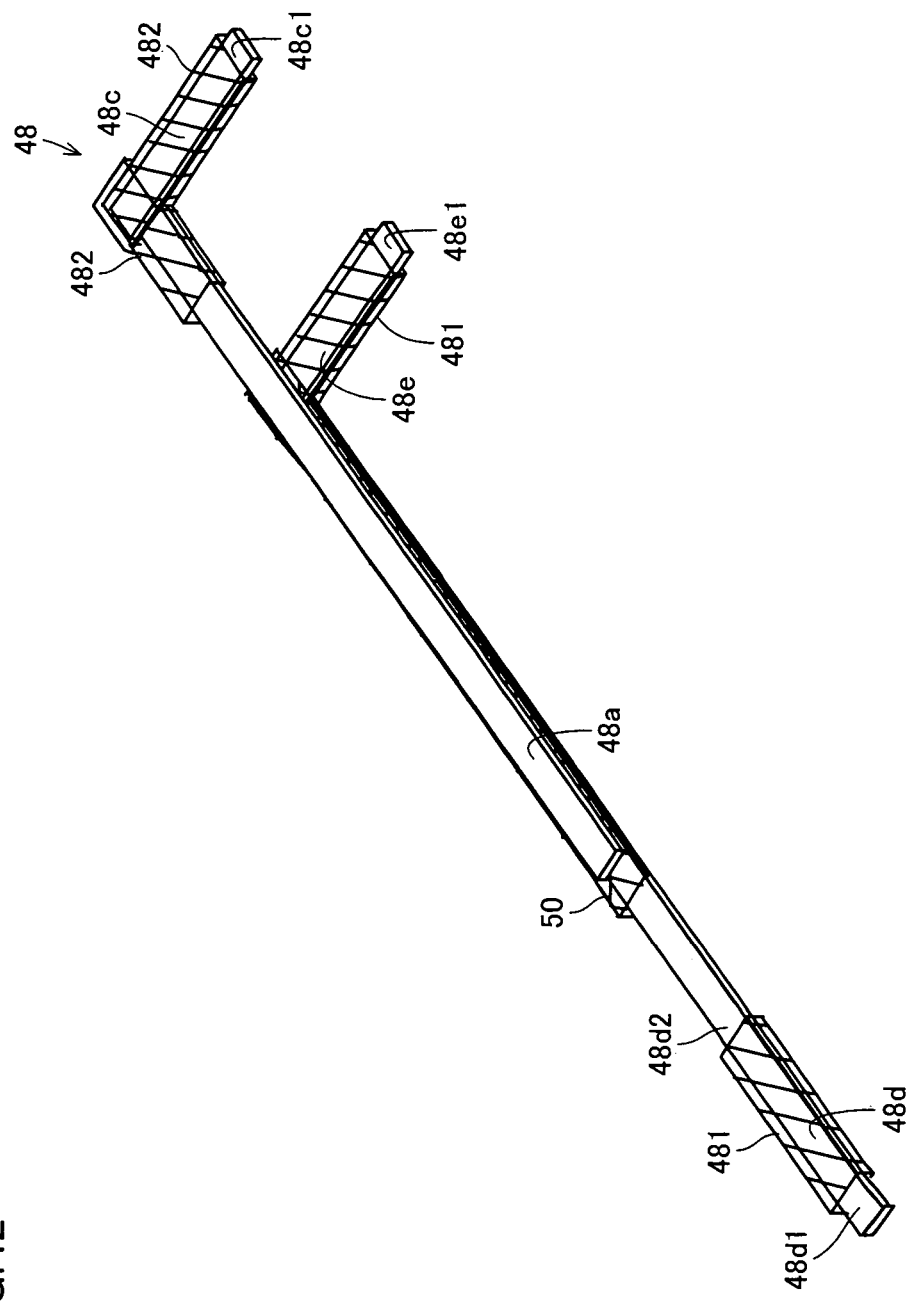
FIG. 42 is a perspective view illustrating one embodiment of the integrated wiring member according to the present invention.
Figure 43:
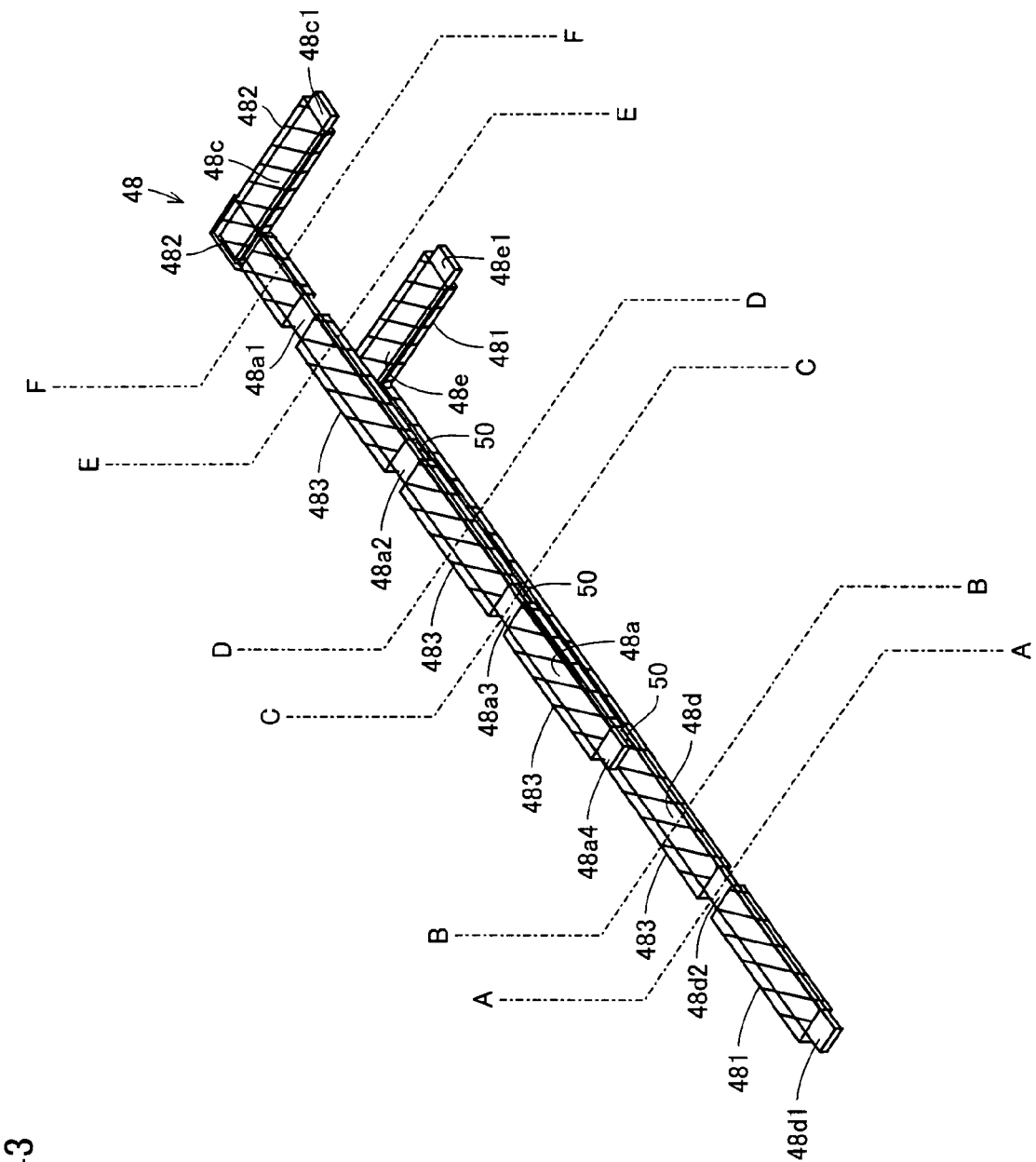
FIG. 43 is a perspective view illustrating one embodiment of the integrated wiring member according to the present invention.
Figure 44:
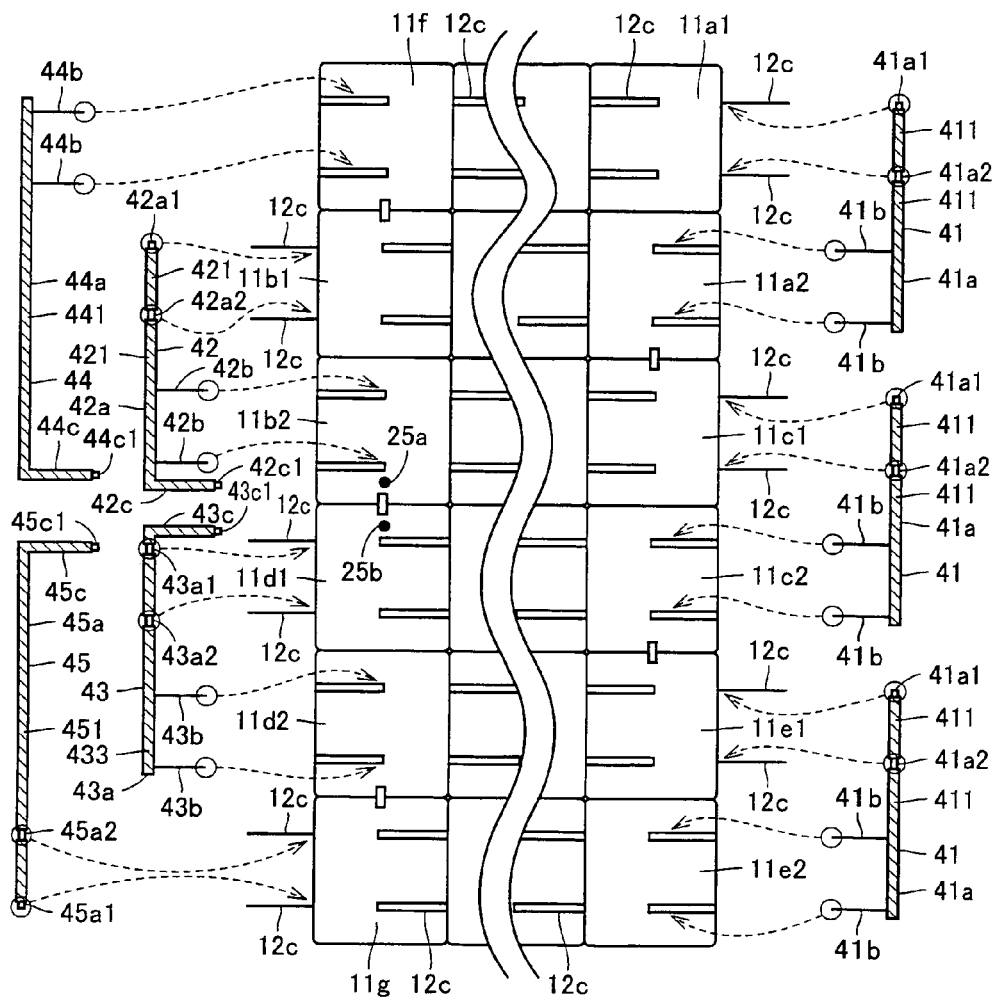
FIG. 44 is a plan view illustrating a matrix portion forming a conventional solar cell module when being seen from below.
Figure 45:
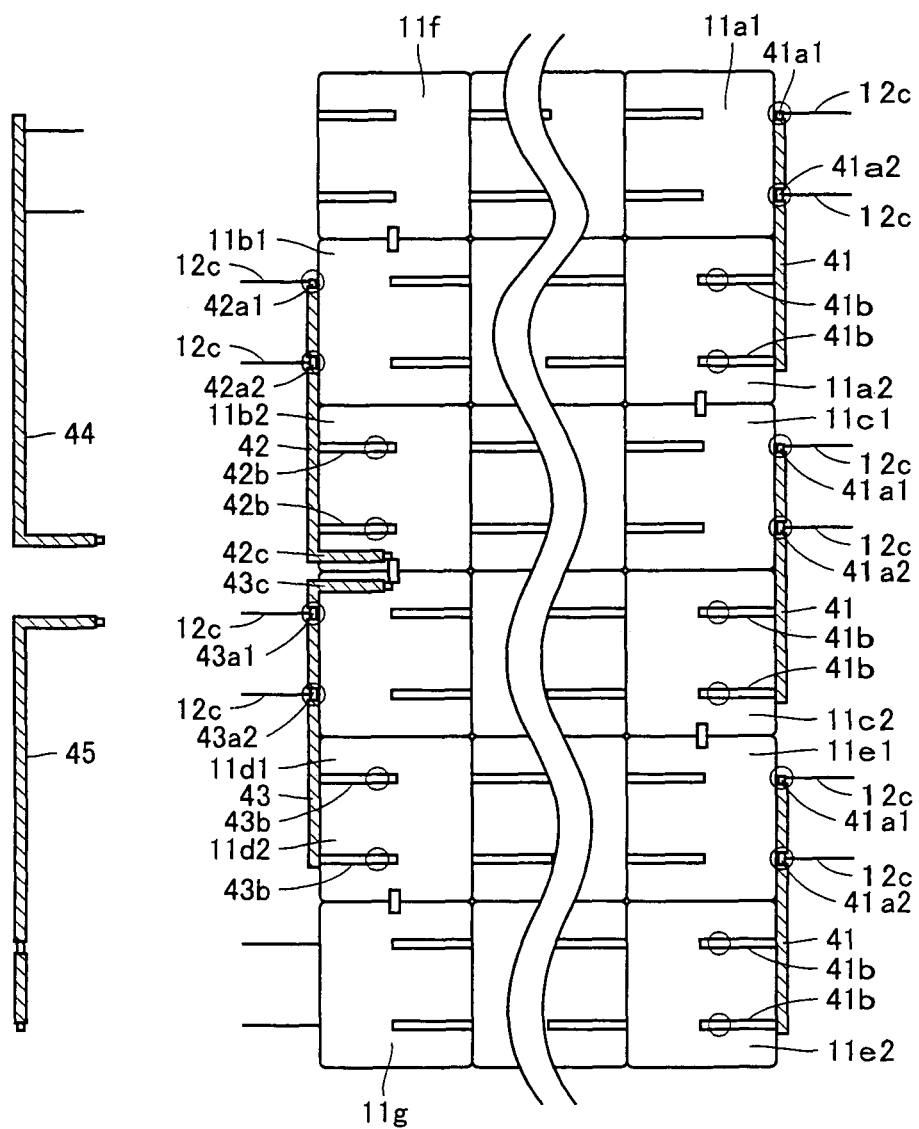
FIG. 45 is a plan view illustrating the matrix portion forming the conventional solar cell module when being seen from below.
Figure 46:
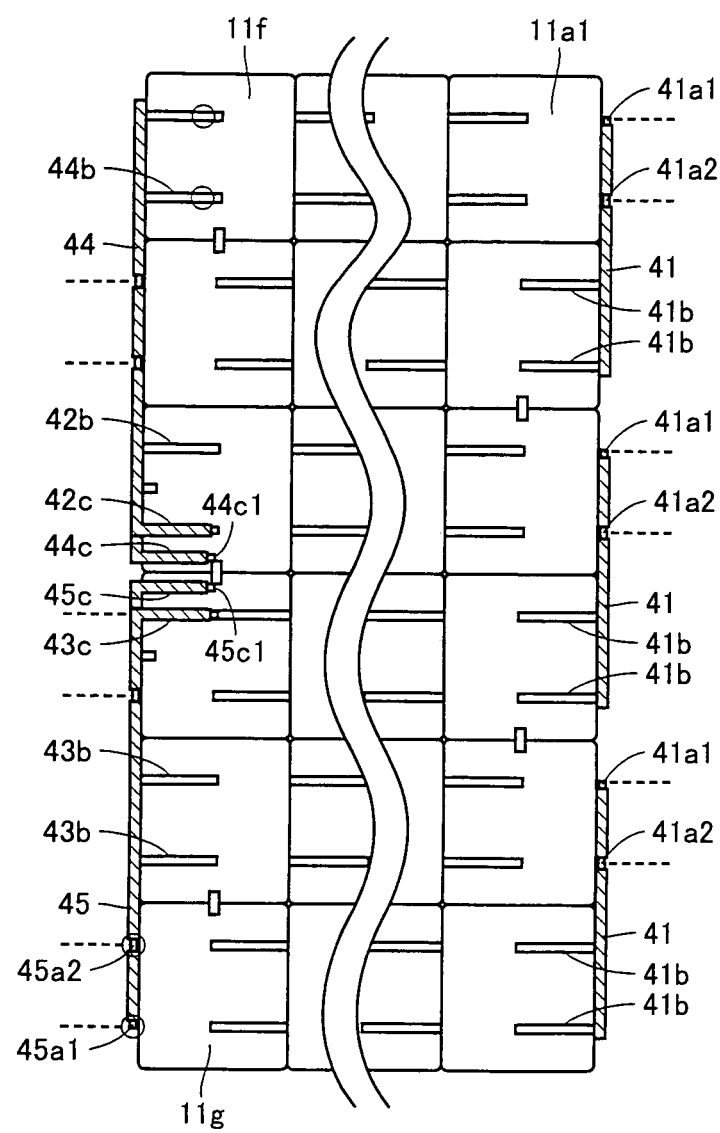
FIG. 46 is a plan view illustrating the matrix portion forming the conventional solar cell module when being seen from below.
Figure 47:
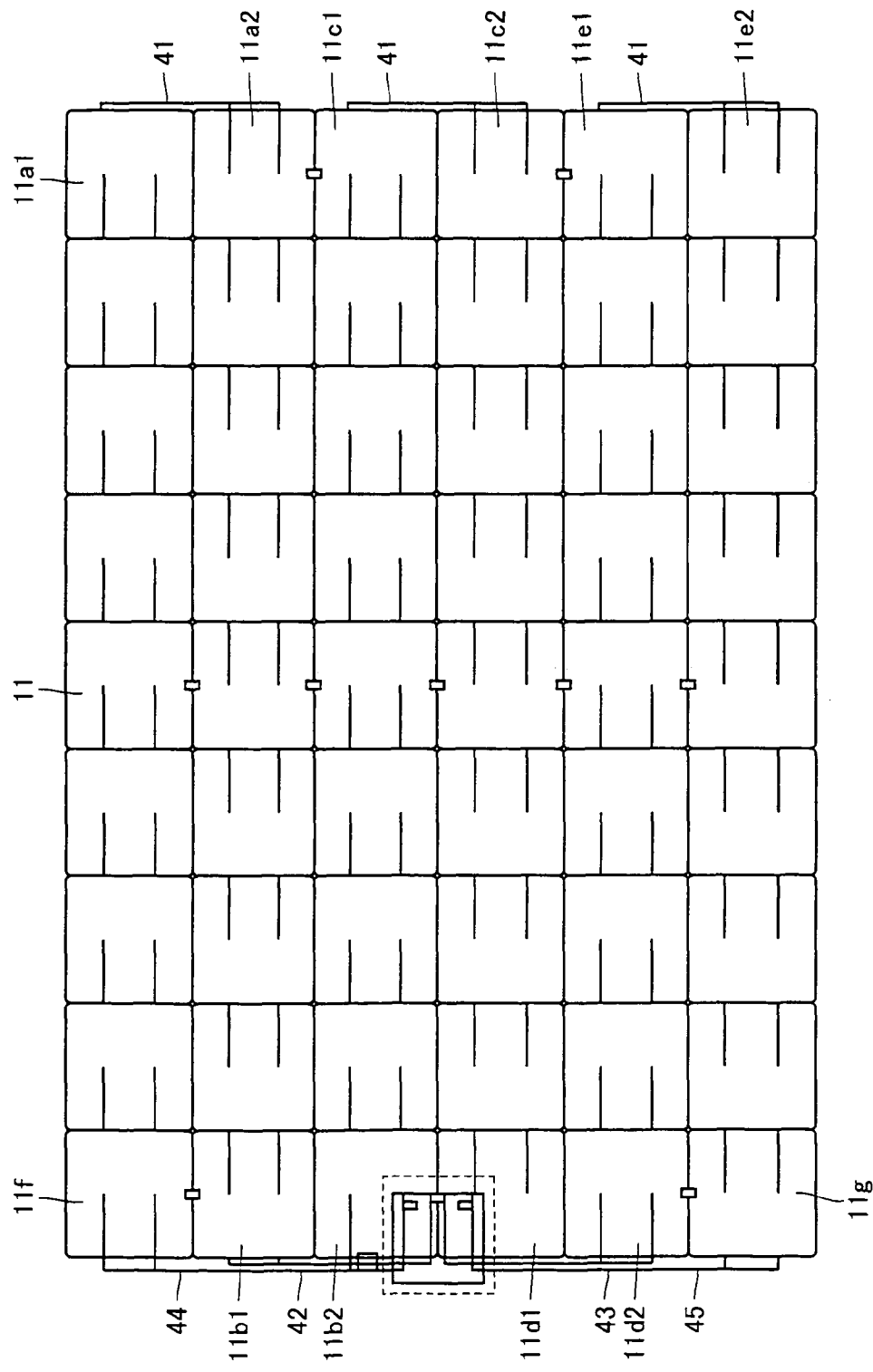
FIG. 47 is a plan view illustrating the matrix portion forming the conventional solar cell module when being seen from below.
Figure 48:
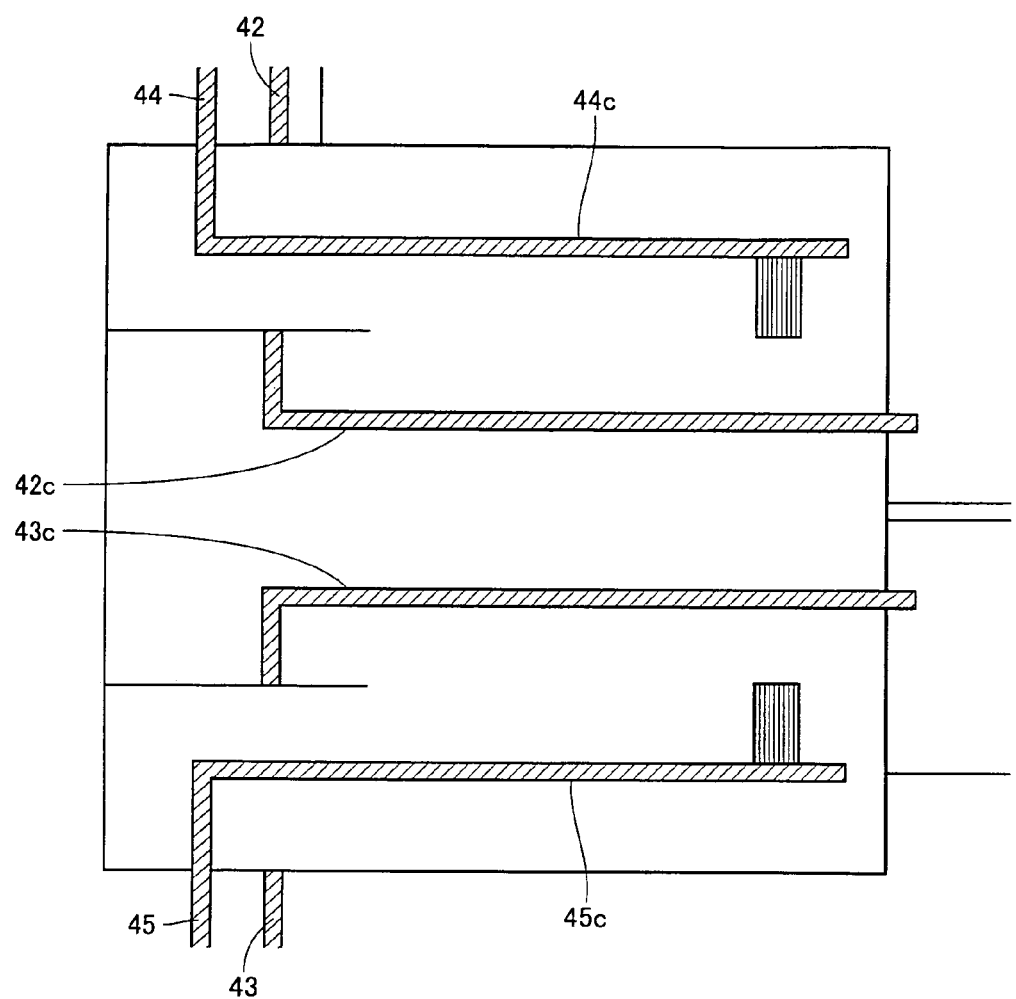
FIG. 48 is a partly enlarged view illustrating a positional relation of wiring members near electrical output extracting ports in the conventional solar cell module.
Figure 49:
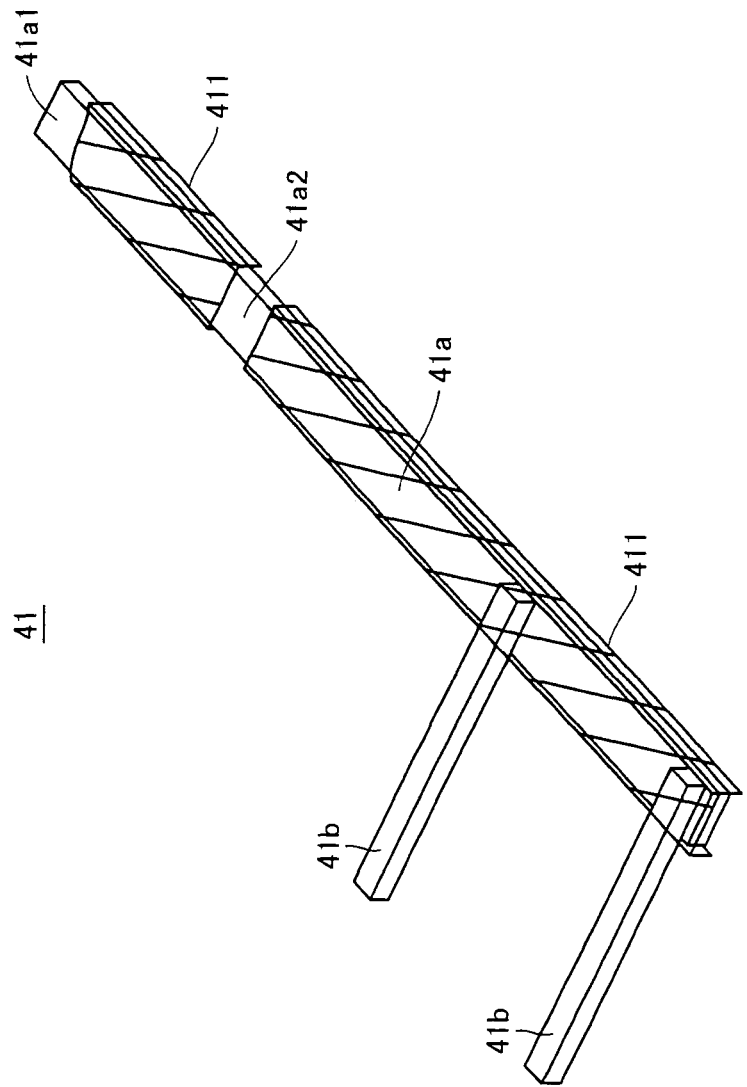
FIG. 49 is a perspective view illustrating the wiring member in the conventional solar cell module.
Figure 50:
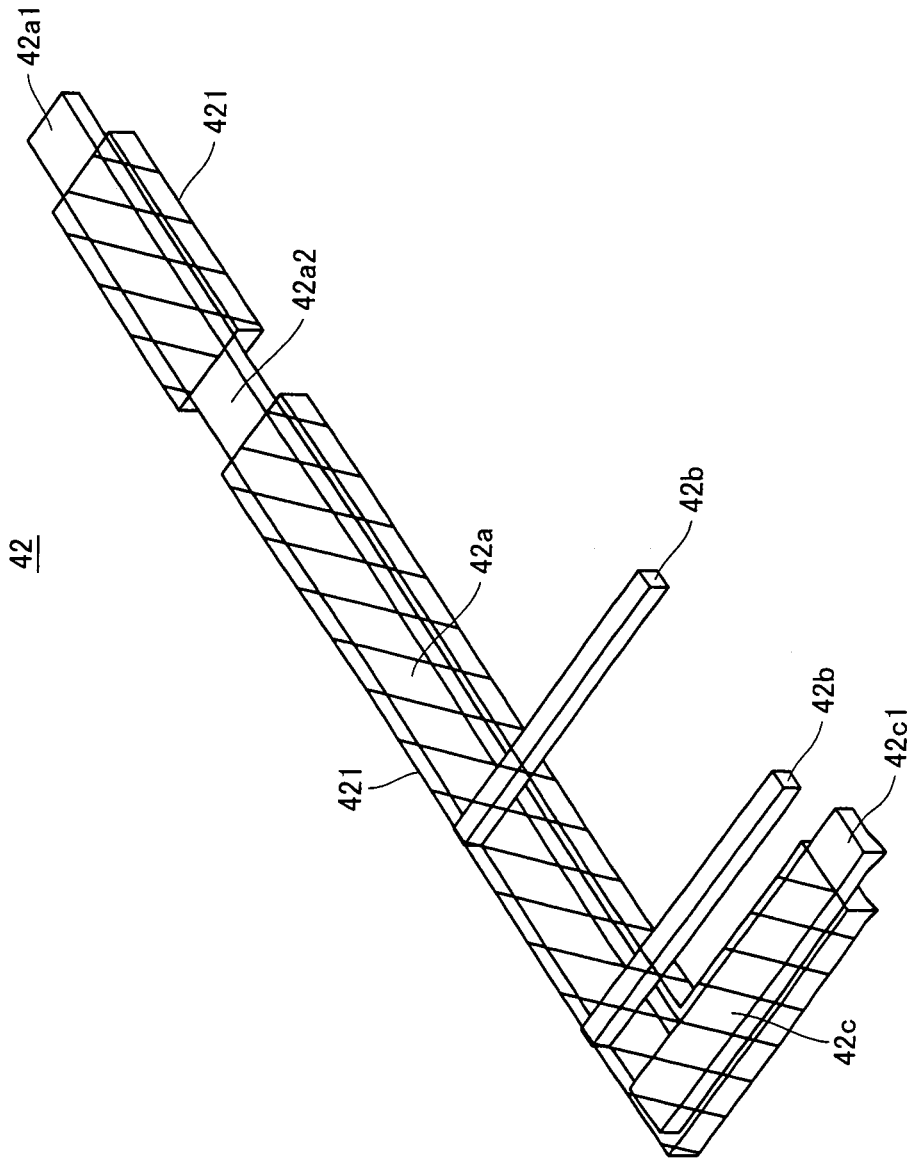
FIG. 50 is a perspective view illustrating the wiring member in the conventional solar cell module.
Figure 51:
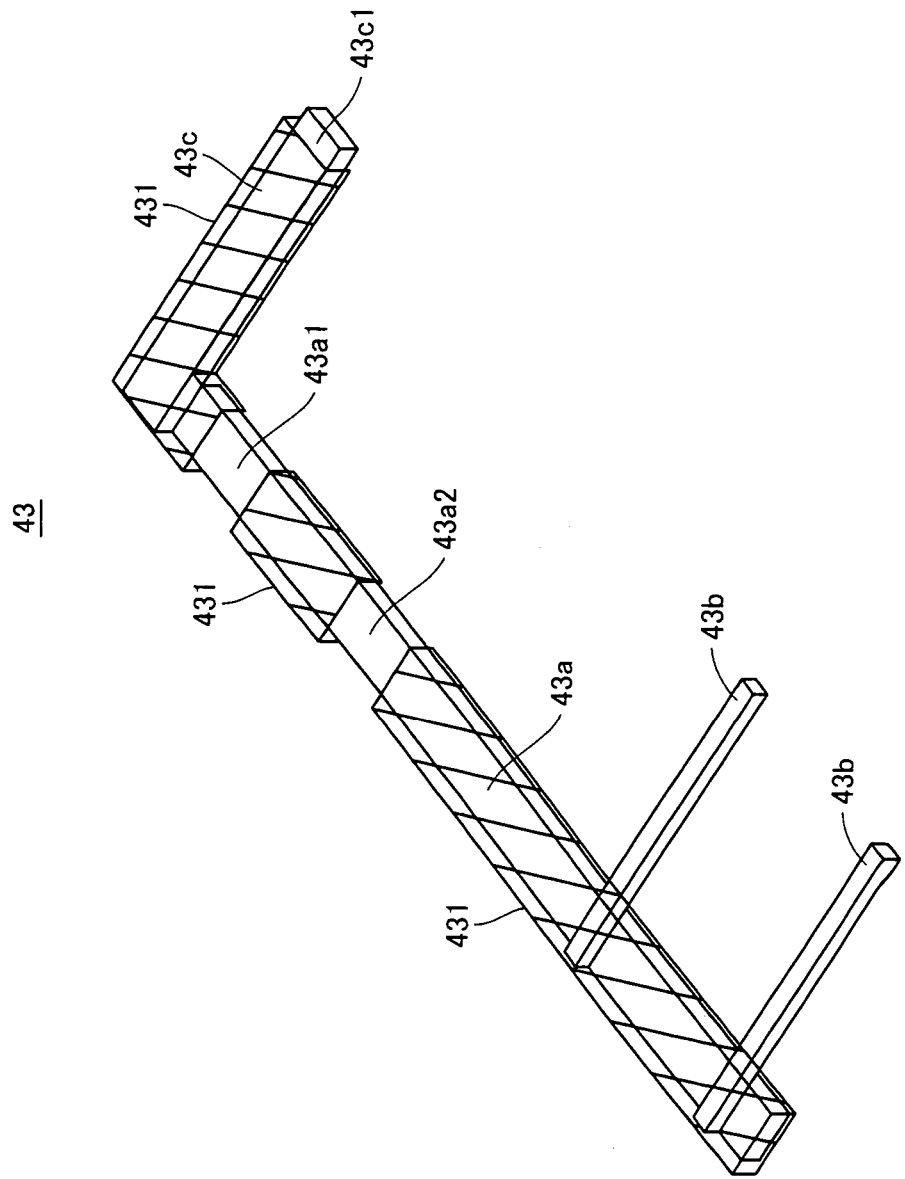
FIG. 51 is a perspective view illustrating the wiring member in the conventional solar cell module.
Figure 52:
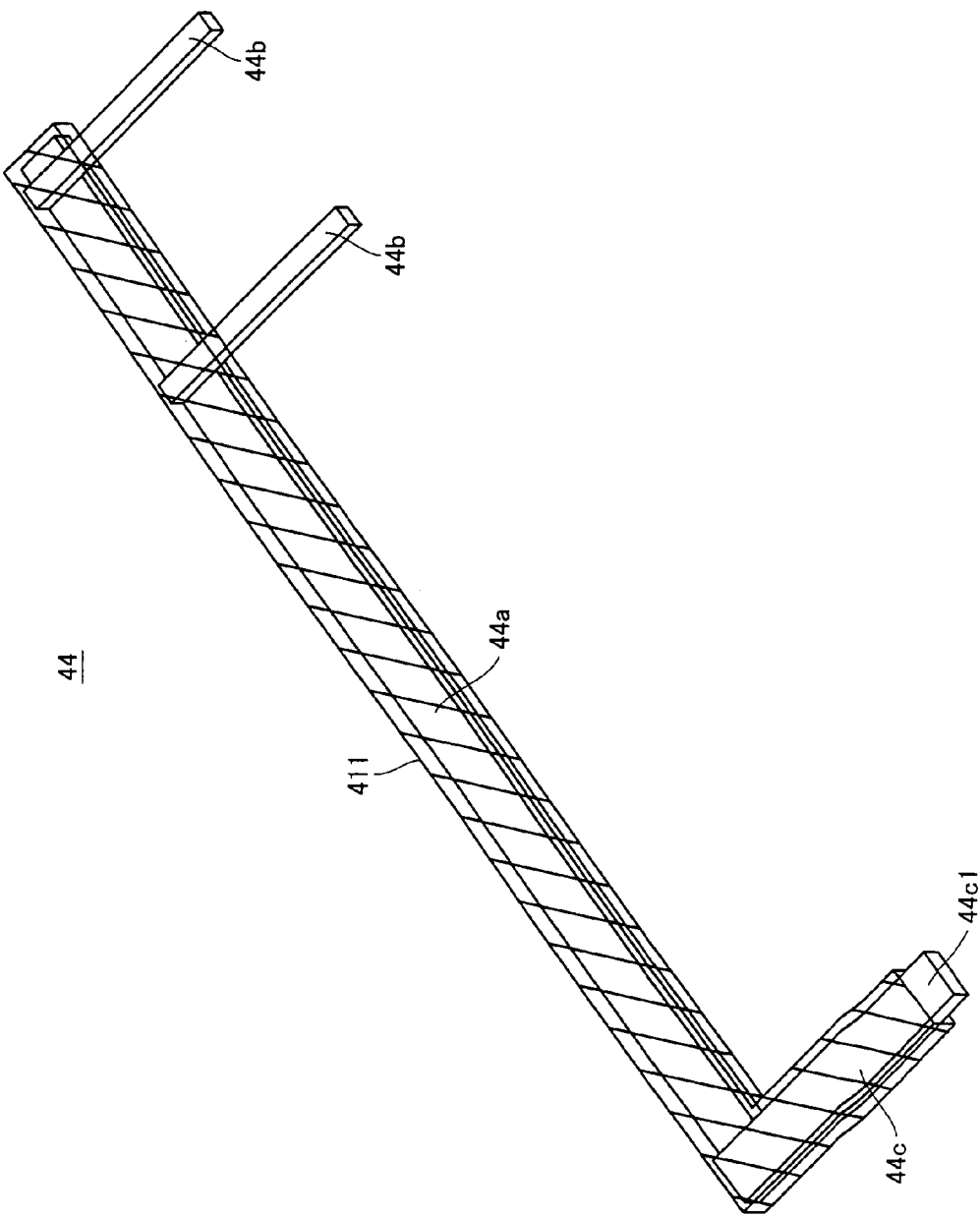
FIG. 52 is a perspective view illustrating the wiring member in the conventional solar cell module.
Figure 53:
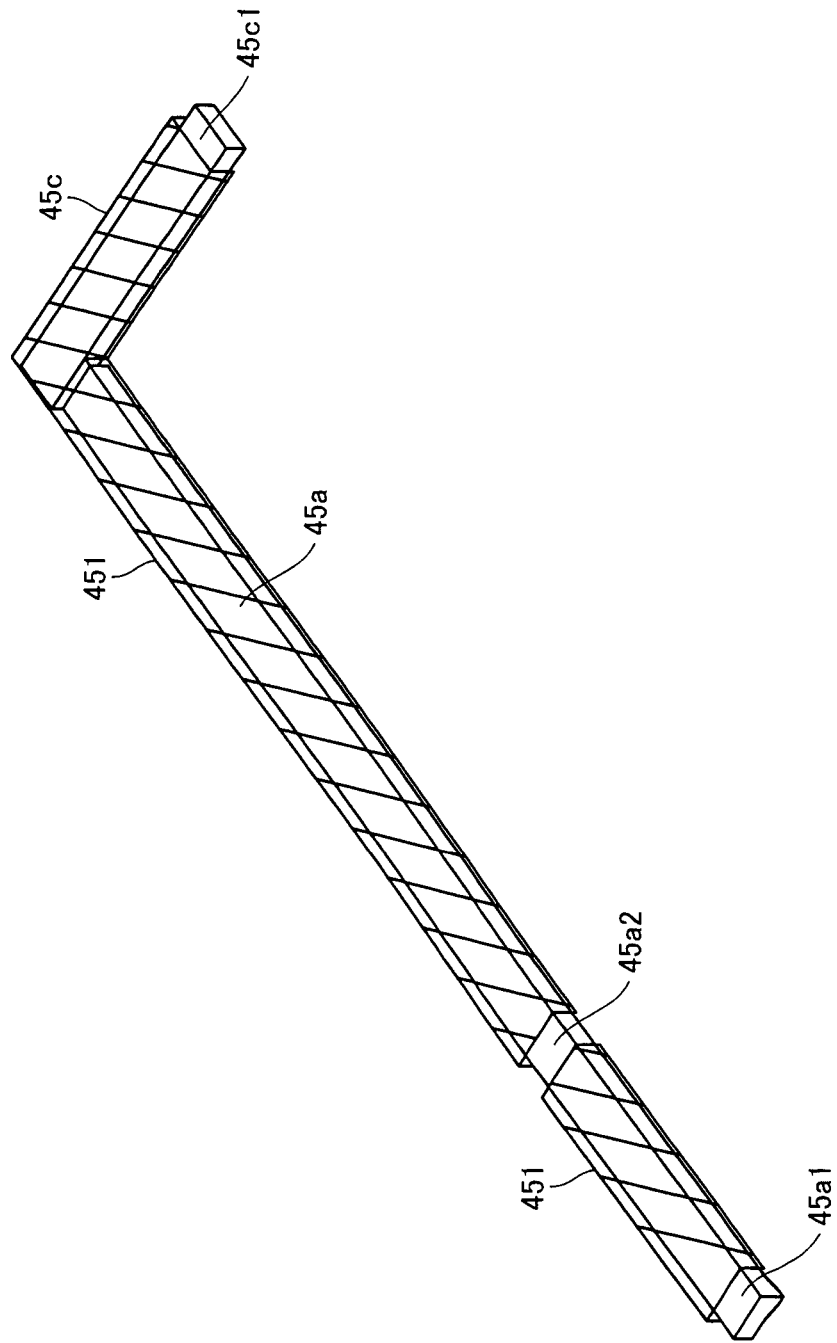
FIG. 53 is a perspective view illustrating the wiring member in the conventional solar cell module.
Figure 54:
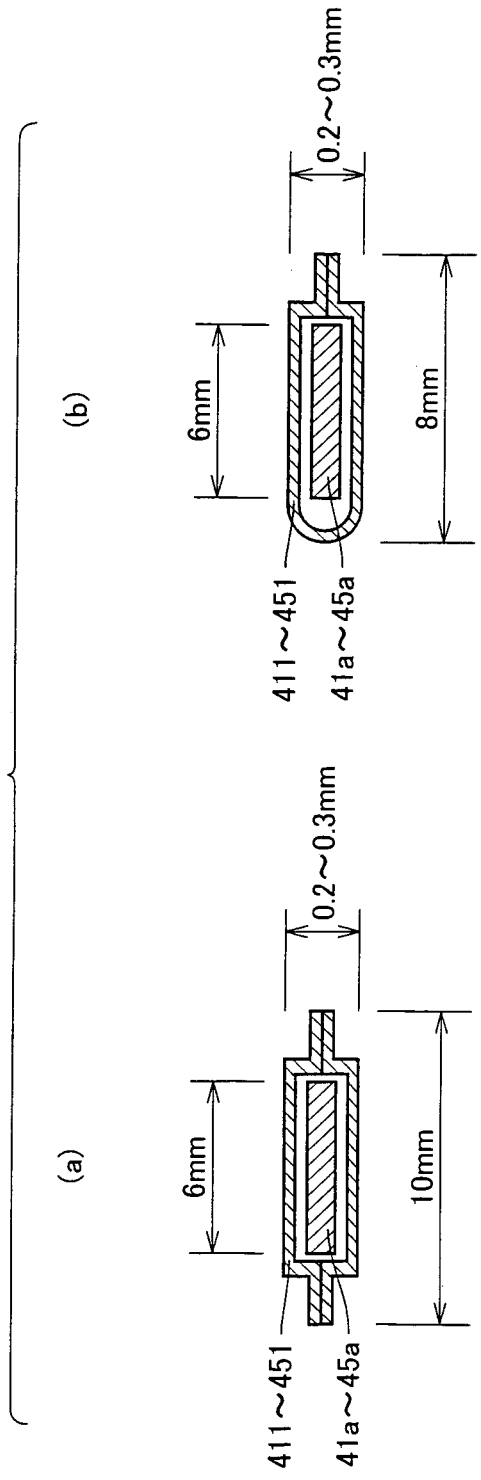
FIG. 54 is a sectional view illustrating one example of a sectional structure of a coated portion of the wiring member in the conventional solar cell module.

Specifically, as for second integrated wiring member 48 in Embodiment 4, the structure illustrated in (A) of FIG. 22 corresponds to that illustrated in FIG. 38, the structure illustrated in (A) of FIG. 23 corresponds to that illustrated in FIG. 39, the structure illustrated in (A) of FIG. 24 corresponds to that illustrated in FIG. 40, the structure illustrated in (A) of FIG. 25 corresponds to that illustrated in FIG. 41, the structure illustrated in (A) of FIG. 26 corresponds to that illustrated in FIG. 42, and the structure illustrated in (A) of FIG. 27 corresponds to that illustrated in FIG. 43.

In the integrated wiring member according to Embodiment 4, as described above, the insulating and protecting film for coating is folded back along the wiring member; thus, a creepage distance between wiring members can be ensured, an insulation property can be improved, and reliability can be improved.

Further, the insulating and protecting film for coating is folded back along the first wiring member, so that the insulating and protecting member can be arranged along the first wiring member in a self-alignment manner. In addition, the second wiring member can be aligned with the folded portion of the insulating and protecting film in a self-alignment manner. Therefore, work therefor can be readily performed, and it can be expected that yield is improved or manufacturing cost is reduced.

Further, the first wiring member and the second wiring member are integrated with and fixed to each other in such a manner that they are collectively coated with the third coating member folded in two, so that a deviation between the first wiring member and the second wiring member can be finally suppressed at minimum. Therefore, work therefor can be readily performed, and it can be expected that yield is improved or manufacturing cost is reduced. In addition, the openings are formed in the third coating member folded in two, so that portions where soldering is performed are defined. Therefore, a positional deviation is suppressed as compared with the conventional example, work therefor can be readily performed, and it can be expected that yield is improved or manufacturing cost is reduced. Further, the coating member, in which the openings are formed, has a symmetrical mirror pattern, so that common manufacturing members can be used, cost reduction can be achieved, simplification and automation of work can be readily achieved, and production efficiency can be improved.

Embodiment 5

Figure 36:
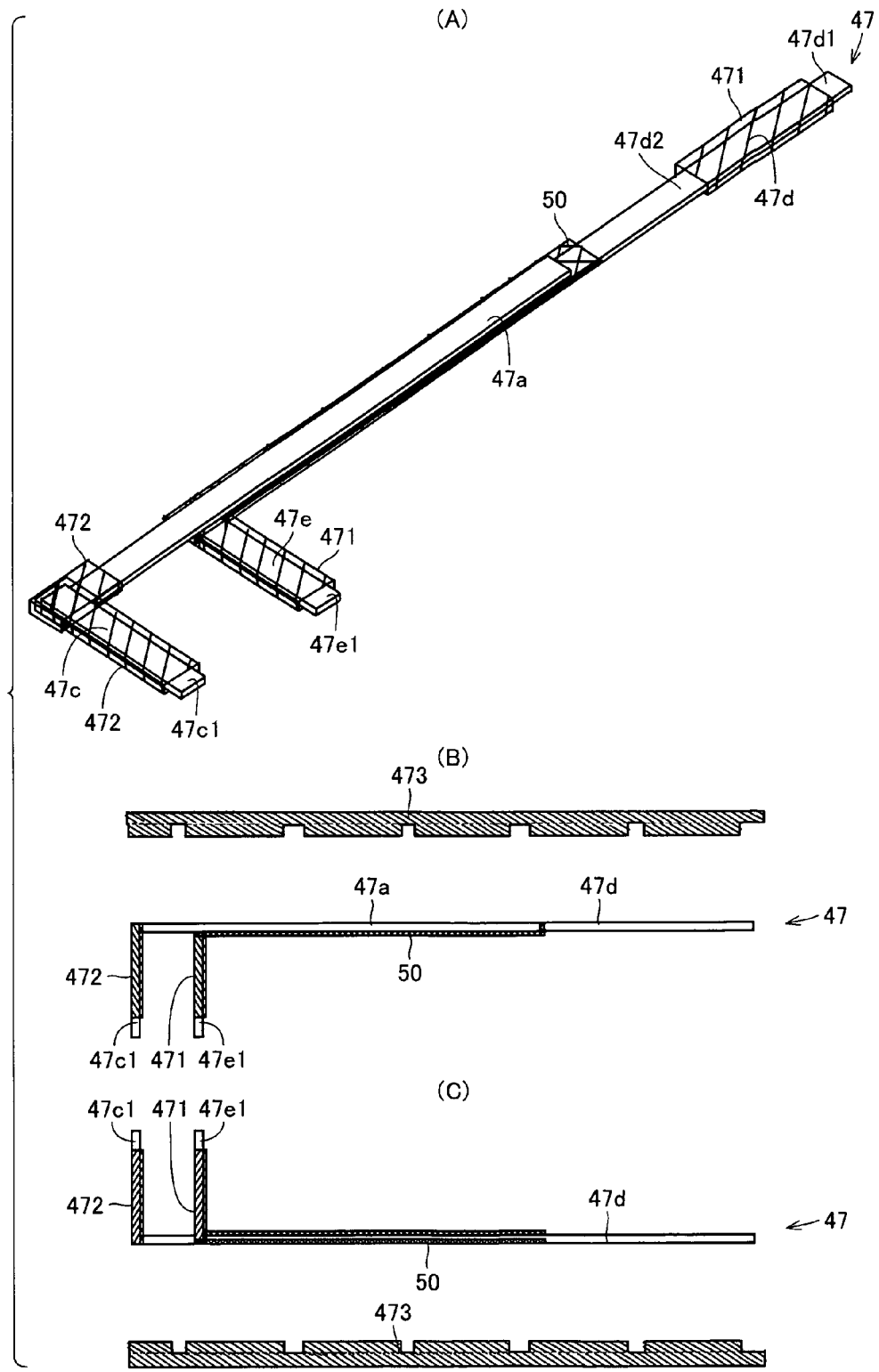
FIG. 36 is a perspective view illustrating one embodiment of the integrated wiring member according to the present invention.

In the present invention, description will be given of yet another embodiment of first integrated wiring member 47 with reference to FIGS. 36 and 37. In FIG. 36, (A) is a perspective view illustrating first integrated wiring member 47, (B) is a plan view when being seen from above in (A), that is, a plan view when being seen from the bottom face side of the solar cell module, and (C) is a plan view when being seen from below in (A), that is, a plan view when being seen from the light receiving face side of the solar cell module.

In first integrated wiring member 47 illustrated in (A) to (C) of FIG. 36, as described in Embodiment 4, first wiring member 47(I) is coated with coating member 471, protruding piece 47*c* of second wiring member 47(II) is coated with coating member 472, and first wiring member 47(I) is integrated with second wiring member 47(II). In Embodiment 5, description will be given of a step subsequent to the aforementioned step. In FIG. 36, each of (B) and (C) illustrates coating member 473, integrated with first integrated wiring member 47 later, near the side edge of first integrated wiring member 47.

Figure 37:
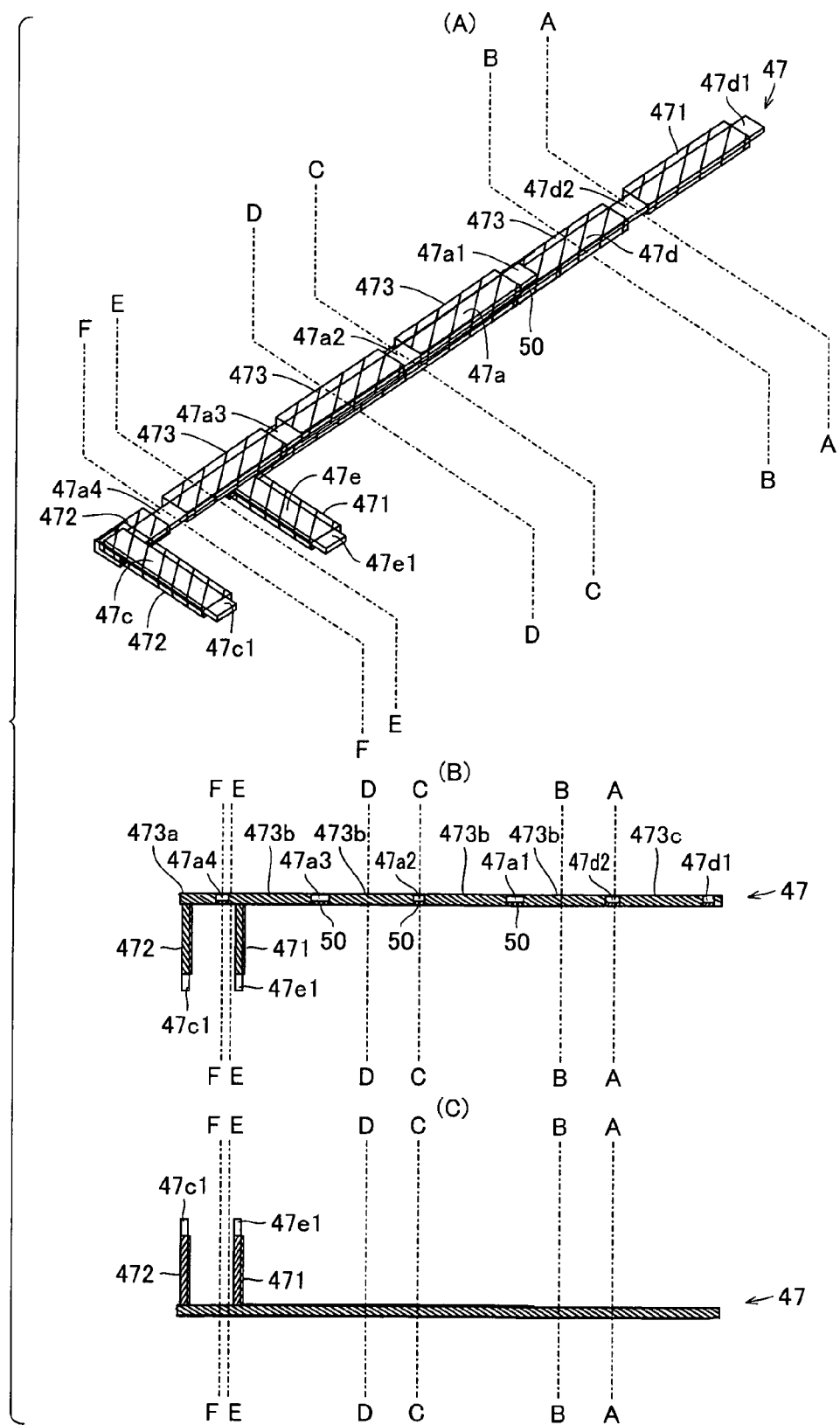
FIG. 37 is a perspective view illustrating one embodiment of the integrated wiring member according to the present invention.

As illustrated in (B) and (C) of FIG. 36, coating member 473 is folded in two along a broken line, and first wiring member 47(I), insulating and protecting film 50 and second wiring member 47(II) are integrated with each other as illustrated in (A) of FIG. 37 while being collectively coated with coating member 473. Herein, as illustrated in (B) of FIG. 37, coating member 473 is formed so as to be opened at portions 47*d*1, 47*d*2, 47*a*1, 47*a*2, 47*a*3 and 47*d*4 to be connected by soldering to wires 12 which will be led out from the cell. Further, as illustrated in (C) of FIG. 37, the face opposite to the face of the soldered connection portions is entirely coated with coating member 473. That is, as illustrated in (C) of FIG. 37, first integrated wiring member 47 is shielded by the coating member from the light receiving face side of the solar cell module.

That is, the first integrated wiring member is a combination of wiring members for a solar cell module, and includes (i) a part configured by a first wiring member having one face coated with a third coating member, (ii) a part configured by the first wiring member having all faces coated with the third coating member, (iii) a part where a second wiring member adjoining to the first wiring member via an insulating and protecting film is at least partly coated with the third coating member, (iv) a part where the second wiring member adjoining to the first wiring member via the insulating and protecting film is coated with the third coating member, (v) a part configured by the second wiring member coated with the third coating member, (vi) a part configured by the second wiring member, (vii) a part configured by the second wiring member coated with a second coating member, and (viii) a part configured by the first wiring member coated with a first coating member.

In Embodiment 5, the detailed description is given of first integrated wiring member 47 mainly. It is needless to say that the same holds true for second integrated wiring member 48.

In the integrated wiring member according to Embodiment 5, as described above, the insulating and protecting film for coating is folded back along the wiring member. Thus, it is possible to ensure a creepage distance between the wiring members, and to improve an insulation property and reliability.

Further, the insulating and protecting film for coating is folded back along the first wiring member, so that the insulating and protecting member can be arranged along the first wiring member in a self-alignment manner. In addition, the second wiring member can be readily aligned with the folded portion of the insulating and protecting film in a self-alignment manner. Therefore, work therefor can be readily performed, and it can be expected that yield is improved or manufacturing cost is reduced. Further, the first wiring member and the second wiring member are integrated with and fixed to each other in such a manner that they are collectively coated with the third coating member folded in two, so that a deviation between the first wiring member and the second wiring member can be finally suppressed at minimum. Therefore, work therefor can be readily performed, and it can be expected that yield is improved or manufacturing cost is reduced. In addition, the openings are formed in the third coating member folded in two, so that portions where soldering is performed are defined. Therefore, a positional deviation is suppressed as compared with the conventional example, work therefor can be readily performed, and it can be expected that yield is improved or manufacturing cost is reduced. Further, the integrated wiring member is arranged in such a manner that one side thereof is entirely coated with the third coating member. As a result, there is no portion, where a wiring member is bared, in the light receiving face of the solar cell, an aesthetic sense is improved, and the number of components is reduced. Hence, it is possible to reduce the number of manufacturing steps and to achieve cost reduction.

Embodiment 6

In addition to the aforementioned structure that the solar cells connected in series as a whole are arranged in a form of a matrix, a typical solar cell module may have a structure that cell units of solar cells arranged in line and electrically connected to each other are connected in parallel. Hereinafter, description will be given of a solar cell module having the structure that cell units are connected in parallel.
(Parallel Connection-Type Solar Cell Module)

Figure 59:
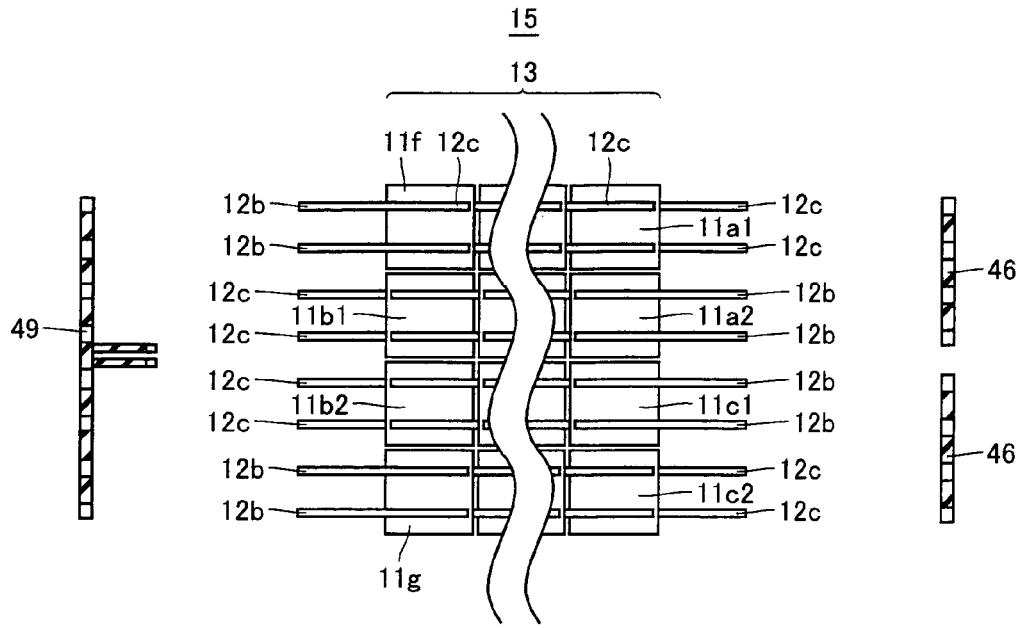
FIG. 59 is a plan view illustrating one embodiment of the structure of the solar cell module according to the present invention.

With reference to FIG. 59, the solar cell module according to the present invention may have the following structure. That is, the plurality of solar cells 11 are arranged in line and are electrically connected to each other to form cell unit 13. Then, the plurality of cell units 13, formed as described above, are arranged side by side, and the adjoining solar cells (e.g., 11a1 and 11a2, 11b1 and 11b2) located at the respective both ends of cell units 13 are electrically connected to each other through integrated wiring members 46 and an integrated wiring member 49; thus, the cell units of the solar cells arranged in a form of matrix 15 are connected in parallel.

With reference to FIG. 59, the structure that the cell units are connected in parallel is as follows: in a direction that the cell units are arranged side by side, upon selection of three cells arranged at rightmost ends of the cell units, two cells having an identical polarity adjoin to each other and remaining one cell has a polarity different from the aforementioned polarity. For example, in FIG. 59, polarities of electrodes led out from the right sides of the cells are positive, positive, negative, negative, positive, positive, negative, negative, ... in the vertical direction, that is, two cells having identical polarity and two cells having a polarity different from the aforementioned polarity are alternately arranged.

Figure 60:
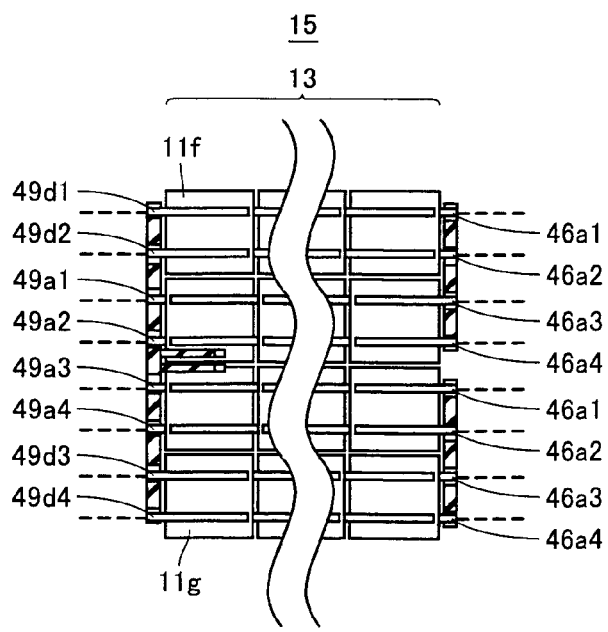
FIG. 60 is a plan view illustrating one embodiment of the structure of the solar cell module according to the present invention.

FIG. 59 illustrates the solar cell module in which integrated wiring members 46 and 49 do not connect between the solar cells yet, and FIG. 60 illustrates the solar cell module in which integrated wiring members 46 and 49 already connect between the solar cells.

Embodiment 6 is similar to Embodiments 1 to 5 in the feature that integrated wiring member 49 is used for electrically connecting the solar cells, unlike a conventional wiring member. Specifically, Embodiment 6 is similar to Embodiments 1 to 5 except electrode arrangement of cell units and an almost "Π" shape of integrated wiring member 49.

In the integrated wiring member according to this embodiment, as in the other embodiments, a portion, other than connection portions for electrically connecting between the solar cells, is at least partly coated with an insulative coating member. Further, a plurality of integrated wiring members are used. One wiring member partly intersects with or overlaps with the other wiring member. At the intersection or the overlap portion, one wiring member is coated with the coating member and the other wiring member has at least connection portions. A coating member excellent in heat-resistant property than the aforementioned coating member is interposed between one wiring member and the other wiring member. Hereinafter, detailed description will be given of the respective wiring members.
(Integrated Wiring Member)

The integrated wiring members used in this embodiment are third integrated wiring members 46 and fourth integrated wiring member 49 as illustrated in FIG. 59. Third integrated wiring member 46 is similar to those described in Embodiments 1 to 5. Herein, description will be given of fourth integrated wiring member 49 in this embodiment with reference to FIG. 61 to 64.

Figure 61:
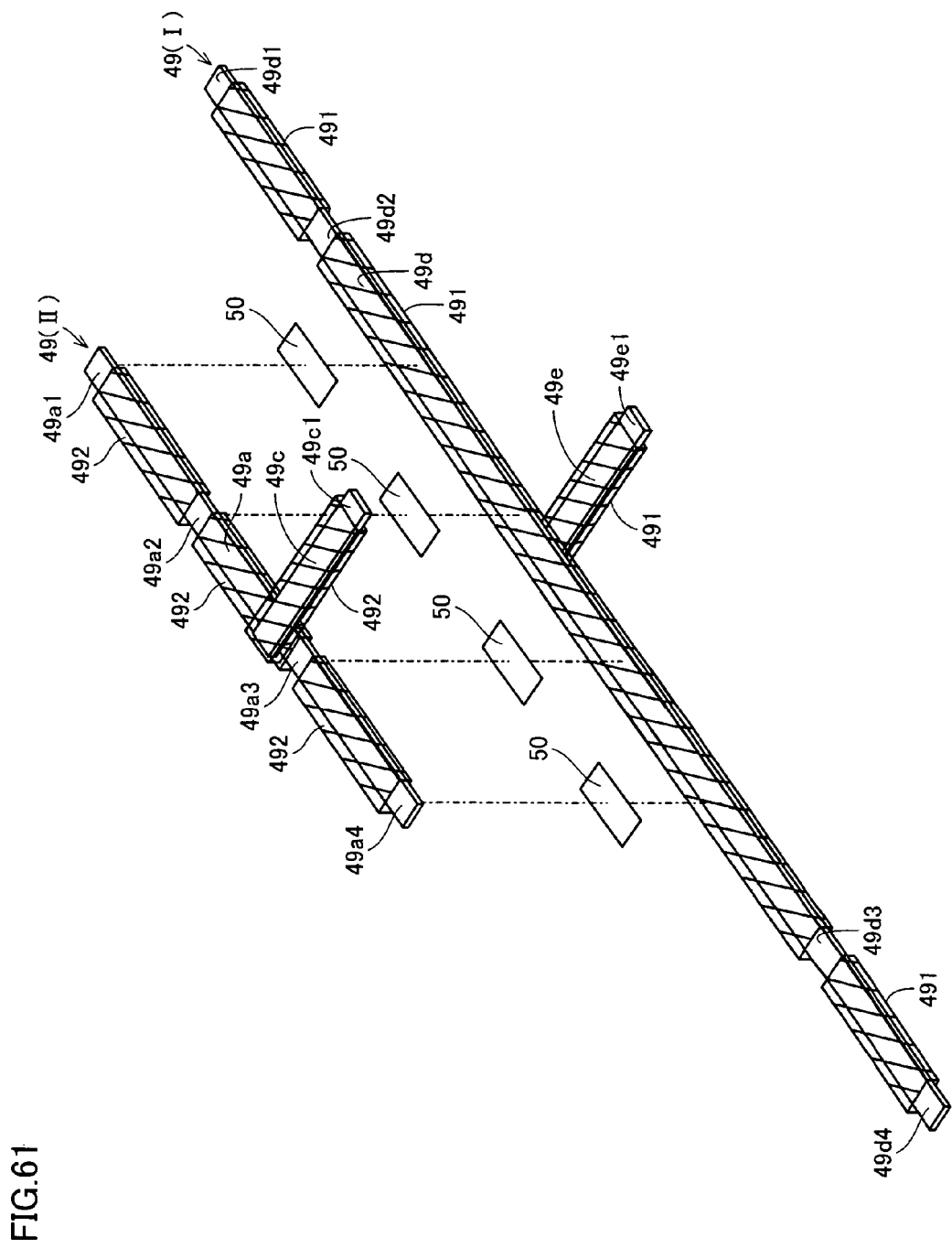
FIG. 61 is a perspective view illustrating one embodiment of the integrated wiring member according to the present invention.

In the present invention, as illustrated in FIG. 61, fourth integrated wiring member 49 includes a first wiring member 49(I) and a second wiring member 49(II). First wiring member 49(I) includes a coupling piece 49d and a protruding piece 49e. Second wiring member 49(II) includes a coupling piece 49a and a protruding piece 49c. Next, description will be given of the respective members.

As illustrated in FIG. 61, coupling piece 49a forms second wiring member 49(II), and connects between connecting pieces 12c and 12b led out from the adjoining solar cells (11b1 and 11b2) located at the position above the center of the side edge of the solar cells provided with electrical output extracting ports 25a and 25b in FIG. 1. Coupling piece 49a corresponds to coupling piece 47a. Coupling piece 49a includes bare portions 49a1, 49a2, 49a3 and 49a4 to be connected to the connecting pieces of the solar cells. A portion other than bare portions 49a1, 49a2, 49a3 and 49a4 is coated with a second coating member 492.

As illustrated in FIG. 61, coupling piece 49c forms second wiring member 49(II), is connected to a bypass diode (not illustrated in FIG. 1), and corresponds to protruding piece 47c. Protruding piece 49c includes a bare portion 49c1 to be connected to the bypass diode. A portion other than bare portion 49c1 is coated with second wiring member 492.

As illustrated in FIG. 61, coupling piece 49d forms first wiring member 49(I), and is connected to connecting piece 12b led out from the electrode on the bottom face of solar cell 11f illustrated in FIG. 1. Coupling piece 49d includes bare portions 49d1, 49d2, 49d3 and 49d4 each connected to the connecting piece of the solar cell. A portion other than bare portions 49d1, 49d2, 49d3 and 49d4 is coated with a first coating member 491.

Protruding piece 49e forms first wiring member 49(I), is electrically connected to an external terminal and a bypass diode each mechanically connected to electrical output extracting port 25a in FIG. 1, and corresponds to protruding piece 47e. Protruding piece 49e is coated with first coating member 491 except a bare portion 49e1 to be connected to the bypass diode.

As described above, second wiring member 49(II) includes coupling piece 49a and protruding piece 49c, and is formed into an almost "T" shape. Similarly, first wiring member 49(I) includes coupling piece 49d and protruding piece 49e, and is formed into an almost "T" shape.

Also as described above, first wiring member 49(I) and second wiring member 49(II) are coated with first coating member 491 and second wiring member 492, respectively. In first wiring member 49(I) and second wiring member 49(II), portions connected to connecting members from the solar cells are not coated with coating members, that is, bare portions are provided.

Figure 62:
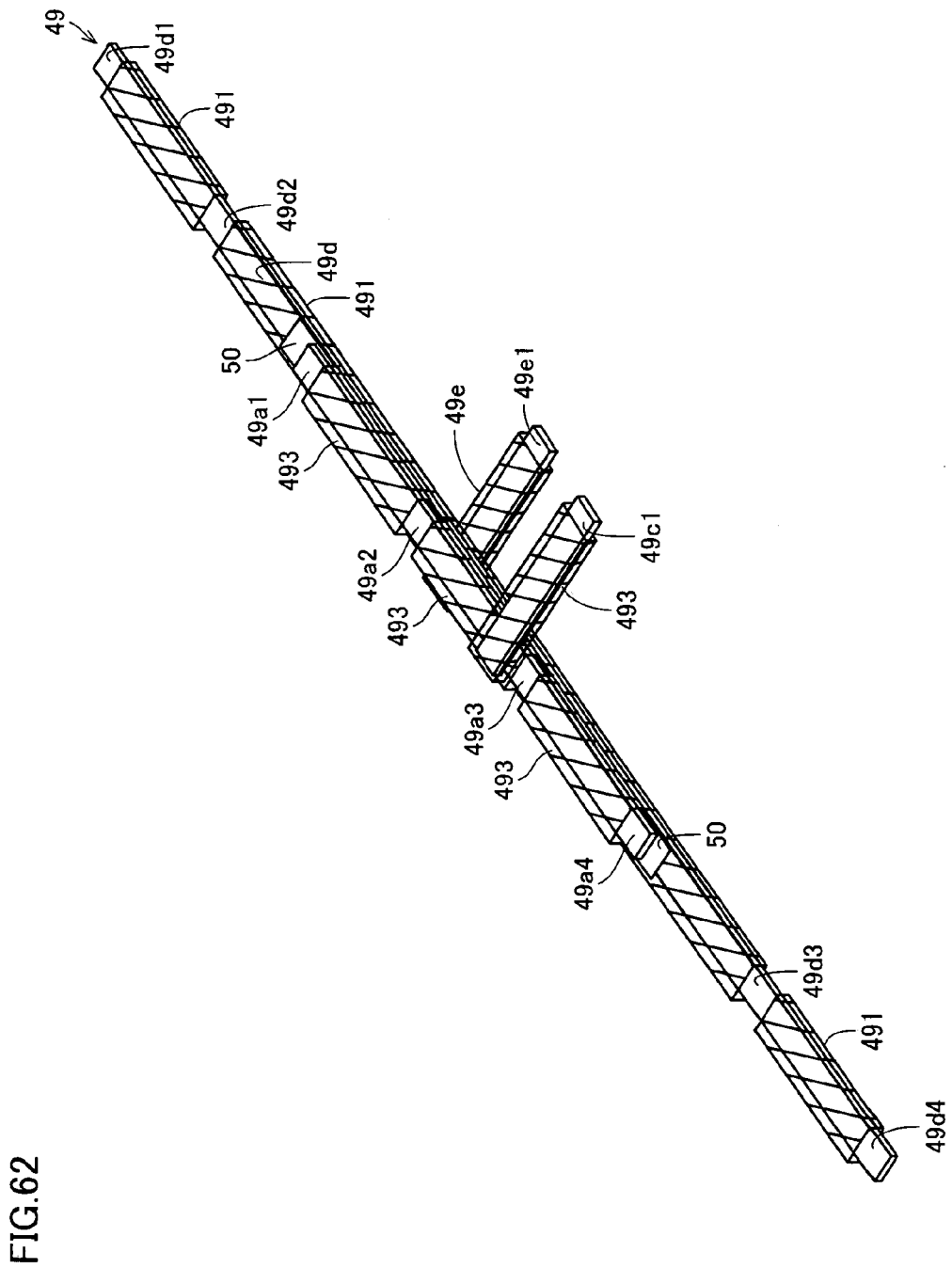
FIG. 62 is a perspective view illustrating one embodiment of the integrated wiring member according to the present invention.

As illustrated in FIG. 62, in order that first wiring member 49(I) and second wiring member 49(II) are fixed at a desired position and are integrated with each other as described in Embodiment 1, for example, an adhesive, a double-faced tape or the like is used for completing fourth integrated wiring member 49. Herein, as described above, insulating and protecting film 50 is interposed between first wiring member 49(I) and second wiring member 49(II). As described above, first wiring member 49(I) is integrated with second wiring member 49(II), so that fourth integrated wiring member 49 formed into an almost "Π" shape is completed.

Figure 63:
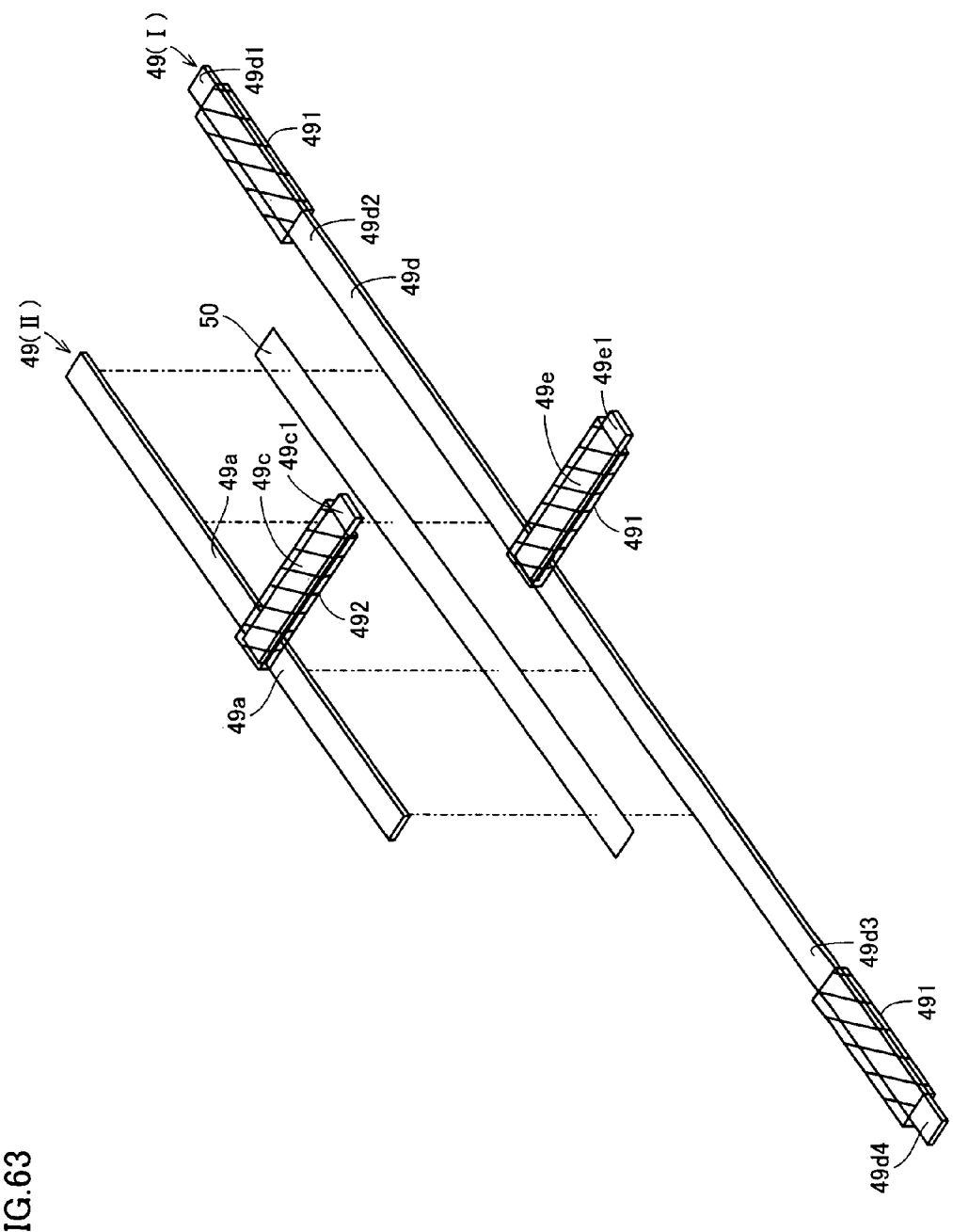
FIG. 63 is a perspective view illustrating one embodiment of the integrated wiring member according to the present invention.
Figure 64:
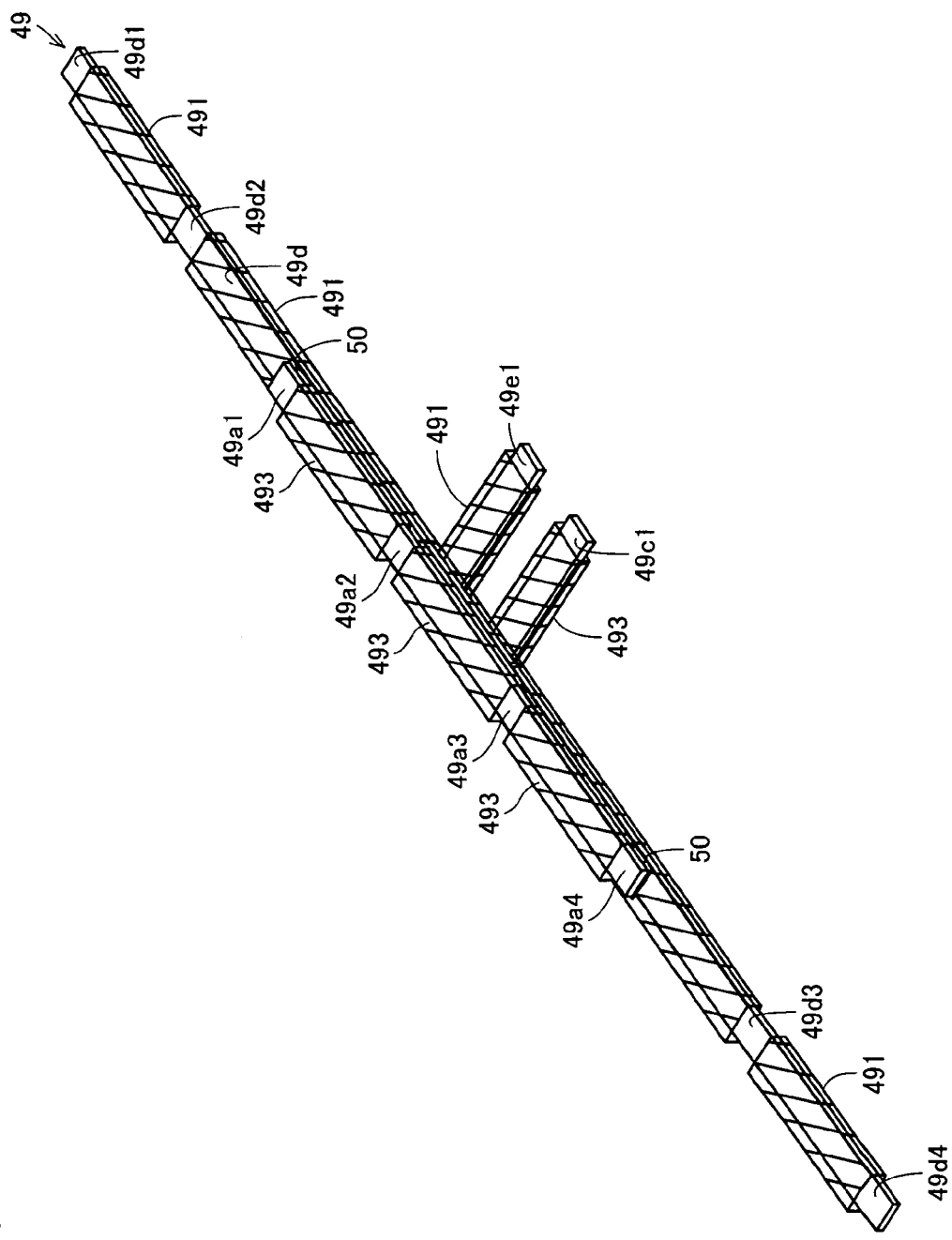
FIG. 64 is a perspective view illustrating one embodiment of the integrated wiring member according to the present invention.

FIGS. 63 and 64 illustrate an example that first wiring member 49(I) and second wiring member 49(II) are not coated with second coating member 492 illustrated in FIGS. 61 and 62, but are coated with a third coating member 493.

Specifically, as illustrated in FIG. 63, protruding pieces 49c and 49e of first and second wiring members (I) and (II) and both ends of coupling piece 49d of first wiring member 49(I) are previously coated with first coating member 491 and second coating member 492, respectively. Herein, bare portions are provided at the both ends of the respective coupling pieces. Next, first wiring member 49(I) is joined to second wiring member 49(II) through insulating and protecting film 50.

Thereafter, as illustrated in FIG. 64, first wiring member 49(I) and second wiring member 49(II) are fixedly coated with film-shaped third coating member 493 folded in two. Upon coating, third coating member 493 is formed into a shape so as to provide desired bare portions. Thus, obtained integrated wiring member 49 can be connected to a target solar cell with reduced number of steps. The integrated wiring member according to Embodiment 6 is formed as described above. Herein, the shape of insulating and protecting film 50 may be appropriately selected as in Embodiments 1 to 5, if desired. A positional relation between first wiring member 49(I) and second wiring member 49(II) upon joining may be equal to those described in Embodiments 1 to 5, for example, may be those described in FIGS. 28 to 33.

As described above, in the integrated wiring member according to Embodiment 6, third wiring member 493 is folded in two along the first and second wiring members, so that the first and second wiring members are integrally coated with third coating member 493. As a result, it is possible to ensure a creepage distance between the wiring members, to improve an insulation property, and to achieve improved reliability. Herein, a form of third coating member 493 folded in two may be equal to those illustrated in FIGS. 28 and 29.

As described with reference to FIGS. 28 to 33, the third coating member is folded in two along the respective wiring members, so that the wiring members are coated with the third coating member. As a result, it is possible to arrange the insulating and protecting film and the coating member along the wiring members such that that the ends of the first wiring member are arranged along a fixed position of the folded portion of the coating member, that is, the ends of the first wiring member are arranged in a self-alignment manner. Further, it is possible to readily realize positional adjustment for the second wiring member in a self-alignment manner with respect to the folded portion of the coating member. Thus, it can be expected that work is readily performed, yield is improved and cost reduction is achieved.

In addition, the third coating member is folded in two and the first wiring member and the second wiring member are collectively coated with the coating member. Finally, it is possible to suppress a deviation between the first wiring member and the second wiring member at minimum. Thus, it can be expected that work is readily performed, yield is improved and cost reduction is achieved.

As illustrated in FIGS. 28 and 29, integration of the wiring members through insulating and protecting film 50 folded in two can exhibit an effect similar to that by integration of the wiring members through the third coating member folded in two.

Moreover, the bare portion provided in the third coating member folded in two defines a portion to be subjected to soldering, so that a deviation upon alignment is suppressed as compared with the conventional technique. Thus, it can be expected that work is readily performed, yield is improved and cost reduction is achieved.

As in third coating member 473 illustrated in FIG. 36, the first coating member is combined with the third coating member, and one side of the integrated wiring members is entirely coated. As a result, there is no portion where the wiring member is bared from the light receiving face of the solar cell module; thus, it is possible to improve an aesthetic sense. In addition, the reduced number of components makes it possible to reduce the number of manufacturing steps and to achieve cost reduction.

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. An integrated wiring member for a solar cell module, comprising:
   a first wiring member;
   a second wiring member; and
   an insulating and protecting film for electrically insulating said first wiring member and said second wiring member from each other, wherein
   said first wiring member and said second wiring member are integrated with each other through said insulating and protecting film,
   wherein said second wiring member has a second connecting portion directly electrically connected to a connecting member of a solar cell at a point, wherein said point is in a second overlapping region that is a region of said second wiring member substantially overlapped with said first wiring member, and
   wherein said insulating and protecting film is located between said second connecting portion and said first wiring member.

2. The integrated wiring member for a solar cell module according to claim 1, wherein said first wiring member is coated with a first coating member in at least a part of a first overlapping region that is a region of said first wiring member substantially overlapped with said second wiring member, and wherein said insulating and protecting film is located between said first coating member and said second connecting portion.

3. The integrated wiring member for a solar cell module according to claim 2, wherein said second wiring member in said second overlapping region is integrated with said first wiring member through said insulating and protecting film with a third coating member, which is a different member from said first wiring member.

4. The integrated wiring member for a solar cell module according to claim 3, wherein said second wiring member has a plurality of said second connecting portions and said insulating and protecting film is interposed between said second connecting portions.

5. The integrated wiring member for a solar cell module according to claim 3, wherein at least a part of a region of said second wiring member other than said second overlapping region is coated with said third coating member.

6. The integrated wiring member for a solar cell module according to claim 3, wherein said second wiring member has a plurality of said second connecting portions, and said second connecting portions are spaced away from each other by a predetermined distance and said third coating member is not present in said second connecting portions.

7. The integrated wiring member for a solar cell module according to claim 1, wherein at least a part of said first wiring member other than a first overlapping region that is a region of said first wiring member substantially overlapped with said second wiring member is coated with a first coating member, at least a part of said second wiring member other than said second overlapping region is coated with a second coating member, and in a region where said first wiring member and said second wiring member are substantially overlapped with each other, said first wiring member and said second wiring member are substantially overlapped with each other through said insulating and protecting film, and said first wiring member, said second wiring member and said insulating and protecting film are integrally coated with a third coating member, which is a different member from said first wiring member and said second wiring member.

8. The integrated wiring member for a solar cell module according to claim 7, wherein said first wiring member has a first connecting portion for being electrically connected to a connecting member of a solar cell, and said first connecting portion is not coated with said first coating member, and said second connecting portion is not coated with said second coating member.

9. The integrated wiring member for a solar cell module according to claim 2, wherein said insulating and protecting film has a width equal to or narrower than that of said first coating member.

10. The integrated wiring member for a solar cell module according to claim 1, wherein said second wiring member has a width equal to or narrower than that of said insulating and protecting film.

11. The integrated wiring member for a solar cell module according to claim 1, wherein each of said first wiring member and said second wiring member has an almost "L" shape.

12. The integrated wiring member for a solar cell module according to claim 1, wherein said first wiring member is integrated with said second wiring member so as to have an almost "F" shape in such a manner that said first wiring member is displaced from a predetermined position with respect to said second wiring member.

13. The integrated wiring member for a solar cell module according to claim 1, each of said first wiring member and said second wiring member has an almost "T" shape.

14. The integrated wiring member for a solar cell module according to claim 12, wherein said first wiring member is integrated with said second wiring member so as to have an almost "Π" shape in such a manner that said first wiring member is displaced from a predetermined position with respect to said second wiring member.

15. The integrated wiring member for a solar cell module according to claim 1, wherein said insulating and protecting film is a heat-resistant film.

16. A solar cell module having a structure wherein a plurality of solar cells are arranged in line and are electrically connected to each other to thereby form a cell unit, a plurality of cell units thus formed are arranged side by side, the adjoining solar cells located at respective both ends of the cell units are electrically connected to each other through a wiring member, and solar cells arranged in a form of a matrix are entirely connected, wherein the integrated wiring member according to claim 1 is used as said wiring member.

17. The solar cell module according to claim 16, wherein said integrated wiring member includes a first wiring member connected to a positive electrode of the solar cell module, and a second wiring member connected to a negative electrode of the solar cell module.

18. The integrated wiring member for a solar cell module according to claim 2, wherein said insulating and protecting film has high heat-resistant property with respect to said first coating member.

19. The integrated wiring member for a solar cell module according to claim 2, wherein said first wiring member has a first connecting portion for being electrically connected to a connecting member of a solar cell, and said first connecting portion is not coated with said first coating member.

20. The integrated wiring member for a solar cell module according to claim 19, wherein said first wiring member has a plurality of said first connecting portions for being each connected to said connecting member of said solar cell, and the plurality of said first connecting portions are spaced away from each other by a predetermined distance.

21. The integrated wiring member for a solar cell module according to claim 2, wherein a part of said second wiring member is coated with a second coating member, which is a different member from said first coating member.

22. The integrated wiring member for a solar cell module according to claim 21, wherein said second connecting portion is not covered with said second coating member.

23. The integrated wiring member for a solar cell module according to claim 22, wherein said second wiring member has a plurality of said second connecting portions, and the plurality of said second connecting portions are spaced away from each other by a predetermined distance.

* * * * *